(12) United States Patent
Takahashi et al.

(10) Patent No.: US 6,757,051 B2
(45) Date of Patent: Jun. 29, 2004

(54) PROJECTION OPTICAL SYSTEM, MANUFACTURING METHOD THEREOF, AND PROJECTION EXPOSURE APPARATUS

(75) Inventors: Tetsuo Takahashi, Chiyoda-ku (JP); Jin Nishikawa, Chiyoda-ku (JP); Yasuhiro Omura, Chiyoda-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/883,253

(22) Filed: Jun. 19, 2001

(65) Prior Publication Data

US 2002/0044260 A1 Apr. 18, 2002

(30) Foreign Application Priority Data

Jun. 19, 2000 (JP) ................................. P2000-183380
Jun. 5, 2001 (JP) ................................. P2001-169476

(51) Int. Cl.[7] .................. G03B 27/54; G03B 27/42; G03B 21/26; A61N 5/00; G02B 26/08
(52) U.S. Cl. .................. 355/67; 355/53; 355/55; 355/77; 250/492.2; 250/492.22; 359/507; 359/512; 359/820; 359/196; 359/364; 359/365; 359/379; 359/380; 353/37; 353/72
(58) Field of Search ................. 355/53, 55, 67, 355/77; 250/492.2, 492.22; 359/507, 512, 820, 196, 364, 365, 379, 380; 353/37, 72, 196

(56) References Cited

U.S. PATENT DOCUMENTS

| | | | |
|---|---|---|---|
| 4,734,745 A | 3/1988 | Ohta | |
| 4,757,354 A | 7/1988 | Sato et al. | |
| 5,117,255 A | * 5/1992 | Shiraishi et al. | |
| 5,473,410 A | 12/1995 | Nishi | |
| 5,488,229 A | 1/1996 | Elliott et al. | |
| 5,638,223 A | * 6/1997 | Ikeda | |
| 5,650,877 A | 7/1997 | Phillips, Jr. et al. | |
| 5,689,377 A | 11/1997 | Takahashi | |
| 5,691,802 A | 11/1997 | Takahashi | |
| 5,717,518 A | 2/1998 | Shafer et al. | |
| 5,805,334 A | 9/1998 | Takahashi | |
| 5,805,356 A | 9/1998 | Chiba | |
| 5,835,284 A | 11/1998 | Takahashi et al. | |
| 5,999,310 A | * 12/1999 | Shafer et al. | |
| 6,043,863 A | 3/2000 | Ikeda | |
| 6,195,213 B1 | 2/2001 | Omura et al. | |
| 6,226,133 B1 | * 5/2001 | Osakabe | |
| 6,246,204 B1 | 6/2001 | Ebihara et al. | |
| 6,252,648 B1 | * 6/2001 | Hase et al. | |
| 6,335,787 B1 | 1/2002 | Nishi | |
| 6,496,306 B1 | 12/2002 | Shafer et al. | |
| 6,529,264 B1 | 3/2003 | Ikeda | |

FOREIGN PATENT DOCUMENTS

| | | |
|---|---|---|
| JP | 1-198759 | 8/1989 |
| JP | 9-283415 | 10/1997 |
| JP | 11-174365 | 7/1999 |
| JP | 11-251217 | 9/1999 |
| JP | 2001-56426 | 2/2001 |
| WO | WO 99/27570 | 3/1999 |

* cited by examiner

Primary Examiner—Frank G. Font
Assistant Examiner—Khaled Brown
(74) Attorney, Agent, or Firm—Oblon, Spivak, McClelland, Maier & Neustadt, P.C.

(57) ABSTRACT

A projection optical system forms an image of an object in a first plane onto a second plane. The projection optical system has an optical element group including at least one refractive member and plural reflective members, and a plurality of lens-barrel units holding the optical element group divided into a plurality of respective groupings. The reflective members are all held by a single lens-barrel unit of the plurality of lens-barrels units.

58 Claims, 17 Drawing Sheets

PROJECTION OPTICAL SYSTEM, MANUFACTURING METHOD THEREOF, AND PROJECTION EXPOSURE APPARATUS

BACKGROUND OF THE INVENTION

1. Field of the Invention

The present invention relates to a projection optical system, for example, provided in a projection exposure apparatus that is used on occasion of photolithography when manufacturing semiconductor elements, display elements such as liquid crystal display and plasma display, and micromachine etc. such as microdevices. It also relates to a manufacturing method of the projection optical system and to a projection exposure apparatus,

2. Related Background Art

In a photolithographic process used for manufacturing semiconductor elements and the like, projection exposure apparatus is used to expose, through a projection optical system, the image of the pattern of the reticle as mask onto a substrate, i.e. a wafer (or glass plate, etch) on which is applied a photo resist. As the degree of integration of semiconductor elements and so on continue to improve, demand for a resolving power of the projection optical system in a projection exposure apparatus becomes even greater. In order to meet the demand, shortening the wavelength of the illuminating light (exposure light) for exposure and increasing the numerical aperture (NA) of the projection optical system have been performed. However, when exposure a light wavelengths are shortened, varieties of glass material can be used practically are becoming fewer, due to the light absorption. In particular, when the exposure light wavelength becomes vacuum ultraviolet VUV), approximately 200 nm or shorter, the glass materials that can be used under current conditions becomes limited to, for example, synthetic silica, fluorite ($CaF_2$), and magnesium fluoride ($MgF_2$). The problem of how to compensate chromatic aberration therefore happens.

Even so, there has been progress made in the practical application of the refractive system in projection optical systems using an ArF excimer laser (wavelength 193 nm) as exposure light. However, when the exposure light wavelength fall to 180 nm or shorter as with an $F_2$ laser (wavelength 157 nm), it is difficult to put projection optical systems into practical use with a refractive system, but expectations are rising for catadioptric systems providing a reflective member as means for compensating chromatic aberration. In this regard, since it is known that fluorite has sufficient transmissivity up to approximately 100 nm, it may be used as a refractive member up to this range. A catadioptric optical system is realized by assembling a refractive member made of fluorite (calcium fluoride) and a reflective member.

A number of types of catadioptric optical systems have already been proposed. Of these, optical systems that have the center portion of the aperture stop shielded are considered most influential since, by using a reflective surface having two or more faces, all of the optical elements can be disposed in an upright cylindrical shape along a single the optical axis without requiring an optical path deflection member. Moreover, since the image of an object in the optical axis can be formed on an image plane, they also include the advantage of chromatic aberration being able to be compensated in a wide exposure field with only a relatively low number of optical elements. Of these, optical systems that form an intermediate image partway through the optical system, for example, such as the optical system disclosed in U.S. Pat. No. 5,650,877, are quite effective in terms of throughput and ease in manufacturing in comparison with optical systems that have an optical member such as a semi-transparent mirror disposed partway, and therefore have no intermediate image formed, greatly reduced light intensity, and increased danger of large-scale flares developing. This type or conventional technology is cited in, for example, U.S. Pat. Nos. 5,717,518 and 5,488,229.

In addition, slice the optical absorption rate of the exposure light increases due to oxygen and carbon dioxide when exposure light is approximately 200 nm or shorter, in order to increase the illuminance on the wafer, it is necessary to replace the air within the lens barrel of the projection optical system with a purge gas such as nitrogen gas ($N_2$) or helium gas (He), which have high transmissivity for wavelengths of approximately 200 nm or shorter. To this end, various purge gas supply mechanisms have conventionally been proposed.

SUMMARY OF THE INVENTION

The present invention was devised as a result of the following findings by the inventors. As shown with the above, in cases where an exposure light belonging to vacuum ultraviolet region is used, a catadioptric optical system is an excellent projection optical system. However, with the catadioptric optical system, even if a virtually upright cylinder, the entire length is quite long in comparison with a refractive system, and becomes difficult to support with a single lens barrel. Furthermore, with the catadioptric optical system in U.S. Pat. No. 5,717,518, as it can be seen from the fact that the material for the reflective members is large compared to the glass used for the refractive members, with the catadioptric optical systems it is often the case that the reflective members (material) rust be made larger than the refractive members (glass). In such cases, if a single lens-barrel with a relatively small refractive member and a relatively large reflective member are supported as a single body, the configuration of that lens barrel becomes complicated, and the stable support of that lens barrel becomes difficult. Moreover, there are problems with production costs becoming high with projection optical systems since it takes time to perform the assembly adjustment of that lens barrel and all of the optical elements.

The method for holding the optical element group that comprises catadioptric optical system not by a single lens-barrel, but divided between a plurality of divided lens-barrels is also considered. However, in cases where these optical elements are simply divided into a plurality of groups and held by a plurality of divided lens-barrels, there require the divided lens-barrels with partially extremely complex structures, and also, tears are entertained as to complex processes of assembly adjustment such as aligning the respective axes of each divided lens-barrel to each other.

Furthermore, since there is a danger of the positional relationship between optical elements that are held by different divided lens-barrels fluctuating relative to set values by simply holding a plurality of divided lens-barrels, there is a danger of an increase in contributing factors for the development of aberrations. In cases where a plurality of divided lens-barrels are used, there require positioning, for example, that suppresses the development of aberrations Moreover, in the projection exposure apparatus using vacuum ultraviolet light having wavelengths of approximately 200 nm or less as exposure light, when a purge gas is flowed through the optical path inside of projection optical systems, if those lens barrels are configured from a plurality of divided lens-barrels, then stagnancy develops in the flow of purge gas at the boundaries of the divided lens-barrels, and there is a danger that the density of light absorbing substances, such as oxygen, may not sufficiently decrease. In particular, in a projection exposure apparatus using light of a wavelength of 170 nm or shorter, for example $F_2$ laser light (157 nm wavelength) as exposure light, since the permissible value of the residual density of the light absorbing substances is lowered, if a divided lens-barrel type is simply adopted, there is a danger that the residual density of the light absorbing substances may not fall below the permissible value, An object of the present invention is to provide a projection optical system capable of obtaining high optical performance, a manufacturing method thereof, and a projection exposure apparatus in which it is included.

Another object of the present invention is to provide, in addition to the above objects, a projection optical system that includes a catadioptric optical system having simple assembly adjustment, a manufacturing method thereof, and a projection exposure apparatus in which it is included.

Yet another object of the present invention is to provide, in addition to the above objects, a projection optical system that includes a catadioptric: optical system that is capable of adjusting the state of the optical elements, a manufacturing method thereof, and a projection exposure apparatus in which it is included.

Yet another object of the present invention is to provide, in addition to the above objects, a projection optical system that includes a catadioptric optical system capable of maintaining a stable positional relationship between a plurality of optical elements, a manufacturing method thereof, and a projection exposure apparatus in which it is included.

Yet another object of the present invention is to provide, in addition to the above objects, a projection optical system capable of supplying a high-purity purge gas and a projection exposure apparatus in which it is included.

An aspect of the present invention is a projection optical system forming an image of an object in a first plane onto a second plane comprising, an optical element group including at least one refractive member and a plurality of reflective members, and a plurality of lens-barrel units holding the optical element group divided into a plurality of groupings, wherein the plurality of reflective members is all held by one lens-barrel unit of the plurality of lens-barrels units.

Lens-barrel units hold an imaging optical system for forming an image (for example, an intermediate image or final image), and are configured from, for example, a plurality of divided lens-barrels. Each of the lens-barrel units has a mechanism to adjust the state of the imaging optical system. In the following, divided lens-barrels have the same meaning as lens-barrel units.

An aspect of the present invention is that it aims at making the amount of aberrations that are generated in cases where the position of the optical elements shifts from a designed position, higher in the reflective members than in the refractive members. According to an aspect of the present invention, since all of a plurality of reflective members is held in one lens-barrel unit, the relative positional relationship of the plurality of reflective members can be maintained in a nearly stable state. Also, even if the lens-barrel unit holding the reflective members is displaced due to vibrations, for example, if the lens-barrel unit is thought of as a reference, since it is the same value as the only displaced lens-barrel unit holding only another refractive member, the entire amount of generated aberration is suppressed and high optical performance can be obtained.

In this case, it is preferable that the partial optical element group forming an intermediate image on a third plane between the first plane and the second plane, wherein the partial optical element group is integrally held by one lens-barrel unit of the plurality of lens-barrel units. When an intermediate image is formed as such, the outer diameter of the optical elements bath before and after the intermediate image may vary greatly. At this time, by having the partial optical group that forms the intermediate image be held by one lens-barrel unit, the partial optical element group can be easily and stably held.

Furthermore, as an example, that optical element group is disposed along a single the optical axis. Through such configuration in a vertical barrel, the entire configuration of the lens barrel becomes smaller, and that optical element group can be stably held. It is noted here that, as an another example, that optical element group may include a first partial optical element group disposed along a first optical axis, a second partial optical element group disposed along a second optical axis which extends in a direction that intersects the first optical axis, and is optically connected to the first partial optical element group, and a third partial optical element group disposed along a third optical axis which extends in the same direction as the first optical axis, and is optically connected to the second partial optical element group. Here a second optical axis, which is approximately orthogonal to the first optical axis, is included in a second optical axis that extends along the direction that intersects a first optical axis. A third optical axis that is approximately parallel to first optical axis is included in a third optical axis that extends in the same direction as first optical axis.

Furthermore, it is preferable that the plurality of lens-barrel units be supported independent of each other. As a result of this, the assembly adjustment is simplified.

Furthermore, it is preferable that at least one of said plurality of lens-barrel units, has an adjustment mechanism to adjust a predetermined state of optical elements respectively held therein. By adjusting the predetermined state (positioning of the optical axis direction, the position of the direction of the two axes within the plane that is orthogonal to the optical axis (decentering adjustment), and the tilt angle around the two axes) of those optical elements, the magnification and predetermined imaging performance, such as aberrations, of that projection optical system can be compensated.

Furthermore, it is preferable that at least one of the plurality of lens-barrel units further comprising a plurality of holding blocks which hold one or a plurality of optical elements, wherein the plurality of holding blocks have an adjustment mechanism to adjust the state of optical elements respectively held therein.

Furthermore, it is preferable that at least one of the plurality of lens-barrel units be detachable.

An aspect of the present invention, as an example, uses an illumination light with wavelengths of 200 nm or shorter, preferably supplies a purge gas through which the illumination light passes to inside the projection optical system. Since each projection optical system of the present invention comprises a plurality of lens-barrel units or a plurality of holding blocks that are built up (connected), assembly adjustment is simplified. Moreover, since these lens-barrel units and holding block can be configured with a high level of gas-tightness, a high-purity purge gas can be supplied into those projection optical systems. The illuminance of the illumination light becomes high and a high throughput can be accordingly obtained for the exposure process.

It is preferable that there be provided a plurality of vents (openings) in the part (lens mount, etc.) that holds each optical element (refractive member, reflective member) within each lens-barrel unit or each holding block as a porous structure. Furthermore, a holding block that holds, for example, a relatively large reflective member, may be supported by a frame mechanism having high ventilation. By having these mechanisms there is no settlement from the purge gas, and as a result it is possible to reduce the residual density of impurities (light absorbing substances) within the projection optical system.

Another aspect of the present invention is a projection optical system comprising, an optical element group including first and second optical element sub-groups, and forming an image of a predetermined magnification of an object in a first plane onto a second plane, a first lens-barrel unit integrally holding the first optical element sub-group as a single body along a first optical axis, and a second lens-barrel unit integrally holding the second optical element sub-group as a single body along a second optical axis that is coaxis with the first optical axis, wherein the first lens-barrel unit is held in a position at a plane that is orthogonal to the first optical axis and that passes through a point divides a line, along said first optical axis, between an object point and an image point relative to the first sub optical element group by 1:$\beta1$ (where $\beta1$ is a real number other than zero) or in a position near the plane, and the second lens-barrel unit is held in a position at a plane that is orthogonal to the second optical axis and that passes through a point divides a line, along said second optical axis, between an object point and an image point relative to the second sub optical element group by 1:$\beta2$ (where $\beta2$ is a real number other than zero), or in a position near said plane.

According to another aspect of the present invention, because each lens-barrel unit is independently supported relative to each other, assembly adjustment is simplified. Moreover, even if first lens-barrel unit and second lens-barrel first are tilted, the respective image shift hardly occurs. When used in a projection exposure apparatus even if lens-barrel unit is displaced because of the affect of vibrations of the stage system and so on, high optical performance can always be obtained. This aspect can also be used as a limiting factor of an aspect of the present invention above, Yet another aspect of the present invention is a projection optical system which forms an image of an object in a first plane onto a second plane, comprising, an optical element group having a plurality of aspherical surfaces, and a plurality of holding blocks holding the optical element group in a plurality of groupings, wherein the number of the plurality of holding blocks is equal to or greater than the number of the aspherical surfaces.

When assembling the projection optical system according to another aspect of the present invention, there may be a case where several $\mu$m of decentering remains in each optical element where an aspherical surface is formed. Due to such decentering of the aspherical surface, a high order decentered aberration occurs. For example by performing decentering adjustment when successively integrating, or by providing an decentering adjustment mechanism in each holding block, the number of holding blocks is kept equal to or greater than the number of aspherical surfaces, it is possible to compensate that high-order decentered aberration and obtain high optical performance.

In this case, when those optical element groups have a plurality of reflective members, it is preferable that this plurality of reflective members be held in holding blocks that are different from each other. When the position of the reflecting members is off a designed position, a large aberration compared to the reflective member occurs. When a plurality of reflective members are provided, it is possible to minimize aberration by holding each reflecting member in a different holding block and, for example, adjusting the relative position when integrating these holding blocks, or having a mechanism that can fine tune the relative position of the reflecting lens. This aspect can also be used as a restriction of an aspect of the present invention above.

Yet another aspect of the present invention is a projection optical system which forms an image of an object in a first plane onto a second plane comprising, an optical element group, a plurality of lens-barrel units, which hold said optical element group in a plurality of groupings, and frame from which at least one lens-barrel unit of said plurality of lens-barrel units is held so as to hang down.

By supporting the lens-barrel unit so as to hang down in this manner, it is possible to provide constant, stable support to the lens-barrel unit and the optical elements that are held therein, and maintain high optical performance. This aspect can also be used as a restriction of an aspect of the present invention above.

Yet another aspect of the present invention is a projection optical system forming an image of an object in a first plane onto a second plane by using light with wavelengths of 200 nm or shorter, comprising, at least two refractive members disposed in the optical path of the light, at least two lens-barrel units aligning the at least two refractive members, a pipeline being connected to at least one lens-barrel unit of the at least two lens-barrel units and supplying purge gas through which the light can pass within the space between the at least two refractive members, and at least two holding units being included in each of the at least two lens-barrel units and holding each of the at least two refractive members, wherein the at least two holding units having openings to allow the purge gas to pass through.

By having these mechanisms, there is no settlement from the purge gas, and as a result it is possible to reduce the residual density of impurities (light absorbing substances) in the projection optical system. Not only is this aspect a catadioptric projection optical system, but it can also be suited for a dioptric optical system. In this aspect, it is preferable that it has light of a wavelength of equal to 160 nm or shorter. This aspect can also be used as a restriction of an aspect of the present invention.

Yet another aspect of the present invention is a projection optical system provided in a projection exposure apparatus, comprising, an imaging optical system including all of a plurality of reflective members which are structural components of the projection optical system, another imaging optical system including at least one refractive member which is a structural component of the projection optical system and not including a reflective member which is a structural component of the projection optical system, a lens-barrel unit holding the imaging optical system, and another lens-barrel unit holding the another imaging optical system.

The sane things can be said as the aspects of the present invention described above accordingly. A lens-barrel unit comprises a plurality of divided lens-barrels, which include a mechanism for adjusting the state of imaging optical systems, and the other lens-barrel unit can be comprised of a plurality of divided lens-barrels, which includes a mechanism for adjusting the state of the other imaging optical system. Furthermore, each of the plurality of reflective members can be held by a divided lens-barrel that is different from the others of a plurality of divided lens-barrels, which forms a lens-barrel unit. This aspect can also be used as a restriction of an aspect of the present invention above.

Another aspect of the present invention is a method of manufacturing a projection optical system which comprises an optical element group having at least one refractive member and a plurality of reflective members, and a plurality of lens-barrel units holding the optical element group as a plurality of groupings, the method of manufacturing a projection optical system comprising, a first step of presetting a predetermined lens-barrel unit of the plurality of lens-barrel units to be detachable, putting together a lens-barrel unit to be adjusted at the position of the predetermined lens-barrel unit of a first projection optical system that is already completed as the projection optical system, and performing adjustment on the lens-barrel unit to be adjusted while measuring optical characteristics of the first projection optical system, and a second step of building up a second projection optical system by an adjusted lens-barrel unit on which adjustment is performed in the first step and lens-barrel units other than this, and performing adjustment of the second projection optical system using the adjusted lens-barrel unit as a standard.

With the manufacturing method of a projection optical system according to yet another aspect of the present invention, when manufacturing a plurality of projection optical systems in parallel, for example, it is possible to adjust lens barrel unit of the next projection optical system in only a short time by using projection optical system, which has completed assembly adjustment. Thereby, the assembly adjustment time can be shortened as a whole.

Yet another aspect of the present invention is a method of manufacturing a projection optical system which comprises an optical element group including at least one refractive member and at least one reflective member, a plurality of lens-barrel units holding the optical element group as a plurality of groupings, a holding block being a component of at least one lens-barrel unit of the plurality of lens-barrel units and holding at least one optical element, wherein the holding block is adjustable in at least one of relative orientation and relative position to the lens-barrel unit including the holding block as structural component, and at least one entire lens-barrel unit of the plurality of lens-barrel units is adjustable, the method comprising the step of; a first step of adjusting the plurality of lens-barrel units relative to each other; and a second step of adjusting the at least one of the relative orientation and the relative position of the holding block, so as to adjust residual aberrations, after the first step.

By performing adjustment in this manner, fine-tuning can be performed on large and small aberrations, and it is possible to manufacture the projection optical system that has optical performance nearly equal that of the designs.

Yet another aspect of the present invention is a projection exposure apparatus, which comprises the projection optical system of the present invention mentioned above and which projects an image of a projection original disposed on the first plane onto a workpiece, with the projection optical system. By using the projection optical system of the present invention, the assembly adjustment of the entire apparatus becomes easy and the manufacturing cost can be reduced.

Yet another aspect of the present invention is a projection exposure method, which projects an image of a projection original disposed on the first plane onto a workpiece, with the projection optical system of the present invention mentioned above. By using the projection optical system of the present invention, the assembly adjustment of the entire apparatus becomes easy and the manufacturing cost can be reduced.

The present invention will be more fully understood from the detailed description given herein below and the accompanying drawings, which are given by way of illustration only and are not to be considered as restricting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

[First Embodiment]

In the following, the first embodiment of the present invention is described while referencing FIG. 2 to FIG. 4. This embodiment employs an $F_2$ laser (center wavelength of 157.6 nm) as an exposure light illumination light) and is applied to the invention onto an upright cylindrical-shaped catadioptric projection optical system with a reflective mirror that has two apertures respectively formed near the optical axes.

Figure 2:
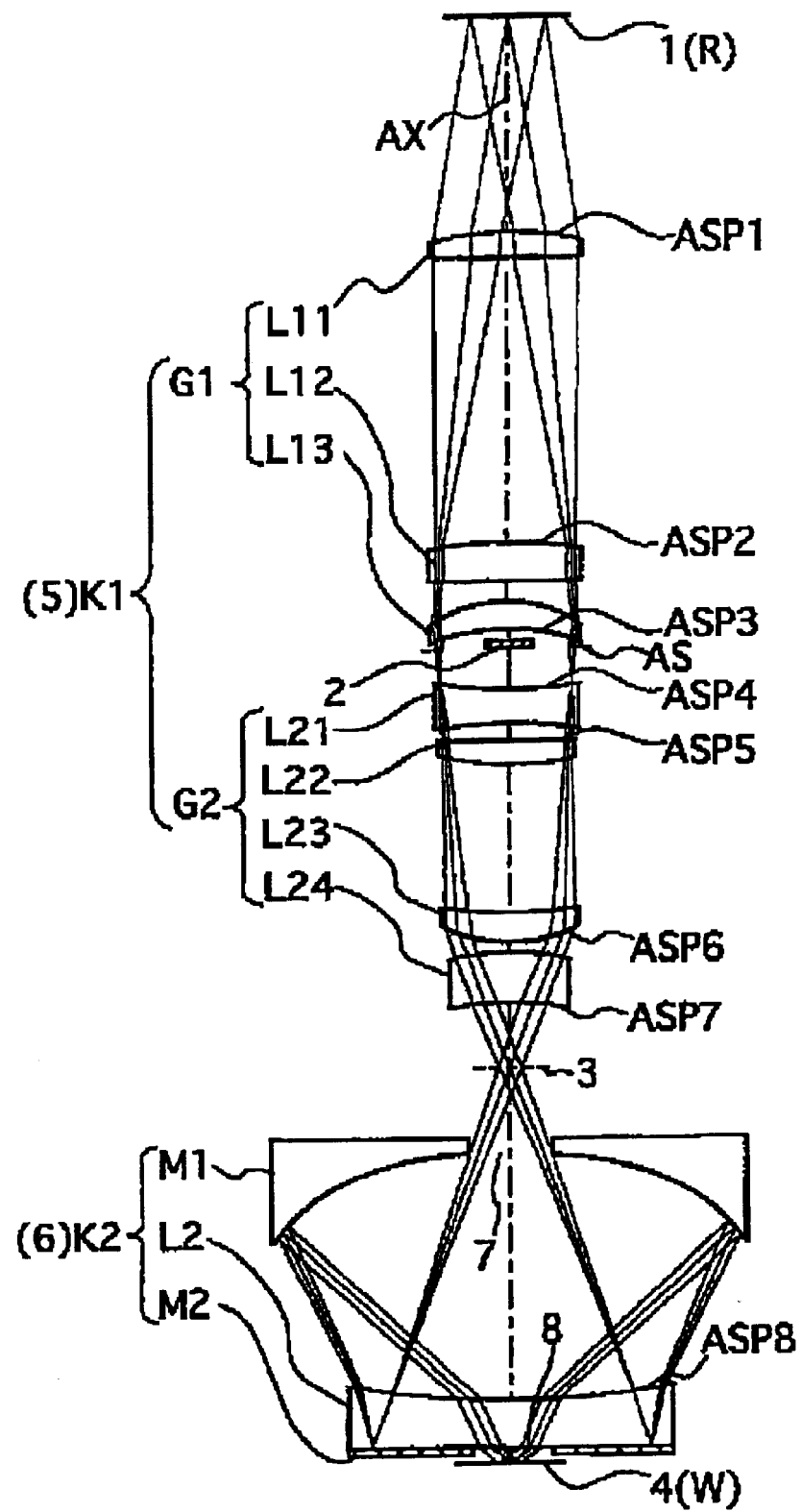
FIG. 2 is a block diagram of the lenses that form the projection optical system according to the first embodiment of the present invention.

FIG. 2 is a lens block diagram of a projection optical system according to this embodiment. In FIG. 2, an image of an object disposed in object plane 1 first plane) is formed on image plane 4 (second plane) by the projection optical system of this embodiment with a predetermined projection magnification β (lateral magnification). Projection magnification β of this embodiment is ¼×. During exposure, the pattern surface of the reticle R, which is used as a mask, is disposed in the object plane, and the surface of the wafer W (glass plate, etc.), which is used as the to-be-exposed substrate (photosensitive substrate), is disposed in image plane 4.

The projection optical system of this embodiment comprises a first imaging optical system K1 for forming the pattern of a primary image (intermediate image) 3 of the reticle pattern, and a second imaging optical system K2 for forming a secondary image (final image) of the reticle pattern with reduction magnification onto the wafer based on the light from the the primary image. The first imaging optical system K1 comprises, in order from the reticle side, a first lens group G1, which has positive refractive power; aperture stop AS; and a second lens group G2, which has positive refractive power. A central shielding member 2, which shades the light near the optical axis AX, is disposed near the installation plane of aperture stop AS but in a position that differs with the installation plane of aperture stop AS in the direction of the optical axis.

The second imaging optical system K2 comprises, in order from the reticle side, a primary mirror M1, which has a superficial reflective surface with the concave surface facing the wafer and has aperture section 7 (light transmission section) in the center; a lens L2; and a secondary mirror M2, which comprises a reflective surface having aperture section 8 (light transmission section) in the center. Furthermore, the projection optical system of this embodiment has eight aspherical surfaces, wherein the reference marker ASPm is given to the m-th (m=1, 2, . . . ) aspherical surface in order from the reticle side.

The first lens group G1 comprises, in order from the reticle side, a meniscus-shaped lens L11 with the convex aspherical surface ASP1 thereof facing the reticle side; a meniscus-shaped lens L12 with the convex aspherical surface ASP2 thereof facing the reticle side; and a meniscus-shaped lens L13 with the concave aspherical surface ASP3 thereof facing the wafer side. Furthermore, the second lens group G2 comprises, in order from the reticle side, a biconcave-shaped lens L21 with the concave aspherical surface ASP4 thereof facing the reticle side; a biconvex-shaped lens L22 with the convex aspherical surface ASP5 thereof facing the reticle side; a meniscus-shaped lens L23 with the convex aspherical surface ASP6 thereof facing the wafer side; and a meniscus-shaped lens L24 with the concave aspherical surface ASP7 thereof facing the wafer side. Moreover, the lens L2 within the second imaging optical system K2 is a meniscus-shaped lens with the concave aspherical surface ASP8 thereof facing the reticle side.

All of the optical elements (G1, G2, M1, M2, and G2) that form the projection optical system of this embodiment are disposed along a single optical axis. The primary mirror M1 is disposed near the formation location of the primary image 3, and the secondary mirror M2 is disposed approaching the wafer.

In the projection optical system of FIG. 2, light from the pattern of reticle R passes through the first imaging optical system K1 and forms the primary image (intermediate image) 3 of the reticle pattern. Light from the the primary image 3 passes through aperture section 7 at the center of the primary mirror M1 and the lens L2 to be reflected by the secondary mirror M2, and the light reflected by the secondary mirror M2 passes through the lens L2 to be reflected by the primary mirror M1. The light reflected by th primary mirror M1 passes through the lens L2 and aperture section 8 at the center of secondary mirror M2 to form the secondary image of the reticle pattern on the surface of wafer, with the reduction magnification.

Fluorite ($CaF_2$ crystal) is used for all of the refractive optical members (lens elements) that construct the projection optical system in FIG. 2.

The oscillation center wavelength of the $F_2$ laser light, which is used as the exposure light, is 157.6 nm, and the range of oscillation wavelength, which is 157.6 nm±approximately 10 pm, is narrow-banded. Throughout the range of wavelengths, aberrations are favorably compensated at predetermined, standardized conditions (e.g. conditions where atmospheric pressure is 1 atm and the accumulation of energy due to light passing through the projection optical system is nearly zero). The refractive index of $CaF_2$ is 1.5600000 at the center wavelength of 157.6 nm.

The shape of the aspherical surfaces employed in the projection optical system of this embodiment is given by the following expression; wherein, y is the height perpendicular to the optical axis; Z (amount of sag) is the distance in the direction of the optical axis between a tangential plane at the apex of the aspherical surface and a position at the level of height y; r is the radius of curvature at the apex of the aspherical surface; k is the conic coefficient; and A to F are the respective n-th order aspherical surface coefficients.

$$Z=(y^2/r)/[1+\{1-(1+k)\cdot y^2/r^2\}^{1/2}]+A\cdot y^4+B\cdot y^6+C\cdot y^8 D\cdot y^{10}+E\cdot y^{12}+F\cdot y^{14} \quad (1)$$

The value of the respective elements of the projection optical system in this embodiment is shown in Table 1 below. In the Table 1, λ represents the center wavelength of the exposure light; β represents the projection magnification; NA represents an image-side numerical aperture; and ø represents an image circle diameter on the Wafer W. Furthermore, Surface Number expresses the order of the surfaces from the reticle side along the direction in which light travels from the reticle plane, which is the object plane, to the wafer plane, which is the image plane; r is the radius of curvature of each surface (mm; when aspheric, measured at the apex); and d is the distance between each surface along the optical axis (mm). Under the heading "optical material," $CaF_2$ indicates fluorite.

Furthermore, distance d between surfaces changes its sign whenever reflection occurs. The sign of distance d is negative throughout the optical path from the secondary mirror M2 to the primary mirror M1 and is positive throughout other paths. Without regard to the direction of incidence of light, facing the reticle, the radius of curvature r of convex surfaces is considered positive and radius of curvature r of concave surfaces is considered negative. It is noted here that in all of the following embodiments, the same reference markers are used as in the first embodiment.

TABLE 1

(Principal Data)
$\lambda = 157.6$ nm ± 10 pm
$\beta = 0.2500$
NA = 0.75
$\phi = 16.4$ mm
Distance from Reticle Plane to First Surface = 201.4588 mm

| Surface Number | r | d | Optical Material |
|---|---|---|---|
| 1(ASP1) | 199.4802 | 23.6189 | $CaF_2$ |
| 2 | 1933.2675 | 269.2901 | |
| 3(ASP2) | 248.9463 | 38.4449 | $CaF_2$ |
| 4 | 1002.9474 | 19.1120 | |
| 5 | 109.3351 | 28.6306 | $CaF_2$ |
| 6(ASP3) | 143.4010 | 21.0000 | |
| 7(AS) | ∞ | 35.4787 | |
| 8(ASP4) | −1979.6492 | 27.8589 | $CaF_2$ |
| 9 | 215.9777 | 13.6424 | |
| 10(ASP5) | 838.3987 | 20.3225 | $CaF_2$ |
| 11 | −252.7298 | 143.5573 | |
| 12 | −475.0282 | 25.5347 | $CaF_2$ |
| 13(ASP6) | −98.4914 | 12.5880 | |
| 14 | 174.9476 | 50.0000 | $CaF_2$ |
| 15(ASP7) | 249.0939 | 370.2800 | |
| 16(ASP8) | −965.4467 | 42.8265 | $CaF_2$ |
| 17 | −8820.5445 | −42.8265 | $CaF_2$ |
| 18(ASP8) | −965.4467 | −223.7172 | |
| 19 | 346.8643 | 223.7172 | |
| 20(ASP8) | −965.4467 | 42.8265 | $CaF_2$ |
| 21 | −8820.5445 | 10.0000 | |

(Aspheric Data)

ASP1
$\kappa = 0.00000$
$A = -9.61173 \times 10^{-9}$
$B = -2.14569 \times 10^{-18}$
$C = 7.59160 \times 10^{-18}$
$D = -5.90665 \times 10^{-22}$
$E = 0.0$
$F = 0.0$ ASP2
$\kappa = 0.00000$
$A = -1.55615 \times 10^{-7}$
$B = -4.68023 \times 10^{-12}$
$C = 3.66473 \times 10^{-18}$
$D = 2.76851 \times 10^{-21}$
$E = 4.46701 \times 10^{-25}$
$F = 0.0$ ASP3
$\kappa = 0.00000$
$A = -1.49247 \times 10^{-7}$
$B = 2.48237 \times 10^{-12}$
$C = 1.10343 \times 10^{-15}$
$D = -6.65598 \times 10^{-20}$
$E = -2.15738 \times 10^{-24}$
$F = 0.0$ ASP4
$\kappa = 0.00000$
$A = -9.40388 \times 10^{-8}$
$B = -4.01544 \times 10^{-12}$
$C = -6.89483 \times 10^{-17}$
$D = 1.70469 \times 10^{-20}$
$E = -6.15241 \times 10^{-24}$
$F = 0.0$ ASP5
$\kappa = 0.00000$
$A = 1.88036 \times 10^{-8}$
$B = -1.59516 \times 10^{-12}$
$C = -3.15148 \times 10^{-16}$
$D = -2.20945 \times 10^{-20}$
$E = 0.0$
$F = 0.0$ ASP6
$\kappa = 0.00000$
$A = 1.67077 \times 10^{-7}$
$B = -2.42295 \times 10^{-12}$
$C = 1.58927 \times 10^{-15}$
$D = -1.11815 \times 10^{-19}$
$E = 1.37831 \times 10^{-23}$
$F = 0.0$ ASP7
$\kappa = 0.00000$
$A = -1.42562 \times 10^{-7}$
$B = 2.11000 \times 10^{-11}$
$C = -3.82147 \times 10^{-15}$
$D = 2.44894 \times 10^{-19}$
$E = 0.0$
$F = 0.0$ ASP8
$\kappa = 17.06579$
$A = 7.65400 \times 10^{-9}$
$B = -7.96595 \times 10^{-15}$
$C = -8.95740 \times 10^{-19}$
$D = 6.26276 \times 10^{-28}$
$E = -1.26805 \times 10^{-27}$
$F = 1.50073 \times 10^{-32}$ As shown in the above, the catadioptric projection optical system in FIG. 2, for $F_2$ laser light with the center wavelength having 157.6 nm, the image side numerical aperture NA of 0.75 and the image circle dimeter of 16.4 mm on the wafer are secured using few lenses and without enlarging primary mirror M1. When the projection optical system in FIG. 2 is applied to a projection exposure apparatus, it is possible to attain a high-resolution image of 0.1 μm or shorter. When the projection optical system in FIG. 2 is applied to the step-and-scan type projection exposure apparatus, if the exposure area upon the wafer is set as a 15 mm×6 mm rectangular shape for example, it is possible to transcribe the reticle pattern into a 30 mm×40 mm area by performing stitching exposure with two scanning exposure.

Next, the structure of the lens-barrel used when the projection optical system of FIG. 2 is applied to a projection exposure apparatus is described.

Figure 3:
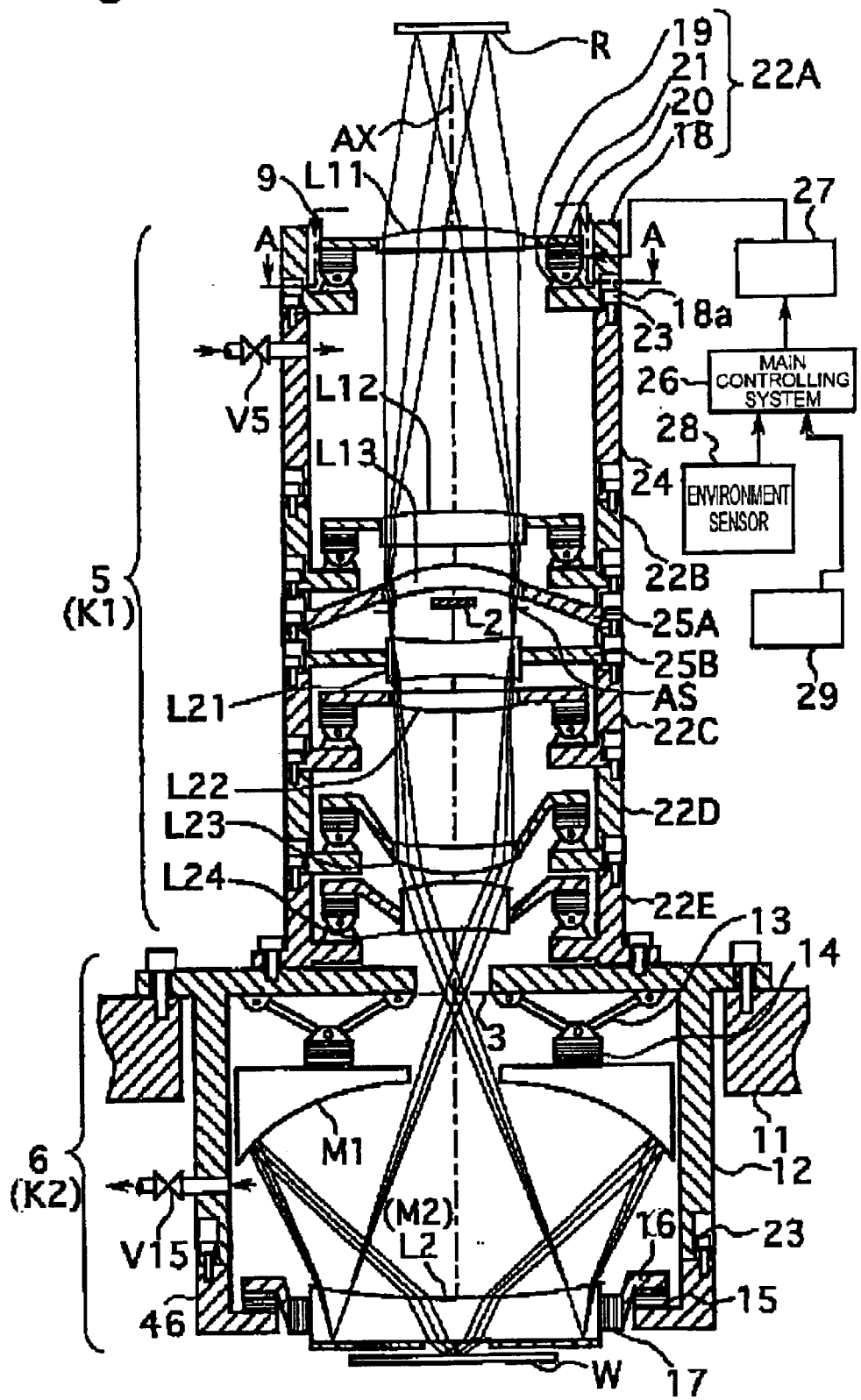
FIG. 3 is a cross-sectional view showing the structure of the lens-barrel of the projection optical system according to the first embodiment of the present invention.

FIG. 3 is a cross-sectional view showing the main components when mounting the projection optical system of FIG. 2 in the projection exposure apparatus. In FIG. 3, the first imaging optical system K1 comprising lenses L11 to L24 is supported by barrel 5 which is an assembly of a plurality of divided lens-barrels, and the second imaging optical system K2 comprising the primary mirror M1, the lens L2, and the secondary mirror M2, is held by second barrel 6, which is an assembly of a plurality of divided lens-barrels. Barrels 5 and 6 correspond to the holding blocks in this invention. They are mounted to the holding plate 11, which is the frame of the projection exposure apparatus so as to be freely detachable.

To begin with, the second barrel 6 is configured by connecting divided lens-barrels 12 and 46 along the optical axis, in order from the reticle side, using bolts 23 in three places or more, and is mounted on the U-shaped opening provided at the center of plate 11 of the projection exposure apparatus, and a flange section of the divided lens-barrel 12 located at the top of barrel 6 is fixed to the plate 11 by the bolts. In the upper divided lens-barrel 12, the primary mirror M1 is supported so as to hang in three locations by a V-shaped lens (mirror) mount mechanism 13 and a vertical drive element 14 which is extendable along the optical axis; and within the lower divided lens-barrel 46, the lens L2 and the secondary mirror M2 are held by three vertical drive elements 15, one lens mount 16, and one set of decentering drive elements 17. For example, an electric micrometer, piezoelectric elements, or a small electric motor may be used for vertical drive elements 14 and 15. By adjusting the amount of drive of the three locations of vertical drive elements 14 and 15, it is possible to adjust the position of the optical elements (the primary mirror M1, the lens L2, and the secondary mirror M2) along the optical axis AX, as well as the respective tilt angles about the two axes orthogonal thereto.

On the other hand, a set of decentering drive elements 17 comprises two drive elements, such as an electric micrometer, piezoelectric element, or small motor, which moves the respective optical elements, which are the objects to be held, along the two orthogonally-intersecting axes of the horizontal plane perpendicular to the optical axis AX; and an applying section, such as a coil-shaped spring, which presses the optical elements against these drive units. By controlling the amount of movement of the two drive units in the decentering drive element 17, it is possible to adjust the amount of decentering along the two axes that orthogonally intersect the optical elements. It is noted here that the cross-sectional view of FIG. 3 (in the same manner as for the respective cross-sectional views of the other embodiments below) shows the section along the plane which has every 120 degree angle centered at the optical axis AX in the connection with the vertical drive elements (e.g. 14 and 15) and bolts 23; and in regards to decentering drive element 17, shows normal frontal view.

The first barrel 5 comprises, in order from the reticle side, an active divided lens-barrel 22A, which holds the lens L11;

the lens-barrel 24, which acts as a spacer; an active divided lens-barrel 22B, which holds the lens L12; the lens L13; an active divided lens-barrel 25A, which holds the aperture stop AS and the shielding member 2; an active divided lens-barrel 25B, which holds the lens L21; an active divided lens-barrel 22C, which holds the lens L22; an active divided lens-barrel 22D, which holds the lens L23; and an active divided lens-barrel 22E, which holds the lens L24, all of which being connected along the optical axis by bolts 23 in three or more locations, respectively. The flange section of the lowermost active divided lens-barrel 22E is fixed to the top of the second barrel 6.

Each of the five active divided lens-barrels from 22A to 22E are assembled so that a lens mount 21 is arranged in an outer barrel 18 through freely-rotating flanges 19 and vertical drive elements 20 at three places. The optical element (the lens L11 to the lens L24) is held in the lens mount 21. The assembly of vertical drive element 20 is in the same manner of vertical drive elements 14 and 15, wherein each of the five active divided lens-barrels 22A to 22E are able to adjust the position of internal lenses L11 to L24 along the optical axis AX and the tilt angle about the two axes orthogonal thereto.

Figure 4A:
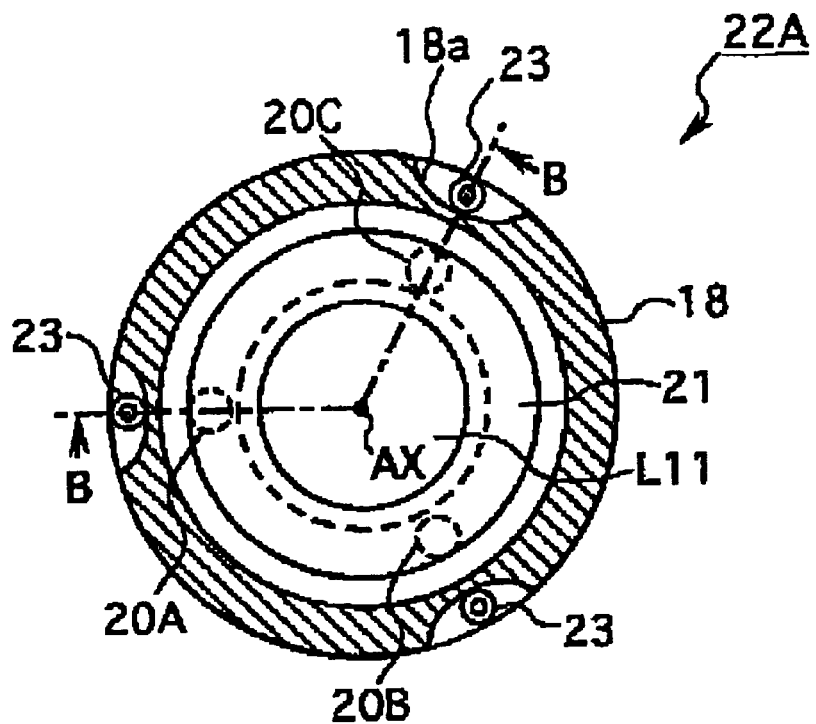
FIG. 4A is a cross-sectional view along line A—A of FIG. 3.

FIG. 4A is a cross-sectional view along line A—A in FIG. 3. In FIG. 4A, vertical drive elements 20 of FIG. 3 are disposed at positions 20A to 20C at equiangular intervals about the optical axis AX as the center. Bolts 23, which connect the outer barrel 18 of the active divided lens-barrel 22A and a spacing lens-barrel 24, are arranged in notch 18a, which provided at three places on the circumference of the outer barrel 18. In comparison with the method which connects the two barrels by binding flange parts from the outer surface of each barrel, for example, it is possible to make the divided lens-barrel 22A from fewer parts and reduce its manufacturing costs. There are O-rings arranged respectively at a groove between lens-barrels (not shown in the Figure) for maintaining the high purity of the purge gas inside the lens-barrels. Bolts 23 can be disposed at three places or more, or for example, as many as twelve places, for increasing the degree of seal of the adjoining lens-barrels. The cross section along line B—B in FIG. 4A corresponds to the cross section of the first barrel 5 in FIG. 3.

Figure 4B:
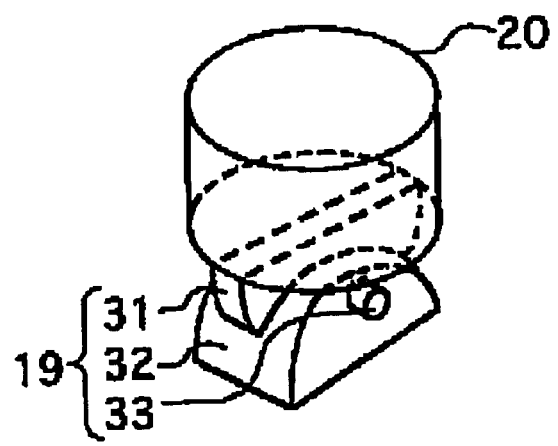
FIG. 4B is an enlarged perspective view showing the vertical drive components and coupling of FIG. 3.

FIG. 4B is an enlarged perspective view showing the flange 19 and the vertical drive element 20 in FIG. 3. In FIG. 4, the flange comprises a holder 32; a lobe 31, which is connected to the holder 32 so that it can freely rotate; and a pin 33, which joins the holder 32 and the lobe 31. The end of vertical drive element 20 is connected to the lobe 31. Although the flange 19 is able to rotate around one axis in this arrangement, it is possible to arrange the flange with notation around two axes.

Returning to FIG. 3 the drive amount of the vertical drive elements 20 of the active divided lens barrels 22A to 22E, the drive amount of vertical drive elements 14 in the second barrel 6, and the drive amounts of decentering drive elements 17 are controlled by an imaging characteristics control system 27. Each drive element 20, 14, and 17 has a sensor (rotary encoder, electrostatic capacity-type or optical gap-type sensor) for detecting their respective amounts of drive, so that the imaging characteristics control system 27 controls the drive amount of the respective drive element 20, 14, and 17, while receiving outputs from respective sensors.

The operation of imaging characteristics control system 27 is controlled by a main controlling system 26, which performs supervisory control over the components of the projection exposure apparatus. The main controlling system 26 receives data with a predetermined sampling rate from an environment sensor 28, which comprises, for example, a barometric sensor that measures the atmospheric pressure around the projection exposure apparatus in this embodiment; a thermometer, which measures the temperature about the circumference; and a hygrometer etc. Moreover, the projection exposure apparatus includes an exposure control system 29, which indirectly obtains the accumulated energy of the exposure light (illuminating light) passing through the projection optical system by monitoring the illuminance (pulse energy) of a split light from the exposure light in the illumination optical system. When the atmospheric pressure about the circumference and accumulated energy changes, the characteristics of the imaging optical system such as, best focus point, projection magnification, and aberrations (distortion, astigmatism, field curvature, spherical aberration, and coma etc.) accordingly change; therefore, the relationship between the change in atmospheric pressure, accumulation of energy and so on, and the change in the characteristics such as the magnification of the projection is pre-stored as a table in the memory of the main control system 26. When the measured values of, for example, atmospheric pressure changes, or when the accumulation of energy accordingly increases, the main controlling system 26 drives the five lenses L11 to L24 to counterbalance the corresponding change in the characteristics of imaging through the imaging characteristics control system 27 and vertical drive elements 20. It is noted here that it is possible to handle the change of the best focus point by controlling the focus point on the wafer W. It is also possible to compensate further by driving the primary mirror M1 and the lens L2 (the secondary mirror M2) through vertical drive elements 14, 15 and decentering drive element 17, if necessary.

Since the exposure light (illuminating light) is an $F_2$ laser (a center wavelength is 157.6 nm), a high-purity purge gas, which allows greater transmissivity of light in the vacuum ultraviolet (VUV) region is supplied in an optical path of the (exposure light. Nitrogen gas, or a suitable noble gas (such as helium, neon, argon, krypton, xenon, or radon), which are chemically inert gasses, can be used as the purge gas. Although nitrogen gas provides comparatively high transmissivity and low cost with light having wavelengths of approximately 150 nm or longer, absorption of the light is increased for light having wavelengths of less than approximately 150 nm. Helium gas is expensive, but it provides comparatively high transmissivity for light having wavelengths down to approximately 100 nm. Moreover, helium gas has advantages of high thermal conductivity (three times higher than neon, and six times higher than Nitrogen), excellent thermal stability, and relatively low fluctuation in the refractive index corresponding to the change of atmospheric pressure (½ that of neon, and ⅛ that of nitrogen gas). For these reasons, helium gas is used as the purge gas in this embodiment.

Therefore, in FIG. 3, a supply pipe with an attached valve V5 is connected to the lens-barrel 24 as a spacer in first barrel 5 from the supply apparatus (not shown in the Figure), and temperature-controlled high-purity purge gas is supplied into the projection optical system from the supply apparatus. The exhaust pipe with an attached valve VIS, which leads to the supply apparatus, is connected to the divided lens-barrel of the second barrel 6. The purge gas that has flowed through the projection optical system is returned to the supply apparatus through the exhaust pipe. In the supply apparatus, the purge gas is supplemented for the gas lost due to leakage, and after removing the impurities in the returned gas, is supplied again into the projection optical system through the supply pipe.

The purge gas is able to circulate through the space beneath the supply pipe between each of the three vertical drive elements 20 that drive lenses L12 to L24, respectively, and also through the many openings formed at almost equiangular intervals on the lens mount 21 which holds the lens inside active divided lens-barrels 22B to 22E and on lens mount of divided lens-barrels 25A and 25B. The purge gas is able to circulate without stagnation in the first barrel 5 toward the second barrel 6. As an example, a sealing member 9 which is accordion-shaped and tightly-sealed is disposed between the lens mount 21, which holding the lens 11, at the top of the first barrel 5 and the outer barrel 18 to prevent the purge gas from leaking.

The purge gas that flows into the second barrel 6 reaches the space over the lens L2 through the spaces in the lens mount mechanism 13, the space outer side of the primary mirror M1, and the aperture at the center of the primary mirror M1 and it is released through the exhaust pipe with an attached valve V15. Since the high-purity purge gas is supplied into a gastight chamber where the wafer W is received (or gas-tight chamber where the wafer-stage system is received), a certain volume of purge gas can leak from the margin of the lens L2 at the bottom of the second barrel 6 to the wafer W side. However, in the case where the prevention of purge gas leakage from the margin of the lens L2 and the wafer W side is desired, it is preferable that sealing material be placed into the space between the margin of the lens L2 and the divided lens-barrel 46.

As mentioned above, with the projection optical system of this embodiment, the first imaging optical system K1 and the second imaging optical system K2 are disposed such that the primary image 3 (intermediate image) is sandwiched between them, and the outside diameter of the first imaging optical system K1 and the second imaging optical system K2 differ considerably. By having the first imaging optical system K1 supported by the first barrel 5, the second imaging optical system K2 supported by second barrel 6, and the primary image 3 sandwiched there between, all of the optical elements that construct the projection optical system can easily be mechanically supported.

When considering each optical element in the catadioptric projection optical system, the amount of the aberration due to the dislocation of the reflective member is considerably larger than that for the refractive member. Since the refractive index of the reflective member is 2.0 with the refractive member having a refractive index 0.5, the amount of change in the refractive index of the reflective member due to dislocation is 4 times that of the refractive member because of Snell's law. On the other hand, even it the assembly of each of the barrels 5 and 6 is completed, due to various causes their positional relationship to each other can be considered to change ever so slightly; however, the relative positioning of the optical elements within each of the barrels 5 and 6 can expected to be preserved because they are supported connected to each other.

As shown above, the configuration having all of the reflective members (M1 and M2) disposed within one barrel, barrel 6, as in this embodiment is advantageous in that, even when that the barrel 6 has moved, if it is considered that the barrel 6, which includes those reflective members, is the standard and that the other barrel, barrel 5 has moved, it substantially means that only the refractive members have moved, so that the amount of aberrations that develop is low compared to cases where they are separately disposed in a plurality of barrels.

It is noted here that, generally, in order to utilize the ability of the surface of the reflective mirror enough, sufficient clear aperture diameter is required, and that in this regard, production is easier if the material diameter of the refractive members is small. In order to handle this, it is effective to produce an intermediate image, make the light beam smaller, and set the lens group only from the refractor and the other lens group, which mainly comprises the reflective mirror as an optical element. When thought of in this manner, in most the catadioptric projection optical systems that form an intermediate image, not limited to just the projection optical system of this embodiment, if the lens group that forms the intermediate image is formed as a unit in the barrel, the outer diameters of the optical elements within each barrel are relatively aligned, so that along with simplifying mechanical support, since the reflective member and the refractive member are separated before and after the intermediate image, the amount of aberrations that develop is reduced.

Next, the adjustment ability of the projection optical system in FIG. 3 is described. The projection optical system in this embodiment includes eight aspherical surfaces, and during production, there have a fear that they may become shifted to the degree of several $\mu$m. Even though these lenses are assembled in relation to the optical axis as the center, there is the possibility of high-order decentered aberration occurring due to the shifting of aspherical surfaces relative to the optical axis. To handle this problem, it is desirable that the components have decentered aberration adjusting ability of the same number of or more, corresponding to the aspherical surface.

As mentioned above, when reflective members shift from their designed positions, large aberrations are generated. For this reason, in cases where the system has two or more reflective members, one reflective member must be adjusted relative to the other reflective member. Consequently, in this embodiment, and as shown by divided lens-barrels 12 and 46, a single holding block is made having only a single reflective member in.

Next, a procedure of the manufacturing process is described. It is generally considered that there are large aberrations generated from the reflective members in the projection optical system. However, even if results of measuring aberrations in the projection optical system first show the development of a large aberration, there are many cases where the location of aberration development cannot be determined.

As a countermeasure to such cases, if there is another projection optical system, which is already (completed, exchanging of only one barrel between completed system and manufacturing system can be considered. In this embodiment, if the second barrel 6, which supports holding the reflective members, is replaced with only the second barrel of a completed system, while observing the image of that projection optical system, divided lens-barrels 12 and 46 within second barrel 6 can be adjusted through translation or by being tilted. In this case, since only the second barrel 6 of the completed system is replaced, if there is any kind of aberration, then all of the aberrations would come from the second barrel. If the second barrel 6 is adjusted while observing the image, the barrel 6 can be adjusted to a state that is near the ideal position consequently. The adjusted second barrel 6 is reset and readjusted with the first barrel 5. Once this adjustment is completed, since only the first barrel 5 needs to be adjusted, the adjustment of the whole projection optical system can be completed in a short time. If adjustment is performed in this manner, the image approaches the designed values. However, if the adjustment between each divided lens-barrel (holding block) is performed with the barrel being removed from the holding plate 11, since it is impossible to make adjustment while observing the real time image, there is the possibility that the aberrations will remain in the adjustment tolerances of each of the barrels. To remove the remaining aberrations, and to correct the aberrations due to atmospheric pressure, the five lenses L11, L12, and L22 to L24 are composed in a manner such that they can be performed vertical movement along the optical axis and tilt movement by controlling from outside. The reason why there are five controllable optical elements prepared is so that there are enough to compensate third order aberrations along the optical axis and decentered aberrations. This adjustment mechanism is completely comprised within the first barrel 5. This is because the second barrel 6 comprises only reflective members (the lens L2 is considered a rear surface reflective mirror), and because the reflective members are not fit for delicate adjustment because they generate large aberrations. By using this adjustment mechanism it is possible to remove all residual aberration, and along with being possible to manufacture a projection optical system having approximately the same performance as designed, it is also possible to maintain an ideal state of imaging characteristics.

Furthermore, the primary mirror M1 is supported by the lens mount mechanism 13. By constructing this as a frame, the support members of the reflective mirrors do not divide the atmosphere within the lens-barrel. As a result of this, when the atmosphere within the lens-barrels is replaced with an inert gas such as helium, it becomes possible to perform expedited replacement without causing residual (retentive) gas to develop. Moreover, by using a frame construction, the reflective mirror support members can be made lighter.

[Second Embodiment]

Figure 5:
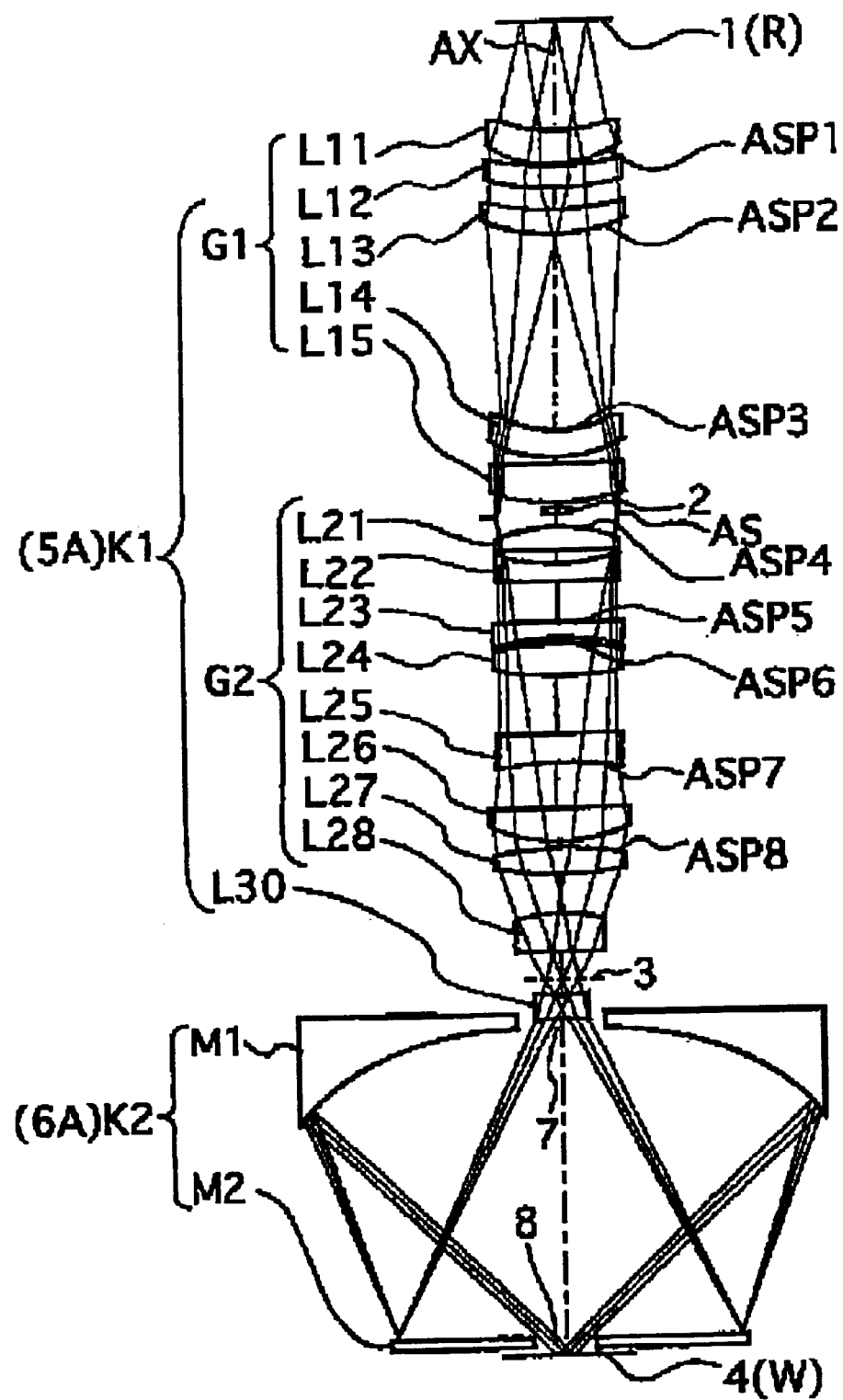
FIG. 5 is a block diagram of the lenses that form the projection optical system according to the second embodiment of the present invention.
Figure 6:
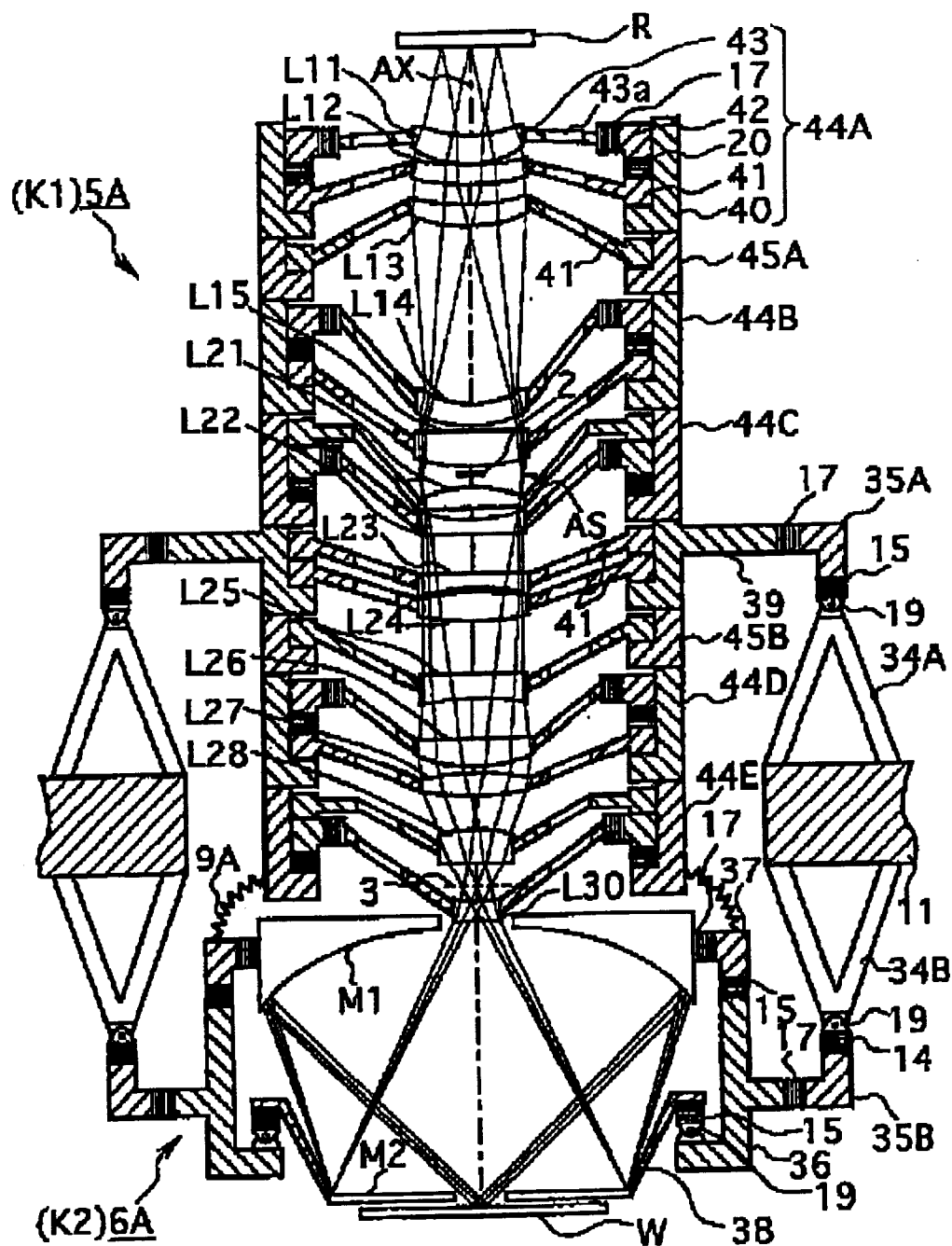
FIG. 6 is a cross-sectional view showing the structure of the lens barrel of the projection optical system according to the second embodiment of the present invention.
Figure 7:
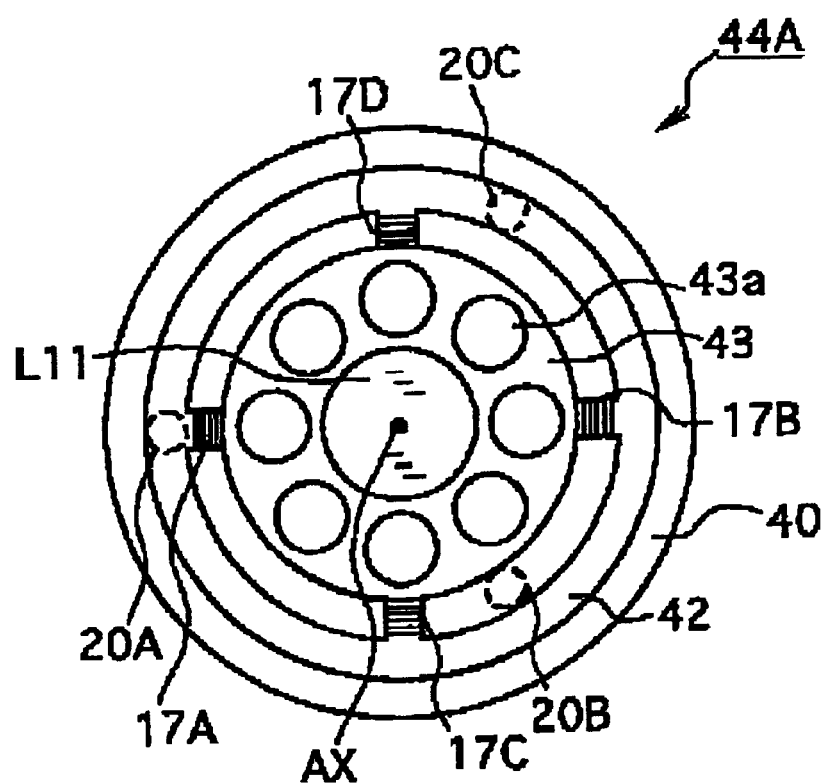
FIG. 7 is a top view showing the active-type divided lens-barrel of FIG. 6.

Next, a projection optical system according to the second embodiment of the present invention is described while referencing FIG. 1 and FIGS. 5 to 7. This embodiment employs an $F_2$ laser (central wavelength of 157.6 nm) as the exposure light and is used in the present invention onto an upright cylindrical catadioptric projection optical system including two reflective mirrors, the respective apertures thereof formed along each of the two optical axes. In FIGS. 5 to 7, the portions corresponding to those of FIGS. 2 and 3, are assigned the same or similar reference mark and their detailed description is omitted.

Figure 1:
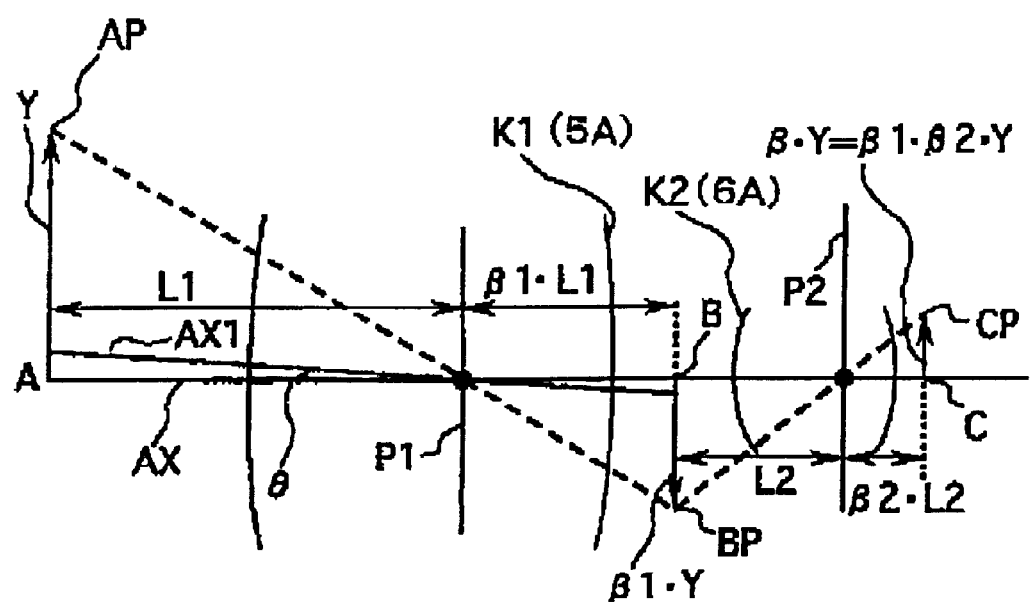
FIG. 1 is a schematic view showing the basic structure of the projection optical system according to the second embodiment of the present invention.

FIG. 1 is a schematic view of the projection optical system of this second embodiment. In FIG. 1; the projection optical system of this embodiment comprises a first imaging optical system K1 and a second imaging optical system K2; wherein a light from object point AP, which is located at height Y of a position A on an optical axis AX, passes through the first imaging optical system K1 to form a primary image BP (intermediate image) at height $\beta_1 \cdot Y$ ($\beta_1$ is a real number other than zero) of a position B, and light from first image BP passes through the second imaging optical system K2 to form a image point CP at height $\beta_1 \cdot \beta_2 \cdot Y$ ($\beta_2$ is a real number other than zero) of a position C. At this time, when the projection magnification of the entire projection optical system is given as $\beta$, then the expression $\beta = \beta_1 \cdot \beta_2$ may be concluded. Furthermore, the second imaging optical system K2 includes the reflective members.

In FIG. 1, imaging optical systems K1 and K2 are mechanically integrally held, independent of each other, by a first barrel 5A and a second barrel 6A, respectively. In this case, when deciding the most appropriate position for barrels 5A and 6A to be held, in order to maintain high performance image forming, it is preferable that image shift does not occur even when barrels 5A and 6A are tilted. Such a position is, for example, position PI where a segment between a positions A and B is internally divided by a ratio of 1:$\beta_1$ when first imaging optical system operates at positions A and B with the magnification of $-\beta_1$ ($\beta_1 > 0$). This is because, in the case of the interval between the position A and the point P1 in FIG. 1 is given as L1, when the first imaging optical system K1 is tilted by only an angle $\theta$, since the point that is originally located at the position A has a height of L1·$\theta$ relative to the optical axis of the tilted optical system, a point at which imaged this becomes a point having a height of $-\beta_1 \cdot L1 \cdot \theta$ relative to the optical axis of the tilted optical system; however, this is the point at position B upon the original optical axis. In the same manner, in regard to the point that had the originally predetermined image height as well, even if the system is tilted, image shift does not occur except distortion. Consequently, when the barrel 5A is supported at a position on a horizontal plane that is orthogonal to the optical axis AX, which point P1 passes through, or at a position near said horizontal plane, even if barrel 5A is tilted, image shift does not occur. In the same manner, when the magnification of the second imaging optical system K2, which performs imaging relative to the position B to the position C, is $\beta_2$, the barrel 6A should be supported at a position on the horizontal plane that is orthogonal to the optical axis AX at the position P2, which internally divides the interval between position B and the position C in a ratio of 1:$\beta_2$, or at a position near said horizontal plane.

FIG. 5 is a lens block diagram of the projection optical system according the second embodiment. In FIG. 5, the exposure light (illuminating light) IL, which passes through the pattern of the reticle R that is disposed in the object plane 1 passes through the first imaging optical system K1 to form the primary image 3 (intermediate image); and the light from the primary image 3 passes through the second imaging optical system K2 to form a reduced secondary image (final image) of the reticle pattern on the surface of the wafer W, which is disposed in the image plane 4.

The first imaging optical system K1 comprises, in order from the reticle side, a first lens group G1, which has a positive refractive power; an aperture stop AS; a second lens group G2, which has a positive refractive power; and a lens 30, which is concave on both sides and has a negative refractive power. A central shielding member 2 which shades the light around the optical axis AX, is set close to the facilitation plane of the aperture stop AS, but in a position that differs with the facilitation plane of the aperture stop AS along the optical axis.

The second imaging optical system K2 comprises, an order from the reticle side, a primary reflective mirror M1, which has a superficial reflective surface, the concave surface thereof facing the wafer side, and includes an aperture (a light transmission section) 7; and a secondary reflective mirror M2, which has a superficial reflective surface, the concave surface thereof facing the wafer side, and includes an aperture (a light transmission section) 8. Furthermore, the projection optical system of this embodiment includes eight aspherical surfaces ASP1 to ASP8.

The first lens group G1 comprises, in order from the reticle side, meniscus-shaped lens L11, the convex aspherical surface ASP1 thereof facing the wafer side; a meniscus-shaped lens L12 with the concave surface facing the reticle side; a meniscus-shaped lens L13 with the convex aspherical surface ASP2 facing the wafer side; a meniscus-shaped lens L14 with the concave aspherical surface ASP3 facing the reticle side; and a bi-convex-shaped lens L15. The second lens group G2 comprises, in order from the reticle side, a bi-convex-shaped lens L21 with the convex aspherical surface ASP4 facing the reticle side; a meniscus-shaped lens L22 with a concave surface thereof facing the reticle side; a meniscus-shaped lens L23 with the convex aspherical surface ASP5 facing the reticle side; a convex-shaped lens L24 with the convex aspherical surface ASP5 facing the reticle side; a meniscus-shaped lens L25 with the concave aspherical surface ASP7 facing the wafer side; a biconvex-shaped lens L26; a biconvex-shaped lens L27 with the convex aspherical surface ASP8 facing the reticle side; and a biconvex-shaped lens L28.

In this manner, with the projection optical system in FIG. 5, light from the pattern of the reticle R passes through the first imaging optical system K1 and forms the primary image 3 (intermediate image) of the reticle pattern. The light from the primary image 3 travels through aperture 7 at the center of the primary reflective mirror M1 to be reflected by the surface of a secondary reflective mirror M2; and the light reflected by the surface of a secondary reflective mirror M2 is reflected by the surface of the primary reflective mirror M1. The light reflected by the primary reflective mirror M1 travels through the aperture 8 at the center of a secondary reflective mirror M2 to form the reduced the secondary image of the reticle pattern on the surface of the wafer W.

Fluoride ($CaF_2$ crystal) is used for all of the refractive optical members (lens elements) that (constitute the projection optical system of FIG. 5.

Furthermore, the oscillation center wavelength of the $F_2$ laser light, which is used as the exposure light, is 157.624 nm; the range of oscillation wavelength, 157.624 nm±approximately 1 pm, is narrow-banded; and the refractive index of $CaF_2$ is 1.559238, at the center wavelength of 157.624 nm. Moreover, the respective shapes of the aspherical surfaces used in the projection optical system of this embodiment is given by the expression (1).

The value of each factor of the projection optical system according to this embodiment shown in Table 3 corresponds to that shown in Table 1.

TABLE 2

(Principal Data)
λ = 157.624 nm ± 1 pm
β = 0.2500
NA = 0.75
φ = 16.4 mm
Distance from Reticle to First Surface = 97.4647 mm

| Surface Number | r | D | Optical Material |
|---|---|---|---|
| 1 | −133.8316 | 35.0000 | $CaF_2$ |
| 2(ASP1) | −116.4714 | 1.0000 | |
| 3 | −554.1774 | 20.5256 | $CaF_2$ |
| 4 | −213.7250 | 25.1023 | |
| 5 | −261.9616 | 20.0289 | $CaF_2$ |
| 6(ASP2) | −168.6391 | 20.3246 | |
| 7(ASP3) | −96.4098 | 25.0000 | $CaF_2$ |
| 8 | −163.9518 | 5.8731 | |
| 9 | 782.1145 | 40.0000 | $CaF_2$ |
| 10 | −194.0414 | 1.1373 | |
| 11(AS) | ∞ | 20.6498 | |
| 12(ASP4) | 104.9826 | 24.2585 | $CaF_2$ |
| 13 | −1294.5816 | 10.7993 | |
| 14 | −152.5389 | 20.0000 | $CaF_2$ |
| 15 | −858.7147 | 38.4039 | |
| 16(ASP5) | 798.2520 | 20.1464 | $CaF_2$ |
| 17 | 198.7615 | 4.1296 | |
| 18(ASP6) | 261.7539 | 29.0815 | $CaF_2$ |
| 19 | −501.0834 | 63.3677 | |
| 20 | 3299.4456 | 30.0000 | $CaF_2$ |
| 21(ASP7) | 360.6533 | 36.6971 | |

TABLE 2-continued

| | | | |
|---|---|---|---|
| 22 | 1401.8392 | 34.4568 | $CaF_2$ |
| 23 | −170.8148 | 5.9831 | |
| 24(ASP8) | 266.5085 | 24.4029 | $CaF_2$ |
| 25 | −370.3218 | 38.2791 | |
| 26 | 255.6101 | 39.9997 | $CaF_2$ |
| 27 | −1343.1549 | 49.5384 | |
| 28 | −142.9084 | 21.2041 | $CaF_2$ |
| 29 | 112.3957 | 14.2675 | |
| 30 | 427.9297 | 284.4437 | (Virtual Plane) |
| 31(M2) | −3734.1426 | −284.4437 | |
| 32(M1) | 427.9297 | 284.4437 | |
| 33 | −3734.1426 | 13.3911 | (Virtual Plane) |

(Aspheric Data)

ASP1
κ = 0.0000
A = 7.4338 × $10^{-8}$
B = 1.4821 × $10^{-12}$
C = 2.8340 × $10^{-16}$
D = 1.0465 × $10^{-21}$
E = 2.3982 × $10^{-24}$
F = 0.0

ASP2
κ = 0.0000
A = −3.1895 × $10^{-8}$
B = 1.5252 × $10^{-12}$
C = −1.5642 × $10^{-16}$
D = 1.0493 × $10^{-20}$
E = −7.2790 × $10^{-25}$
F = 0.0

ASP3
κ = 0.0000
A = −1.8862 × $10^{-7}$
B = −2.5593 × $10^{-12}$
C = −1.2889 × $10^{-15}$
D = 1.3308 × $10^{-19}$
E = 2.2662 × $10^{-28}$
F = 0.0

ASP4
κ = 0.0000
A = −1.7279 × $10^{-7}$
B = −2.6931 × $10^{-11}$
C = −2.7058 × $10^{-15}$
D = −2.7673 × $10^{-19}$
E = −8.2067 × $10^{-23}$
F = 0.0

ASP5
κ = 0.0000
A = −7.8055 × $10^{-8}$
B = 2.4611 × $10^{-11}$
C = −3.3373 × $10^{-15}$
D = −5.8685 × $10^{-19}$
E = 6.5684 × $10^{-23}$
F = 0.0

ASP6
κ = 0.0000
A = 1.4844 × $10^{-8}$
B = −1.7927 × $10^{-11}$
C = 3.0001 × $10^{-15}$
D = 3.4128 × $10^{-19}$
E = −7.3746 × $10^{-23}$
F = 0.0

ASP7
κ = 0.0000
A = 9.0882 × $10^{-8}$
B = −1.6366 × $10^{-12}$
C = 1.4369 × $10^{-16}$
D = −9.1173 × $10^{-20}$
E = 4.3321 × $10^{-24}$
F = 0.0

ASP8
κ = 0.0000
A = 1.3982 × $10^{-8}$
B = 2.9315 × $10^{-13}$
C = 8.0049 × $10^{-17}$
D = −2.5823 × $10^{-20}$
E = 1.2241 × $10^{-24}$
F = 0.0

As shown above, with the catadioptric projection optical system in FIG. 5, for $F_2$ laser, the image side numerical aperture NA of 0.75 and the image circle diameter of 16.4 mm on the wafer are secured using few lenses and without enlarging primary mirror M1.

Next, the structure of the lens-barrel used when the projection optical system of FIG. 5 is applied to a projection exposure apparatus is described.

FIG. 6 is a cross-sectional view showing the main components when the projection optical system of FIG. 5 is mounted in a projection exposure apparatus. In FIG. 6, the first imaging optical system K1 comprising lenses L11 to L28, and L30 is supported by the first barrel 5A (a lens-barrel unit), which is an assembly of a plurality of divided lens-barrels (holding blocks). The second imaging optical system K2, which comprises the primary reflective mirror M1, the lens L2, and the secondary reflective mirror M2, is supported by the second barrel 6A (lens-barrel unit), which is an assembly of a plurality of divided lens-barrels (holding blocks). The barrel 5E is attached to the top of a supporting plate 11 of the projection exposure apparatus so as to be freely detachable. The barrel 6 is attached to the bottom of holding plate 11 so as to be freely detachable and to be suspended.

To begin with, the second barrel 6A comprises two divided lens-barrels 37 and 36 connected through vertical drive elements 15 at three locations or more. A flange section of the divided lens-barrel 36 is held by a ring-shaped holding member 35B through decentering drive element 17. The holding member 35B is held so as to be suspended by three V-shaped holding members 34B, which are fixed to the base of the perimeter of an aperture formed on the holding plate 11, a joint 19 and a vertical drive element 14. In the divided lens-barrel 37, a primary reflective mirror M1 is held by the decentering drive element 17. In the divided lens-barrel 36, a lens mount 38 is held by a joint 19 and the vertical drive element 15 in three places. The secondary reflective mirror M2 is held by lens mount 38. Based on this configuration, it is possible to control (hereafter referred to as "control of aberrations with five degrees of freedom") the position of the optical axis of the second barrel 6A as a whole unit relative to the plate 11, the tilt angle around two orthogonally-intersecting axes, and the shift of the two directions comprising the plane perpendicular to the optical axis AX. It is possible to perform control of aberration with five degrees of freedom for the primary reflective mirror M1 relative to the second barrel 6A. It is also possible to control (hereafter referred to as "control of aberrations with three degrees of freedom") the position along the optical axis and the tilt angle about the two axes for secondary reflective mirror M2 relative to the second barrel 6A.

When the magnification of the second imaging optical system K2 (the primary reflective mirror M1 and the secondary reflective mirror M2) corresponding from the primary image 3 to the surface of the wafer W is $-\beta 2$, the plane through the center of the joint 19 (the bottom of the holding member 34B), and perpendicular to the optical axis AX, also passes through the position which internal divides the segment between the surface of the pattern of the reticle R and the primary image 3 along the optical axis AX in the ratio of $1:\beta 1$ and nearly contacts the plane perpendicular to the optical axis AX. Here, the joint 19 works as a supporting plane of the barrel 6A, and $\beta 1 = -0.49$ in this embodiment. Because of this arrangement, there is no lateral shift of the protected image even when the second barrel 6A rotates about the holding plane.

The first barrel 5A comprises, in order from the reticle side, an active divided lens-barrel 44, a divided lens-barrel 45A, active divided lens-barrels 44B and 44C, divided lens-barrels 39 and 45B, and active divided lens-barrels 44D and 44E, which are (connected along the optical axis using bolts (not shown in the Figure) at three locations or more, respectively; and the flange section of the divided lens-barrel 39 arranged in the middle section is supported through decentering drive element 17 by a ring-shaped holding member 35A. The holding member 35A is held by three inverted-V-shaped holding members 34A fixed to the top of the circumference of the aperture formed on the holding plate 11, a joint 19 and a vertical drive element 14. Through this configuration, it is possible to perform control of the position of the entire first barrel 5A with five degrees of freedom relative to the holding plate 11.

The five active divided lens-barrels 44A to 44E respectively hold a lens mount 41, a vertical drive element 20, and a spacer 42 in outer barrel 40 (the order of these is flexible). Within the spacer 42, the lens mount 43 is held via decentering drive element 17. Lens mounts 41 and 43 each hold lenses. The five active divided lens-barrels 44A to 44E hold lenses L11, L14, L22, L26, L30, respectively, with the condition of being able to control displacement within five degrees of freedom. Active divided lens-barrels 44A, 44B, and 44D hold lenses L12, L15, and L27, respectively, with at rest conditions. Active divided lens-barrels 44C and 44E hold lenses L21 and L28, and lenses L22 and L30, respectively, so as to control displacement within three degrees of freedom. Active divided lens-barrels 45A and 45B hold lenses L13 and L25, respectively, via the lens mount 41. The active divided lens-barrels 39 holds lenses L23 and L24 through the two lens mounts 41.

In FIG. 6, the operation of all vertical drive element 14, 15, and 20 and decentering drive element 17 are controlled by the imaging characteristics control system, which is equivalent to the imaging characteristics control system 27 in FIG. 3. As a result, it is easy to determine the relative positions of the primary reflective mirror M1 and the secondary reflective mirror M2 during assembly and adjustment of the projection optical system in this embodiment. It is also possible to reduce the amount of residual aberrations after constructing the barrel 5A. Further, it is possible to perform adjustments during the exposure process, if necessary.

Furthermore, if the projection magnification of the first imaging optical system K1 (lenses L11 to L30) is given as $-\beta 1$ for the primary image 3 from the pattern surface of the reticle R, then the plane, which is the holding plane of the first barrel 5A passing through the center of the joint 19 (the top of the holding member 34A), orthogonal to the optical axis AX, also passes through the position that internally divides the distance between the primary image 3 and the surface of the wafer W along the optical axis AX in the ratio of $1:\beta 1$ to nearly contact the plane orthogonal to the optical axis AX. In this embodiment, $\beta 1 = -0.51$ and accordingly there is no lateral shift even when the first barrel 5A rotates about the holding plane.

It is noted here that even though the lens L30 is located 10 mm below the primary image 3 (intermediate image), it belongs to first barrel 5A (the first imaging optical system K1) when considering mechanical balance. In this case, the intermediate image is a virtual image; however, this fact does not affect the above description.

Furthermore, since the projection optical system in this embodiment comprises eight aspherical surfaces, there are block structures (divided lens-barrels 44A, 45B, 44B, ... 37, and 36) at ten places more than the number of aspherical surfaces. Accordingly, the relationship among the aspherical surfaces can be set the predetermined value with high accuracy to the design value.

FIG. 7 is the top view of FIG. 6. In FIG. 7, vertical drive elements 20 in FIG. 6 are disposed at three predetermined locations 20A to 20C at equiangular intervals about the optical axis AX. Furthermore, decentering drive elements 17 in FIG. 6 comprise drive elements 17A and 17C, which move the lens mount 43 in two orthogonally-intersecting directions; and holding elements 17B and 17D, which press the lens mount 43 against these drive elements. Furthermore, there are eight openings 43a formed in the lens mount 43 to allow the purge gas to flow smoothly.

Returning to FIG. 6, each lens mount 41 also has a plurality of openings to allow the purge gas to flow. Nitrogen gas is used as the purge gas in this embodiment. The high-purity purge gas supplied into the gastight chamber (the reticle stage chamber) where the respective reticles are stored, is into the second barrel 6A through openings 43 of the lens mount 41 in the first barrel 5A of the projection optical system. The purge gas led into the barrel 6A is led into the gastight chamber (wafer stage chamber) through the openings (not shown in the Figure) provided in the lens mount 38, and the aperture at the center of the secondary reflective mirror M2. Since there is a plurality of openings formed on each lens mount 41 and 43, when the air within the projection optical system is replaced with a purge gas, it becomes possible to perform quickly replacement without causing residual (retentive) gas to develop. Moreover, by using a frame construction, the reflective mirror support members can be made lighter.

To improve the gas tightness of the first barrel 5A, there are O rings (not shown in the Figure) inserted between the respective divided lens-barrels 44A, 45A, 44B, and so on. In order to seal the space between the first barrel 5A and the second barrel 6A, for example, an extendable accordion-shaped sheathing member 9A is prepared, and in order to sheath vertical drive elements 15 between divided lens-barrels 36, and 37, an extendable sheathing member (not shown in the Figure) is provided so that there is no lateral intermixing from the outside of the projection optical system. Through this configuration, the high-purity purge gas within the projection optical system can be maintained.

[Third Embodiment]

Figure 8:
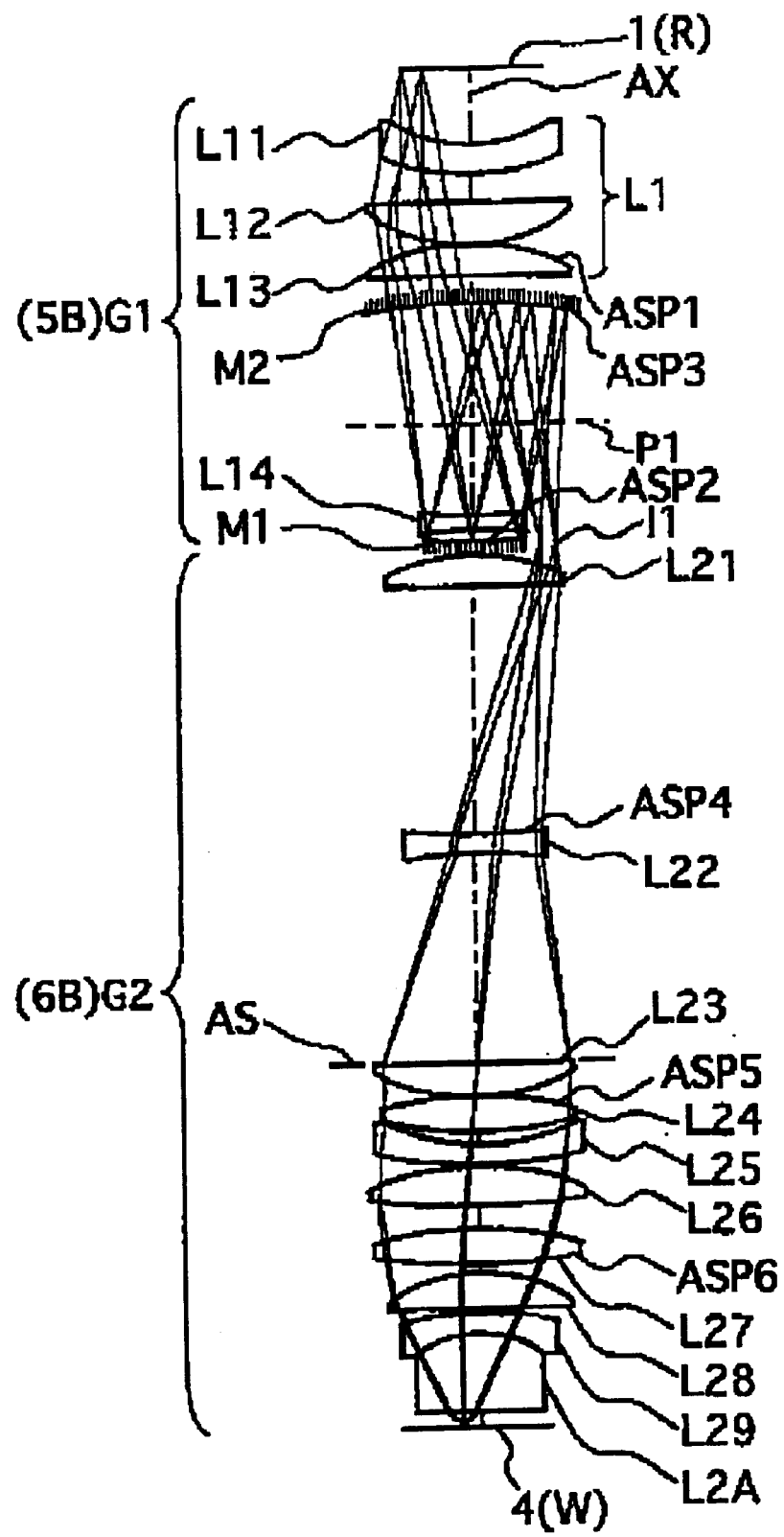
FIG. 8 is a block diagram of the lenses that form the projection optical system according to the third embodiment of the present invention.

The third embodiment of the projection optical system according to the present invention is described using FIGS. 8 and 9. In the third embodiment, the present invention is applied to the off-axis catadioptric type (a light passes through the outside of the predetermined reflecting mirror) projection optical system, which uses the ArF excimer laser (central wavelength: 193.3 nm) is used as the exposure light. For the parts in FIGS. 8 and 9 corresponding to the parts in FIGS. 2 through 6, the same or similar reference numerals and detailed descriptions are omitted.

FIG. 8 is a block diagram of the lens of the catadioptric type projection optical system in this embodiment. In FIG. 8, the projection optical system of this embodiment comprises: a catadioptric type first imaging optical system G1, which forms intermediate image I1 of reticle R pattern on the object plane (the first plane); and dioptric type second imaging optical system G2, which forms the final image of the reticle pattern on the wafer W surface on image plane 4 (second plane) with telecentric light beam, based on the light provided from intermediate image I1. First and second imaging optical systems G1 and G2 are held by first and second barrels 5B and 6B, respectively.

The first imaging optical system G1 comprises a lens group L1 that includes at least one positive lens component, a first reflecting surface M1 that reflects the light transmitted through the lens group L1, and a second reflecting surface M2 that guides the light reflected from the first reflecting surface M1 to the second imaging optical system G2. At least one of first and second reflecting surfaces M1 and M2 is a concave reflecting surface. For example, the lens group L1 comprises, in order from the reticle side, a meniscus-shaped lens L1 whose concave surface faces the reticle side; a meniscus-shaped lens L12 with a positive refractive power whose concave surface faces the reticle side; and a meniscus-shaped lens L23 whose aspheric convex surface ASE1 faces the reticle side. The reflecting surface M1 is an aspheric concave surface ASP2 faces be reticle side. The reflecting surface M2 is an aspheric concave surface ASP3 faces the reflecting surface M1 side. A biconcave shaped lens L14 is disposed between reflecting surfaces M1 and M2.

On the other hand, as an example, the second imaging optical system G2 comprises a biconvex shaped lens L21, a biconcave shaped lens L22 whose aspheric concave surface ASP4 faces the reticle sidle, a biconvex shaped lens L23, a biconvex shaped lens L24 whose aspheric convex surface ASP5 faces the reticle side, a meniscus-shaped lens L25 whose concave surface faces the reticle side, a biconvex shaped lens L26, a biconvex shaped lens L27 whose aspheric convex surface ASP6 faces the wafer side, and three meniscus shaped lenses L28, L29, and L2A whose concave surfaces face the wafer side, in order from the reticle side. An aperture stop AS is disposed near the incident surface of the lens L23.

All of the optical elements of the projection optical system of this embodiment are disposed on the single linear optical axis AX. The object plane 1 is placed approximately parallel to the image plane 4. The exit pupil of the projection optical system is approximately circular.

In refractive optical materials (lens elements) that constitutes the projection optical system shown in FIG. 8, fluorite ($CaF_2$ crystal) is used for lens L24, but synthetic silica ($SiO_2$) is used for other lenses. The central oscillation wavelength of the ArF excimer laser light that is used as the exposure light is 193.3 nm, and the oscillation wavelength width is narrow-banded to 193.3 nm±0.48 pm. The refractive indices of $SiO_2$ and $CaF_2$ for the central wavelength (193.3 nm) are as follows:

$SiO_2$ refractive index: 1.5603261

$CaF_2$ refractive index: 1.5014548

In addition, the shape of the aspherical surface used for the projection optical system of this embodiment can be described by equation (1). The value of each factor of the projection optical system according to this embodiment shown in table 3 which has similar style of the table 1.

TABLE 3

(Principal Data)
$\lambda$ = 193.3 nm (Median Wavelength)
$\beta$ = 0.2500
NA = 0.75

| Surface Number | r | d | Optical Material |
|---|---|---|---|
| 1 | −211.97583 | 30.000000 | SiO2 |
| 2 | −354.80161 | 35.347349 | |
| 3 | −8888.21083 | 38.000000 | $SiO_2$ |
| 4 | −227.79960 | 0.944905 | |
| 5(ASP1) | 303.84978 | 27.415767 | $SiO_2$ |
| 6 | 237634.15996 | 30.000000 | |
| 7(M2) | ∞ | 214.776416 | (Virtual Plane) |
| 8 | −348.87932 | 12.000000 | $SiO_2$ |
| 9 | 4267.07121 | 5.579827 | |
| 10(ASP2) | −362.24910 | −5.579827 | (M1) |
| 11 | 4267.07087 | −12.000000 | $SiO_2$ |
| 12 | −348.87932 | −214.776416 | |
| 13(ASP3) | 642.80918 | 246.776416 | (M2) |
| 14 | 208.71115 | 33.000000 | $SiO_2$ |
| 15 | −2529.72930 | 257.546203 | |
| 16(ASP4) | −1810.41832 | 14.500000 | $SiO_2$ |
| 17 | 851.98207 | 220.408225 | |
| 18 | 15200.59096 | 30.000000 | $SiO_2$ |
| 19 | −268.76515 | 0.200000 | |
| 20(ASP5) | 434.96005 | 36.013163 | $CaF_2$ |
| 21 | −345.83883 | 10.489902 | |
| 22 | −215.91874 | 20.000000 | $SiO_2$ |
| 23 | −619.95152 | 0.200000 | |
| 24 | 415.08345 | 40.000000 | $SiO_2$ |
| 25 | −1275.90912 | 26.288090 | |
| 26 | 324.91386 | 35.000000 | $SiO_2$ |
| 27(ASP6) | −740.00769 | 5.214992 | |
| 28 | 140.91060 | 34.000000 | $SiO_2$ |
| 29 | 1406.88948 | 0.500000 | |
| 30 | 355.40083 | 17.506069 | $SiO_2$ |
| 31 | 98.27403 | 1.561573 | |
| 32 | 105.27944 | 75.940555 | $SiO_2$ |
| 33 | 1597.37798 | 12.920542 | |

(Aspheric Data)

| ASP1 | ASP2 | ASP3 |
|---|---|---|
| $\kappa$ = 0.000000 | $\kappa$ = 3.260270 | $\kappa$ = 1.840470 |
| A = 0.743561 × $10^{-8}$ | A = 0.859110 × $10^{-8}$ | A = 0.198825 × $10^{-8}$ |
| B = −0.230589 × $10^{-12}$ | B = 0.351935 × $10^{-12}$ | B = 0.556479 × $10^{-18}$ |

TABLE 3-continued

| | | |
|---|---|---|
| C = −0.115168 × 10⁻¹⁷ | C = −0.100064 × 10⁻¹⁵ | C = 0.597091 × 10⁻⁸ |
| D = −0.753145 × 10⁻²² | D = 0.318170 × 10⁻¹⁹ | D = 0.492729 × 10⁻²² |
| E = 0.0 | E = −0.489883 × 10⁻²³ | E = −0.103460 × 10⁻²⁶ |
| F = 0.0 | F = 0.0 | F = 0.0 |
| ASP4 | ASP5 | ASP6 |
| κ = 0.000000 | κ = 0.000000 | κ = 0.000000 |
| A = −0.885983 × 10⁻⁷ | A = −0.161380 × 10⁻⁷ | A = 0.138330 × 10⁻⁷ |
| B = −0.200044 × 10⁻¹¹ | B = 0.153066 × 10⁻¹² | B = 0.194125 × 10⁻¹² |
| C = −0.570861 × 10⁻¹⁶ | C = 0.108604 × 10⁻¹⁷ | C = −0.258860 × 10⁻¹⁸ |
| D = 0.456578 × 10⁻²² | D = 0.319975 × 10⁻²¹ | D = −0.196062 × 10⁻²² |
| E = −0.493085 × 10⁻²⁵ | E = −0.101080 × 10⁻²⁵ | E = 0.363539 × 10⁻²⁶ |
| F = 0.0 | F = 0.0 | F = 0.0 |

The catadioptric-type projection optical system of this embodiment can prevent the degradation of image forming performance caused by the absorption of used glass materials, and aberrations can be well compensated in whole exposure area although both sides are telecentric.

Next, the construction of the lens barrel when the projection optical system shown in FIG. 8 is applied to a projection exposure apparatus is described below.

Figure 9A:
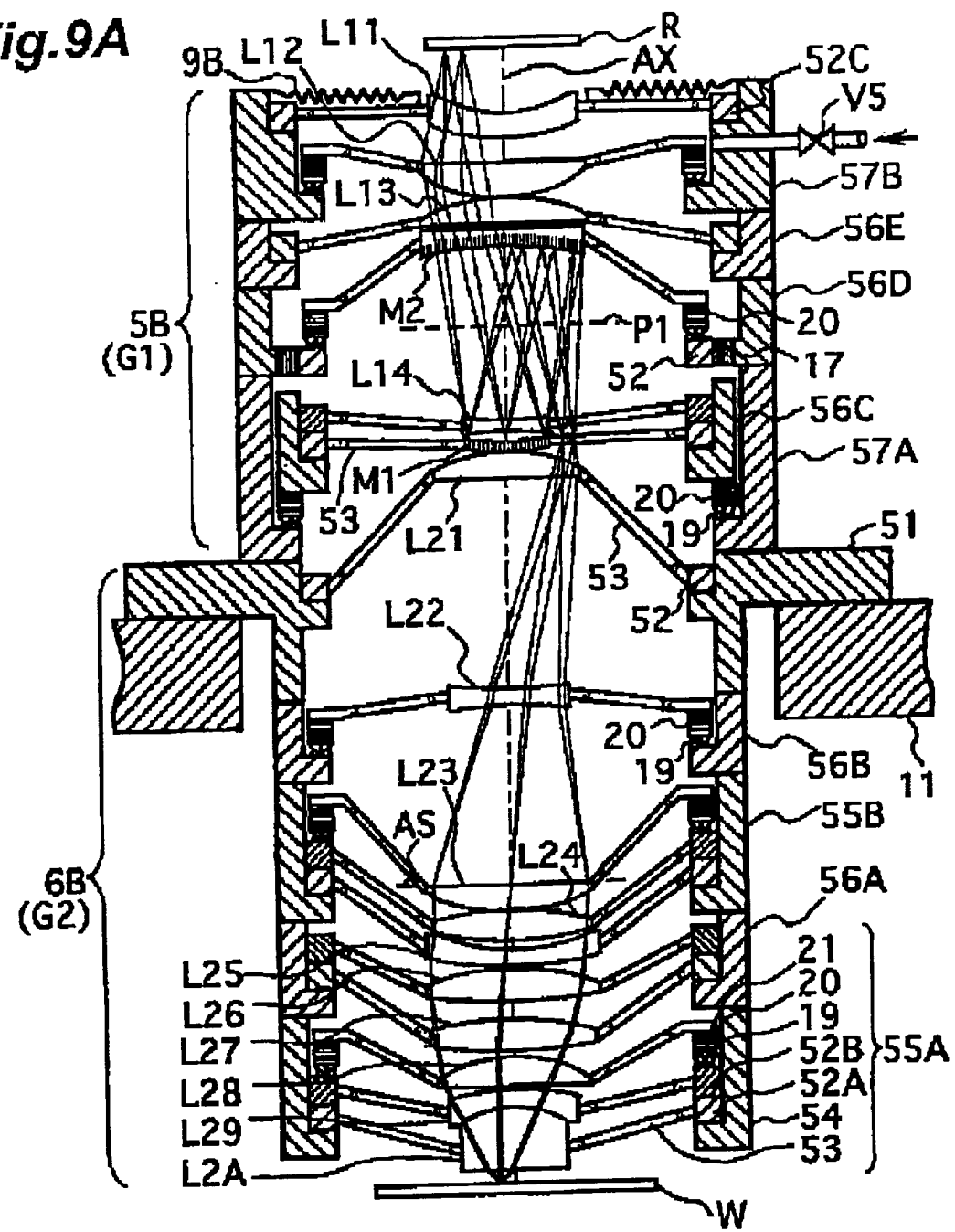
FIG. 9A is a cross-sectional view showing the structure of the lens barrel of the projection optical system according to the third embodiment of the present invention.

FIG. 9A is a cross-sectional drawing of the main section when the projection optical system shown in FIG. 8 is mounted on the projection exposure apparatus. In FIG. 9A, the first imaging optical system G1, which comprises lenses L11 to L14 and the reflecting mirrors with reflecting surfaces M1 and M2, is held by a first barrel 5B (lens-barrel unit) that is the aggregate of the multiple divided lens-barrels (support blocks), and the second imaging optical system G2, which comprises the lenses L21 to L2A, is held by a second barrel 6B (lens-barrel unit) that is the aggregate of the multiple divided lens-barrels (holding blocks). The second barrel 6B is attached so as to be detachable on the top surface of a supporting plate 11 of the projection exposure apparatus, and the first barrel 5B is attached so as to be detachable on the top surface of said second barrel 65.

To begin with, the second barrel 6B is structured by connecting a divided lens-barrel 51, active divided lens-barrels 56B and 55B, a divided lens-barrel 5A, and an active divided lens-barrels 55A, each of which is fastened using three bolts or more (not shown in the Figure) to the optical axis direction, in order from the reticle side. Then, a flange section of the divided lens-barrel 51 at the top edge is fixed at the top surface around the aperture provided on the supporting plate 11 using bolts that are not shown in the Figures. The lens L21 is supported by the lens mount 52 in the divided lens-barrel 51 and three frame mechanisms 53.

In this case, two active divided lens-barrels 55A and 55B are respectively assembled by holding lens mounts 52A and 52B, three couplings 19, and three or more vertical drive elements 20 in an outer casing 54. The lenses are held in lens mounts 52A and 52B through frame mechanisms 53. The lenses are held on the top of vertical drive elements 20 through frame mechanisms 53. In active divided lens-barrel 55A, lenses L2A and L29 are fixed, and the lens L28 is capable of displacement having three degrees of freedom. In the active divided lens-barrel 55B, lenses L25 and L24 are fixed, and the lens L23 is capable of displacement having three degrees of freedom. In the divided lens-barrel 56A, lenses L27 and L26 are fixed. In the active divided lens-barrel 56B, the lens L22 is capable of displacement having three degrees of freedom through three couplings 19, vertical drive elements 20, and the frame mechanisms.

Figure 9B:
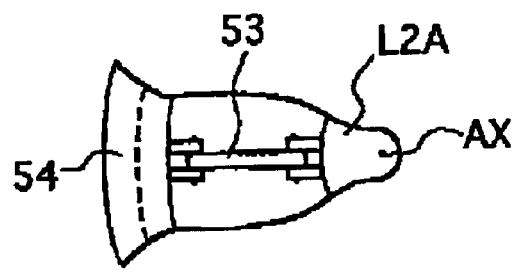
FIG. 9B is a bottom view of a portion of the projection optical system shown in FIG. 9A.

FIG. 9B is a part of the bottom view that indicates the projection optical system shown in FIG. 9A. As shown in FIG. 9B, a frame mechanism 53 comprises the rod members and two holing members that support the both sides of the rod members in the state such that both sides can be rotated. The holding members and the rod members can be fixed at the position where the lens to be supported reached at the target positions. The purge gas can flow without stagnancy in the projection optical system by supporting the lens through the frame mechanism 53.

In FIG. 9A again, the first barrel is assembled by connecting an active divided lens-barrel 57B, a divided lens-barrel 56E, and active divided lens-barrels 56D and 57A by using three bolts or more (not shown in the Figure) to the optical axis direction, in order from the reticle side. Also, an active divided lens-barrel 57A at the lowest stage is fixed to the top surface of the divided lens-barrel 51 of the second barrel 6B using the bolt that is not shown in the Figure. In addition, a divided lens-barrel 56C is placed in the active divided lens-barrel 57A through three couplings 19 and vertical drive elements 20. A reflecting mirror comprising the reflecting surface M1 and the lens L14 are supported in a divided lens-barrel 56D through the lens mounts and frame mechanisms 53. Thus, the lens L14 and the reflecting mirror with the reflecting surface M1 supported in the active divided lens-barrel 57A capable of displacement having three degrees of freedom.

In addition, lens mounts 52 are held in the active divided lens-barrel 56D through decentering drive elements 17, and a reflecting mirror with the reflecting surface M2 supported on lens mounts 52 through three couplings, vertical drive elements 20, and frame mechanisms can be moved freely among five positions. Further, the lens L13 supported in a divided lens-barrel 56E through the frame mechanisms is fixed. The lens L11 is supported in an active divided lens-barrel 57B at the top through lens mounts 52C and the frame mechanisms, and the lens L12 supported through three couplings and the vertical drive elements capable of displacement having three degrees of freedom.

Operations of all vertical drive elements 20 and decentering drive elements 17 shown in FIG. 9A are controlled by the image forming characteristics control system that is similar to image forming characteristics control system 27 shown in FIG. 3. As the result, in this embodiment, the positions of two reflecting mirrors with reflecting surfaces M1 and M2 can be designed easily while assembling and adjusting the projection optical system, and the residual aberrations after assembling barrels 5B and 6B can be reduced. In addition, the image forming characteristics can be compensated during exposure process if necessary.

In this embodiment, the argon gas (Ar) is used as the purge gas. The purge gas, which is supplied from the active divided lens-barrel 57B at the top into the first barrel 5B through a gas supply pipe with valve V5, flows into the second barrel 6B through each frame mechanism 53 that supports each lens or each reflective mirror. The purge gas flowing into the second barrel 6A flows into a gastight chamber (wafer stage chamber) in which the wafer W is stored, through each frame mechanism 53 that supports each lens. At this time, as there are no barrier between each frame mechanism 53, vapor in the projection optical system can be quickly replaced by the purge gas without generating the residual (stagnant) gas. In addition, the reflective mirror holding members can be lightened by using frame mechanisms 53.

In addition, O rings (not shown in the Figure) are interposed between divided lens-barrels 57B, ..., 55A to increase the gas-tightness of barrels 5B and 6B. Further, elastic bellows-shaped covering material 9B, for example, is provided so that the side of the lens L11 at the top of the first barrel 5B is covered, then the high-purity purge gas in the projection optical system can be kept.

As described above, the projection optical system of this embodiment includes the six aspherical surfaces. Thus, the lens barrel mechanism has nine block constructions (divided lens-barrels 57B, 56E, 56D, ..., 56A, and 55A) more than the aspherical surfaces. In addition, two reflecting mirrors with reflecting surfaces M1 and M2 capable of displacement having three degrees of freedom, and the reflective mirrors can be relatively displaced in the surface vertical to the optical axis AX.

[Fourth Embodiment]

Figure 10:
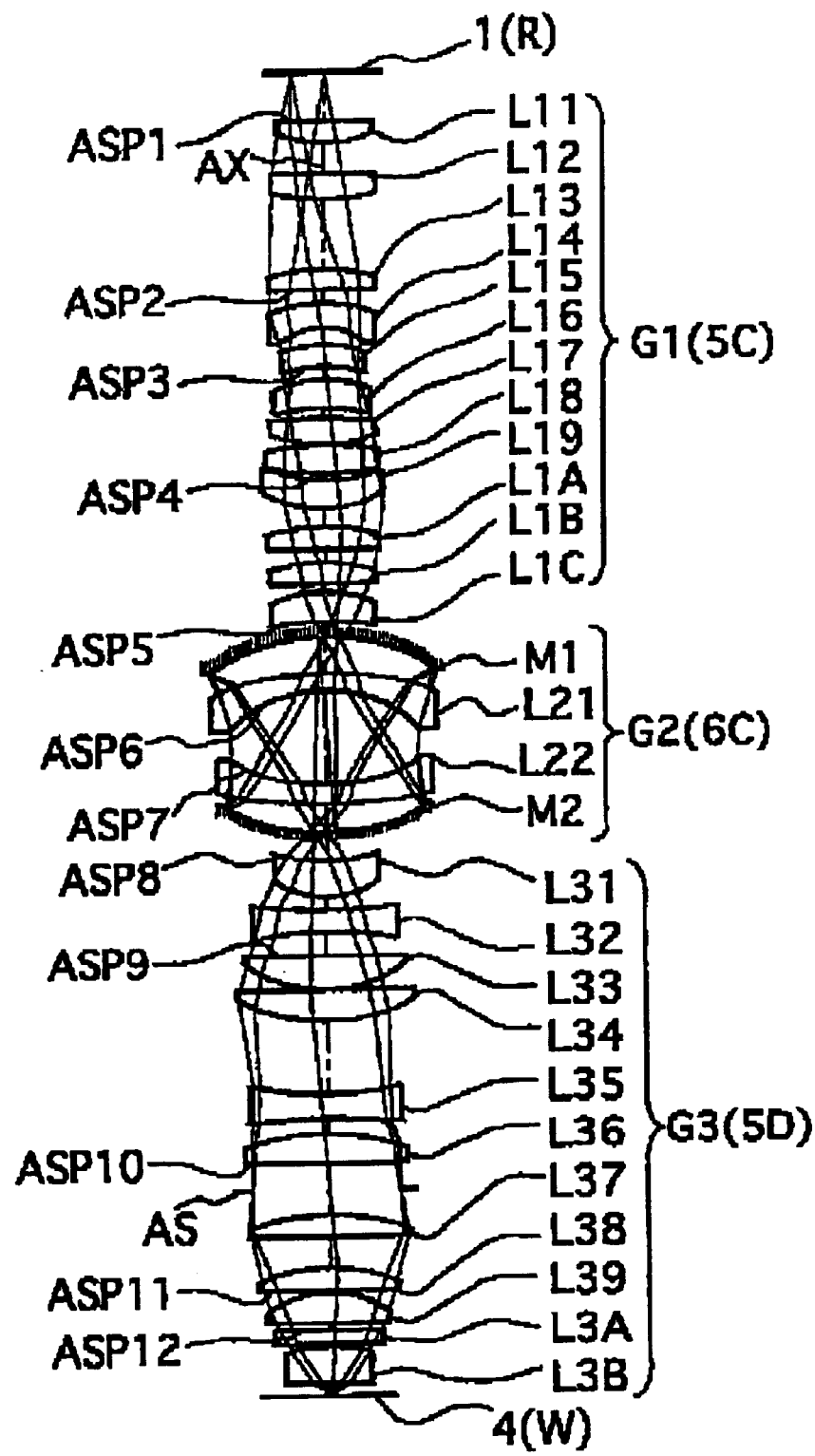
FIG. 10 is a block view of the lenses that form the projection optical system according to the fourth embodiment of the present invention.
Figure 11:
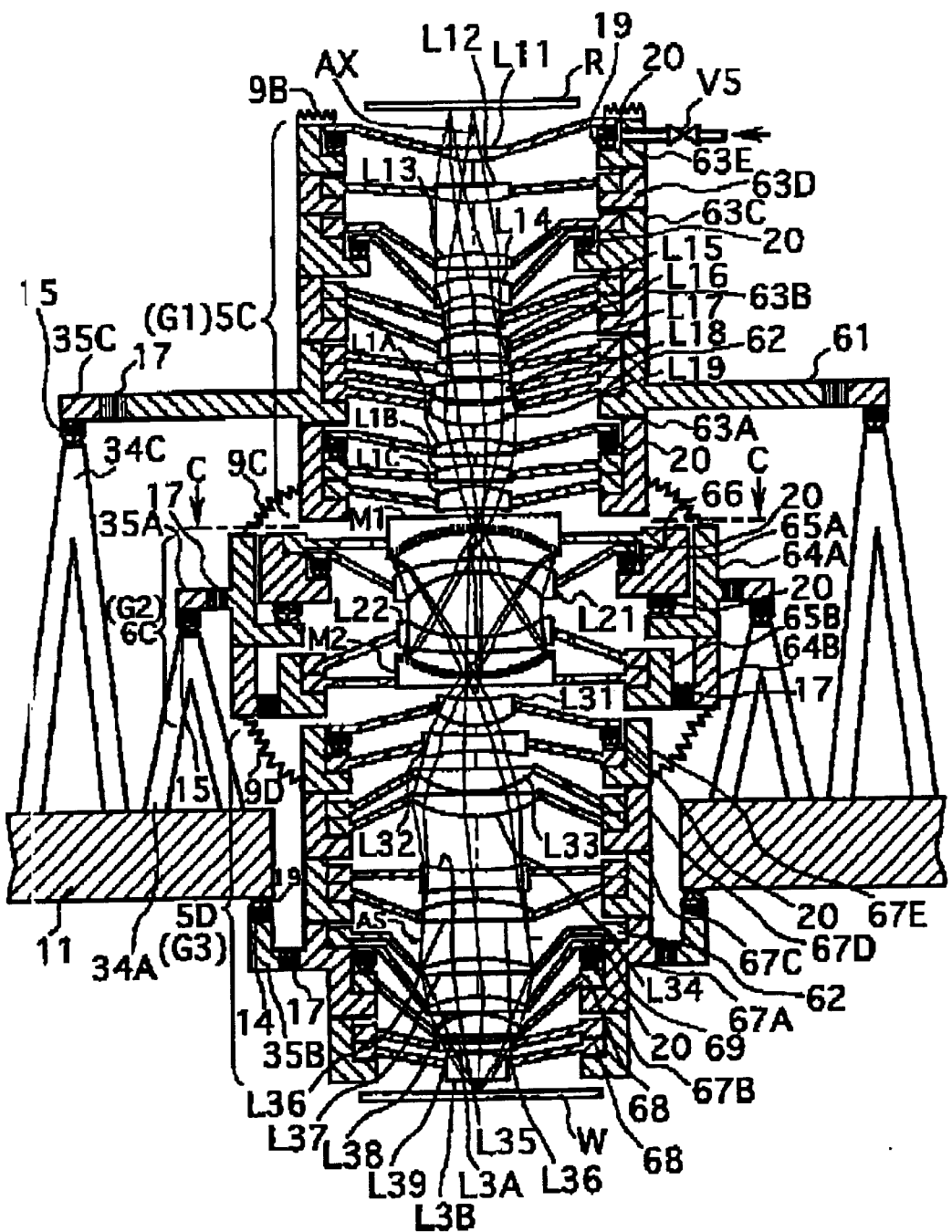
FIG. 11 is a cross-sectional view showing the structure of the lens barrel of the projection optical system according to the fourth embodiment of the present invention.
Figure 12:
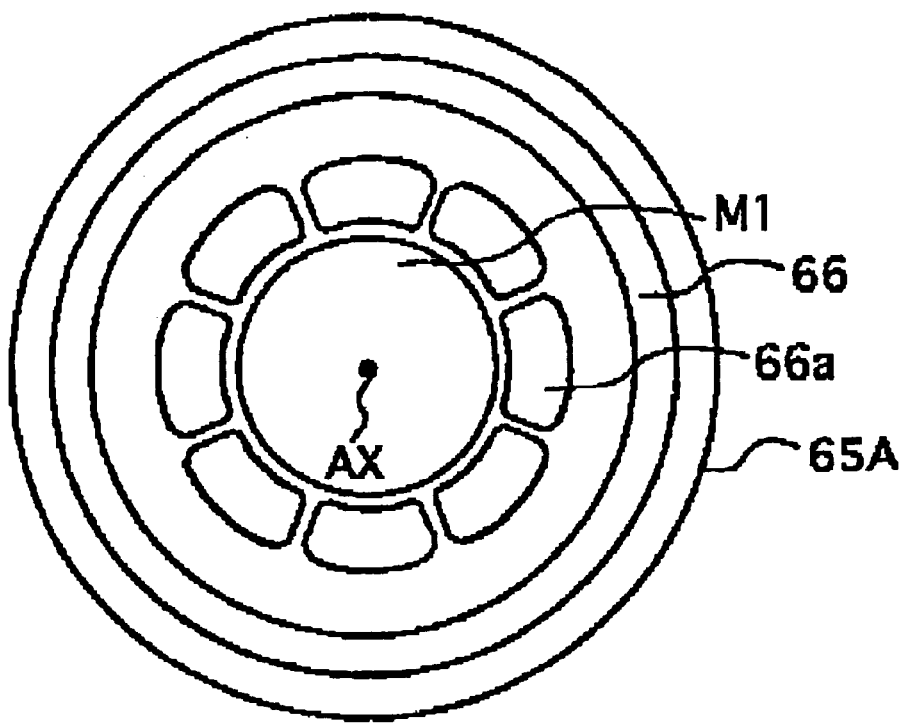
FIG. 12 is a top view along line C—C of FIG. 1.

The fourth embodiment of the projection optical system in accordance with the present invention is described using FIGS. 10 to 12. In the fourth embodiment, the $F_2$ laser (157 nm wavelength) is used as the exposure light, and the present invention is applied to the catadioptric type projection optical system using two reflecting mirrors at the center of which holes are provided. For the parts in FIGS. 10 to 12 corresponding to the parts in FIGS. 2 through 9, the same or similar symbols are used and detailed descriptions are omitted.

FIG. 10 is a block diagram of the lens of the catadioptric type projection optical system in this embodiment. In FIG. 10, the projection optical system of this embodiment comprises dioptric type first imaging optical system G1, which forms the first intermediate image of reticle R pattern on the object plane (first plane), catadioptric type second imaging optical system G2, which forms the second intermediate image based oh the light provided from the first intermediate image, and dioptric type third imaging optical system G3, which forms the final image of the reticle pattern on the wafer W surface on the image plane 4 (the second plane) based on the light provided from the second intermediate image. Imaging optical systems G1 to G3 are held by first, second, and third barrels 5C, 6C, and 5D, respectively.

The projection optical system of this embodiment is also upright cylindrical lens-barrel type, however, the oscillation is easy to be traveled because the length of lens-barrel is very long (approximately 145 mm in the block diagram shown in FIG. 10). To reduce the affect of oscillation, three barrels 5C, 6C, and 5D are individually provided to the supporting plate of the projection exposure apparatus (FIG. 11). Whereas, if barrel 5C is mounted on barrel 6C, it is Undesirable because when barrel 6C oscillates, the oscillation generated at barrel 6C is transferred to barrel 5C. This configuration is not available.

First, the first imaging optical system G1 comprises, in order from the reticle side, a meniscus-shaped lens L11 whose aspheric concave surface ASP1 faces the reticle side, a meniscus-shaped lens L12 whose concave surface faces the reticle side, a meniscus-shaped lens L13 whose aspheric concave surface ASP2 faces the wafer side, a meniscus shaped lens L14 whose convex surface faces the reticle side, a meniscus shaped lens L15 whose aspheric concave surface ASP3 faces the wafer side, a meniscus shaped lens L16 whose convex surface faces the reticle side, two biconvex lenses L17 and L18, a meniscus shaped lens L19 whose aspheric concave surface ASP4 faces the reticle side, two meniscus shaped lenses L1A and L1B whose convex surfaces face the reticle sides and a biconvex lens L1C whose aspheric convex surface ASP5 faces the wafer side.

Next, the second imaging optical system G2 comprises, in order from the reticle side along the optical axis, a first reflecting mirror M1 whose concave surface faces the wafer side, meniscus shaped lens L21 whose aspheric concave surface ASP6 faces the wafer side, meniscus shaped lens L22 whose aspheric concave surface ASP7 faces the reticle side, and a second reflecting mirror M2 whose concave surface faces the reticle side. In this embodiment, the first and second intermediate images are formed on an area near the optical axis AX of reflecting mirrors M1 and M2. Thus, through holes (not shown in the Figure) are formed on an area near the optical axis AX of reflecting mirrors M1 and M2 to pass the exposure light (illumination light). At this time, the obscuration ratio of the whole image forming light beam to the through holes (shielding section) is 19.5% (NA ratio), and the image forming performance is less affected.

On the other hand, the third imaging optical system G3 comprises, in order from the reticle side, meniscus shaped lens L31 whose aspheric concave surface ASP8 faces the reticle side, a biconcave lens L32, meniscus shaped lens L33 whose aspheric concave surface ASP9 faces the reticle side, meniscus shaped lens L34 whose concave surface faces the reticle side, a biconcave lens L35, meniscus shaped lens L36 whose aspheric concave surface ASP10 faces the wafer side, meniscus shaped lens L37 whose convex surface faces the reticle side, meniscus shaped lens L38 whose aspheric concave surface ASP11 faces the wafer side, meniscus shaped lens L39 whose convex surface faces the reticle side, a biconcave lens L3A whose aspheric concave surface ASP12 faces the reticle side, and meniscus shaped lens L3B whose convex surface faces the reticle side, and an aperture stop AS is disposed between lenses L36 and L37.

Further, all components of the optics in the projection optical system of this embodiment are arranged on single linear the optical axis AX. The object plane 1 is placed almost in parallel to the image plane 4. The diameters of reflecting mirrors M1 and M2 are 260 mm or less. The clear apertures of largest lenses L21 and L22 in other lenses are 246 mm or less. As the clear apertures of other lenses are 183 mm or less, the projection optical system of this embodiment is designed compactly.

The fluorite ($CaF_2$ crystal) is used for all refractive optical materials (lens elements) that constitute the projection optical system shown in FIG. 8. The refractive index of the fluorite for the ventral wavelength (157.6 nm) of the $F_2$ laser is 1.5600000.

In addition, the shape of the aspherical surface used for the projection optical system of this embodiment can be described by the expression (1). However, the values of aspherical surface coefficient E and F in the expression (1) are all zero. Each item value of the projection optical system according to this embodiment shown in Tables 4 and 5 which has similar style of the Table 1.

TABLE 4

(Principal Data)
$\lambda$ = 157.6 nm (Virtual Plane)
$|\beta|$ = 0.2500
NA = 0.75
Distance From Reticle to First Surface = 50.912830 mm

| Surface Number | r | d | Optical Material |
|---|---|---|---|
| 1(ASP1) | −3000.00000 | 20.777380 | $CaF_2$ |
| 2 | −187.15560 | 92.403460 | |
| 3 | −558.99669 | 25.971725 | $CaF_2$ |

TABLE 4-continued (Principal Data)
$\lambda$ = 157.6 nm (Virtual Plane)
$|\beta|$ = 0.2500
NA = 0.75
Distance From Reticle to First Surface = 50.912830 mm

| Surface Number | r | d | Optical Material |
|---|---|---|---|
| 4 | −210.93675 | 15.861605 | |
| 5 | 263.61227 | 25.971725 | CaF$_2$ |
| 6(ASP2) | 1257.90730 | 13.379506 | |
| 7 | 150.00000 | 29.526565 | CaF$_2$ |
| 8 | 94.28503 | 30.499818 | |
| 9 | 420.59234 | 20.800000 | CaF$_2$ |
| 10(ASP3) | 141.55197 | 13.169057 | |
| 11 | 522.48173 | 20.722934 | CaF$_2$ |
| 12 | 155.53167 | 6.108278 | |
| 13 | 1055.46476 | 17.359120 | CaF$_2$ |
| 14 | −130.14083 | 22.492621 | |
| 15 | 671.87155 | 21.568896 | CaF$_2$ |
| 16 | −160.00000 | 37.130352 | |
| 17(ASP4) | −225.56184 | 20.677950 | CaF$_2$ |
| 18 | −101.07298 | 14.929386 | |
| 19 | 156.60829 | 20.000000 | CaF$_2$ |
| 20 | 241.09685 | 3.949536 | |
| 21 | 191.75976 | 20.777380 | CaF$_2$ |
| 22 | 480.17990 | 3.469721 | |
| 23 | 127.28576 | 33.411885 | CaF$_2$ |
| 24(ASP5) | −1587.54253 | 29.129562 | |
| 25 | 238.26996 | 35.886388 | Virtual Plane(M1) |
| 26 | 376.45128 | 25.609160 | CaF$_2$ |
| 27(ASP6) | 150.58157 | 97.992889 | |
| 28(ASP7) | −194.22167 | 25.609160 | CaF$_2$ |
| 29 | −1120.36909 | 31.786896 | |
| 30 | −246.29797 | −31.786896 | (M2) |
| 31 | −1120.36909 | −25.609160 | CaF$_2$ |
| 32(ASP7) | −194.22167 | −97.992889 | |
| 33(ASP6) | 150.58157 | −25.609160 | CaF$_2$ |
| 34 | 376.45128 | −35.886388 | |
| 35 | 238.26996 | 35.886388 | (M1) |
| 36 | 376.45128 | 25.609160 | CaF$_2$ |
| 37(ASP6) | 150.58157 | 97.992889 | |
| 38(ASP7) | −194.22167 | 25.609160 | CaF$_2$ |
| 39 | −1120.36909 | 31.786896 | |
| 40 | −246.29797 | 31.010448 | Virtual Plane(M2) |
| 41(ASP8) | −3000.00000 | 43.702739 | CaF$_2$ |
| 42 | −126.02993 | 5.832116 | |
| 43 | −506.82326 | 18.699642 | CaF$_2$ |
| 44 | 619.13207 | 26.763769 | |
| 45(ASP9) | −1377.00220 | 44.048046 | CaF$_2$ |
| 46 | −126.12121 | 5.581666 | |
| 47 | −3000.00000 | 31.166070 | CaF$_2$ |
| 48 | −211.50805 | 101.102525 | |
| 49 | −404.56272 | 18.699642 | CaF$_2$ |
| 50 | 3000.00000 | 18.000000 | |
| 51 | 321.09183 | 25.000000 | CaF$_2$ |
| 52(ASP10) | 3000.00000 | 31.200000 | |
| 53 | ∞ | 32.963838 | AS |
| 54 | 179.49045 | 30.535668 | CaF$_2$ |
| 55 | 3000.00000 | 42.026705 | |
| 56 | 228.90738 | 20.198128 | CaF$_2$ |
| 57(ASP11) | 3000.00000 | 1.123733 | |
| 58 | 100.73952 | 33.183232 | CaF$_2$ |
| 59 | 1100.00000 | 6.964116 | |
| 60(ASP12) | −2754.43020 | 15.000000 | CaF$_2$ |
| 61 | 493.21390 | 6.009195 | |
| 62 | 164.38322 | 40.068312 | CaF$_2$ |
| 63 | 2793.72651 | 13.234625 | |

TABLE 5

(Aspheric Data)

| ASP1 | ASP2 | ASP3 |
|---|---|---|
| $\kappa$ = 0.000000 | $\kappa$ = 0.000000 | $\kappa$ = 0.000000 |
| A = −0.414199 × 10$^{-7}$ | A = −0.355346 × 10$^{-7}$ | A = −0.137576 × 10$^{-6}$ |
| B = 0.101382 × 10$^{-11}$ | B = 0.293775 × 10$^{-11}$ | B = −0.430519 × 10$^{-10}$ |
| C = −0.507220 × 10$^{-17}$ | C = 0.514678 × 10$^{-17}$ | C = 0.994337 × 10$^{-14}$ |
| D = 0.410909 × 10$^{-20}$ | D = 0.170581 × 10$^{-19}$ | D = −0.468002 × 10$^{-17}$ |

| ASP4 | ASP5 | ASP6 |
|---|---|---|
| $\kappa$ = 0.000000 | $\kappa$ = 0.000000 | $\kappa$ = 0.000000 |
| A = −0.144554 × 10$^{-6}$ | A = 0.223492 × 10$^{-6}$ | A = −0.161976 × 10$^{-7}$ |
| B = 0.106034 × 10$^{-10}$ | B = 0.883833 × 10$^{-11}$ | B = −0.584652 × 10$^{-12}$ |
| C = −0.946352 × 10$^{-15}$ | C = −0.194220 × 10$^{-14}$ | C = −0.193271 × 10$^{-16}$ |
| D = 0.959437 × 10$^{-20}$ | D = 0.106429 × 10$^{-17}$ | D = −0.650552 × 10$^{-21}$ |

| ASP7 | ASP8 | ASP9 |
|---|---|---|
| $\kappa$ = 0.000000 | $\kappa$ = 0.000000 | $\kappa$ = 0.000000 |
| A = 0.132322 × 10$^{-7}$ | A = −0.241471 × 10$^{-6}$ | A = −0.502983 × 10$^{-7}$ |
| B = 0.613254 × 10$^{-12}$ | B = −0.189700 × 10$^{-10}$ | B = 0.363010 × 10$^{-11}$ |
| C = 0.256289 × 10$^{-16}$ | C = 0.150133 × 10$^{-14}$ | C = −0.133698 × 10$^{-16}$ |
| D = 0.413237 × 10$^{-21}$ | D = −0.600549 × 10$^{-18}$ | D = −0.278297 × 10$^{-20}$ |

| ASP10 | ASP11 | ASP12 |
|---|---|---|
| $\kappa$ = 0.000000 | $\kappa$ = 0.000000 | $\kappa$ = 0.000000 |
| A = 0.262291 × 10$^{-7}$ | A = 0.118587 × 10$^{-7}$ | A = −0.182017 × 10$^{-7}$ |
| B = 0.174496 × 10$^{-11}$ | B = −0.220599 × 10$^{-11}$ | B = −0.884609 × 10$^{-11}$ |
| C = 0.726166 × 10$^{-16}$ | C = 0.904169 × 10$^{-16}$ | C = 0.715263 × 10$^{-15}$ |
| D = −0.125632 × 10$^{-20}$ | D = −0.814939 × 10$^{-20}$ | D = −0.161609 × 10$^{-19}$ |

In the catadioptric type projection optical system of this embodiment, the chromatic aberrations can be compensated at 1 pm wavelength width for the central wavelength of the F$_2$ laser, and the spherical aberrations, coma aberrations, astigmatism, and distortion aberrations can be compensated successfully. Thus, the catadioptric type projection optical system of this embodiment can provide high image forming performance.

Next, the construction of the lens-barrels when the projection optical system shown in FIG. 10 is applied to the projection exposure apparatus is described below.

FIG. 11 is a cross-sectional drawing of the main section when the projection optical system shown in FIG. 10 is mounted on the projection exposure apparatus. In FIG. 11, the first imaging optical system G1 which comprises lenses L11 to L1C, is held by a first barrel 5C (a lens-barrel unit) that is the aggregate of the multiple divided lens-barrels (holding blocks); the second imaging optical system G2, which comprises reflecting mirrors M1 and M2 and lenses L21 and L22, is held by a second barrel 6C that is the aggregate of the multiple divided lens-barrels; and the third imaging optical system G2, which comprises lenses L31 to L3B, is held by a third barrel 5D that is the aggregate of the multiple divided lens-barrels. First and second barrels 5C and 6C are individually attached on the top surface of a supporting plate 11 of the projection exposure apparatus, and they are easy to disconnect, and a third barrel 5D is suspended at the bottom surface around an aperture of the supporting plate 11, and that is easy to disconnect.

First, the third barrel 5D is comprised, in order from the reticle side by connecting an active divided lens-barrel 67E, divided lens-barrels 67D and 67C, an active divided lens-barrel 67A, and a divided lens-barrel 67B, each of which is fasten by using three bolts or more (not shown in the Figure)

along the optical axis direction. Also, an active divided lens-barrel 67A at the central section is supported by a ring-type supporting member 35B through a decentering drive element 17, and the supporting member 35B is connected as if it is suspended at the bottom surface of a supporting plate 11 through three vertical drive elements 14 and couplings 19.

Also, in the divided lens-barrel 67B at the bottom, two lenses L3A and L3B are fixed through lens mounts 68. If the active divided lens-barrel 67A over the divided lens-barrel 67B, lens L39 is fixed, and the lens L38 is capable of displacement having three degrees of freedom through three couplings, vertical drive elements 20, and lens mounts 69. In two divided lens-barrels 67C and 67D over the active divided lens-barrel 67A, two pairs of lenses L35 and L36, and L33 and L34 are fixed, respectively. In the active divided lens-barrel 67E at the top, the lens L32 is fixed, and the lens L31 is capable of displacement having three degrees of freedom through three couplings and vertical drive elements 20.

Next, the second barrel 6C is comprised by connecting an active divided lens-barrels 64A and 64B by using three bolts or more (not shown in the Figure) along the optical axis direction, in order from the reticle side. In addition, an active divided lens-barrel 64A over an active divided lens-barrel 64B is supported by a ring-type supporting member 35A through decentering drive elements 17, and the supporting member 35A is connected to the upper edge of three inverted V-shaped type supporting members 34A on the top surface of the supporting plate 11 through three vertical drive elements 15 and couplings.

In this case, an active divided lens-barrel 65A is supported by the active divided lens-barrel 64A such that it is capable of displacement having three degrees of freedom through couplings and vertical drive elements 20. In the active divided lens-barrel 65A, lens L21 capable of displacement having three degrees of freedom through couplings, vertical drive (elements 20, and lens mounts, and the reflecting mirror M1 is fixed through lens mounts 66. In addition, the active divided lens-barrel 64B holds the divided lens-barrel 65B through decentering drive elements 17. In the divided lens-barrel 65B, lens L22 and the reflecting mirror M2 are fixed through the lens mounts. As the result, two reflecting mirrors M1 and M2 can be relatively moved in two directions which are orthogonal to the surface that is vertical to the optical axis AX, and they can be relatively displaced to the optical axis direction and tilt angle direction around two axes.

Next, the first barrel 5C is comprised by connecting an active divided lens-barrel 63E, a divided lens-barrel 63D, an active divided lens-barrel 63C, two divided lens-barrels 63B and 61, and an active divided lens-barrel 63A using three bolts or more (not shown in the Figure) along the optical axis, in order from the reticle side. In addition, a flange section of a divided lens-barrel 61 in the center section is supported by a ring-type supporting member 35C through decentering drive elements 17, and the supporting member 35C is connected to the upper edge of three inverted V-shaped type supporting members 34C on the top surface of the supporting plate 11 through three vertical drive elements 15 and couplings. In this case, supporting members 34C are fixed to the outside of supporting members 34A for the second barrel 6C on the supporting plate 11.

In the active divided lens-barrel 63A at the bottom, two lenses L1B and L1C are fixed through the lens mounts, and the lens L1A is capable of displacement having three degrees of freedom through vertical drive elements 20. In the divided lens-barrel 61 over the active divided lens-barrel 63A, three lenses L17 to L19 are fixed through the lens mounts. In the divided lens-barrel 63B over the divided lens-barrel 61, two lenses L15 and L16 are fixed through the lens mounts. In the active divided lens-barrel 63C, the lens L14 is held capable of displacement having three degrees of freedom through three couplings, vertical drive elements 20, and the lens mounts, and the lens L13 is fixed. In the divided lens-barrel 63D over the active divided lens-barrel 63C, the lens L12 is fixed. In the active divided lens-barrel 63E at the top, the lens L11 is capable of displacement having three degrees of freedom through three couplings 19, vertical drive elements 20, and the lens mounts.

Thus, three barrels 5C, 6C, and 5D are held capable of displacement having five degrees of freedom to the supporting plate 11, respectively, and five lenses other than the second barrel 6C are held capable of displacement having three degrees of freedom. Operations of all vertical drive elements 14, 15, and 20 and decentering drive elements 17 shown in FIG. 11 are controlled by the image forming characteristics control system that is similar to image forming characteristics control system 27 shown in FIG. 3. As the result, in this embodiment, the positions of two reflecting mirrors M1 and M2 can be designed easily while assembling and adjusting the projection optical system, and residual aberrations after assembling barrels 5C, 6C, and 5D can be reduced. In addition, the image forming characteristics can be compensated during exposure process if necessary.

The argon gas (Ar) is supplied as the purge gas in the projection optical system of this embodiment. The purge gas, which is supplied front the active divided lens-barrel 63E at the top into the first barrel 5C through a gas supply pipe with a valve V5, flows into the second barrel 60 through the aperture (not shown in the Figure) of the lens mounts that support each lens or each reflecting mirror.

FIG. 12 is a plane view indicating second barrel 6C of the projection optical system shown in FIG. 11 along to C—C line. As shown in FIG. 12, several apertures 66a are formed with equiangular interval at lens mounts 66 that hold reflecting mirror M1.

In FIG. 11 again, several apertures are formed at the lens mounts that hold other lenses (except for the lens L11 at the top) and the reflecting mirror M2. As the result, the purge gas flowing into the second barrel 6C flows into the gastight chamber (wafer stage chamber) in which the wafer W is stored, through the third barrel 5D. Thus, the purge gas can flow in the projection optical system without generating residual gas by using lens mounts 66 that have several apertures. In addition, the reflecting mirror holding materials can be lightened by using lens mounts 66.

In addition, elastic bellows-shaped covering members 9C and 9D, for example, are mounted between the barrel 5C and the barrel 6C, and between the barrel 6C and the barrel 5D to increase the gas-tightness between barrels 5C, 6C, and 5D, then the high-purity purge gas in the projection optical system can be kept contained.

In FIG. 11, barrels 5C, 6C, and 5D should be held at the position where the no image shift will be generated at each barrel inclination. To achieve this, when the magnification of the image that is formed by k-th (k=1, 2, . . . ) barrel is $-\beta k$ ($-\beta k>0$), as well as the second embodiment, the barrel should be held at the plane position which passes a point internally divided by $1:\beta$ along the optical axis AX between the k-th surface and the (k+1) surface and which is vertical to the optical axis AX, or near. This description is not changed essentially even if the number of formed intermediate images is increased.

In this embodiment, as an example, the intermediate images are formed, from the reticle R pattern surface, at the wafer side of 626 mm and 830 mm. The magnifications of image forming for the first imaging optical system G1 (the first barrel 5C), the second imaging optical system G2 (the second barrel 6C), and the third imaging optical system G3 (the third barrel 5D) are −0.35, −0.99, and −0.72, respectively. The magnification of entire projection optical system is −0.25. Thus, the first barrel 5C, the second barrel 6C, and the third barrel 5D should be placed at the position 464 mm, 729 mm, and 1,190 mm apart from the reticle R pattern surface, respectively. In addition, the center of the supporting plate 11 which supports entire projection optical system should be placed at the position where the object point and the image point are internally divided in a ratio 1:0.25 (that is, the position 1,160 mm apart from the reticle R pattern).

Aspheric processing is done for twelve surfaces of the projection optical system of this embodiment. Thus, three barrels 5C, 6C, and 5D are divided into thirteen blocks more than twelve.

However, in each embodiment described above, when several aspherical surfaces are included in each block (for example, in active divided lens-barrels 22A to 22E shown in FIG. 3), it is difficult to compensate the higher-order decentered aberrations due to the aspherical surface generated at the block if each aspherical surface is largely decentering. Thus, the aspherical surface included in one block should be one or less. All embodiments described above satisfy this condition.

[Fifth Embodiment]

Figure 13:
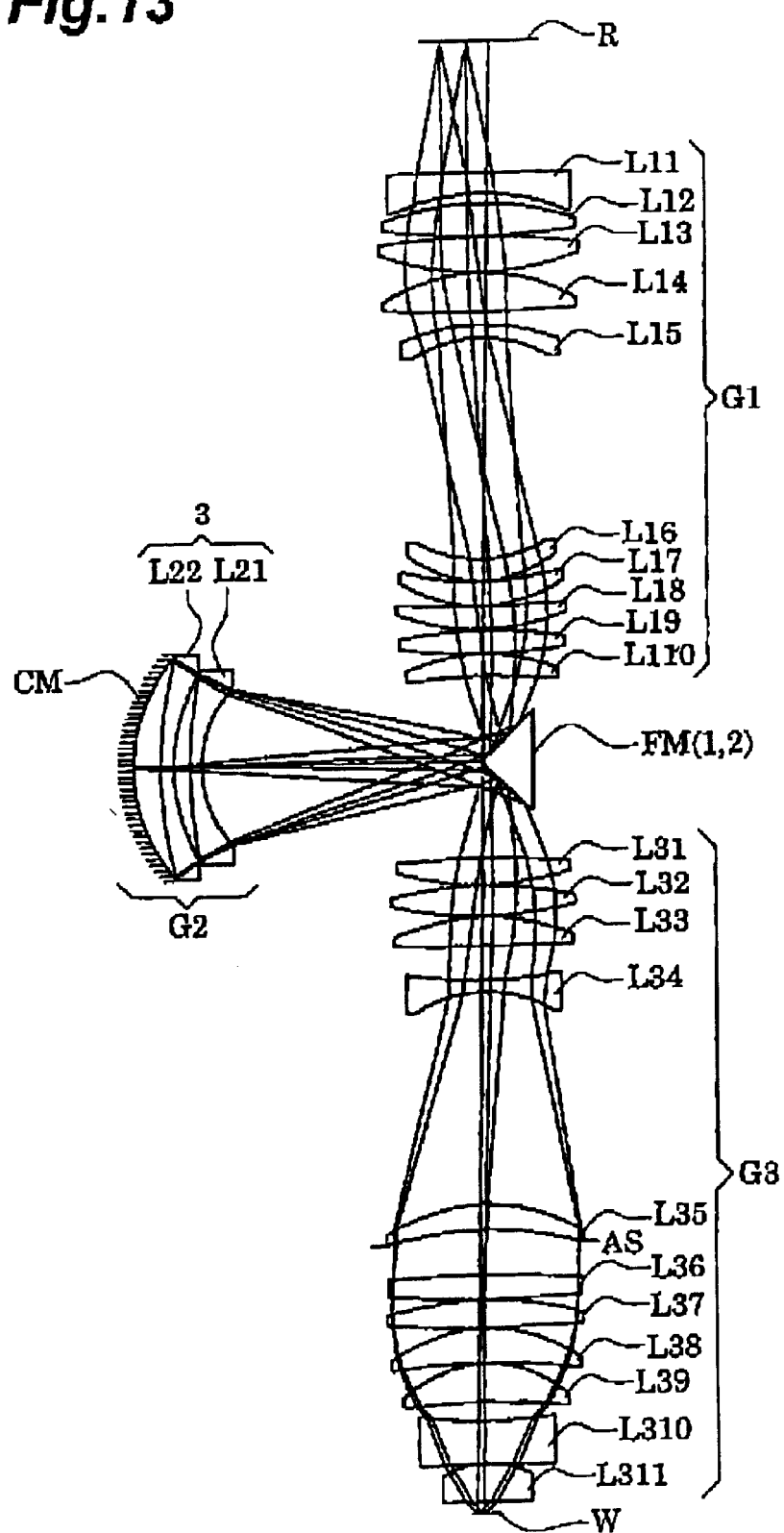
FIG. 13 is a block diagram of the lenses that for the projection optical system according to the fifth embodiment of the present invention.
Figure 14:
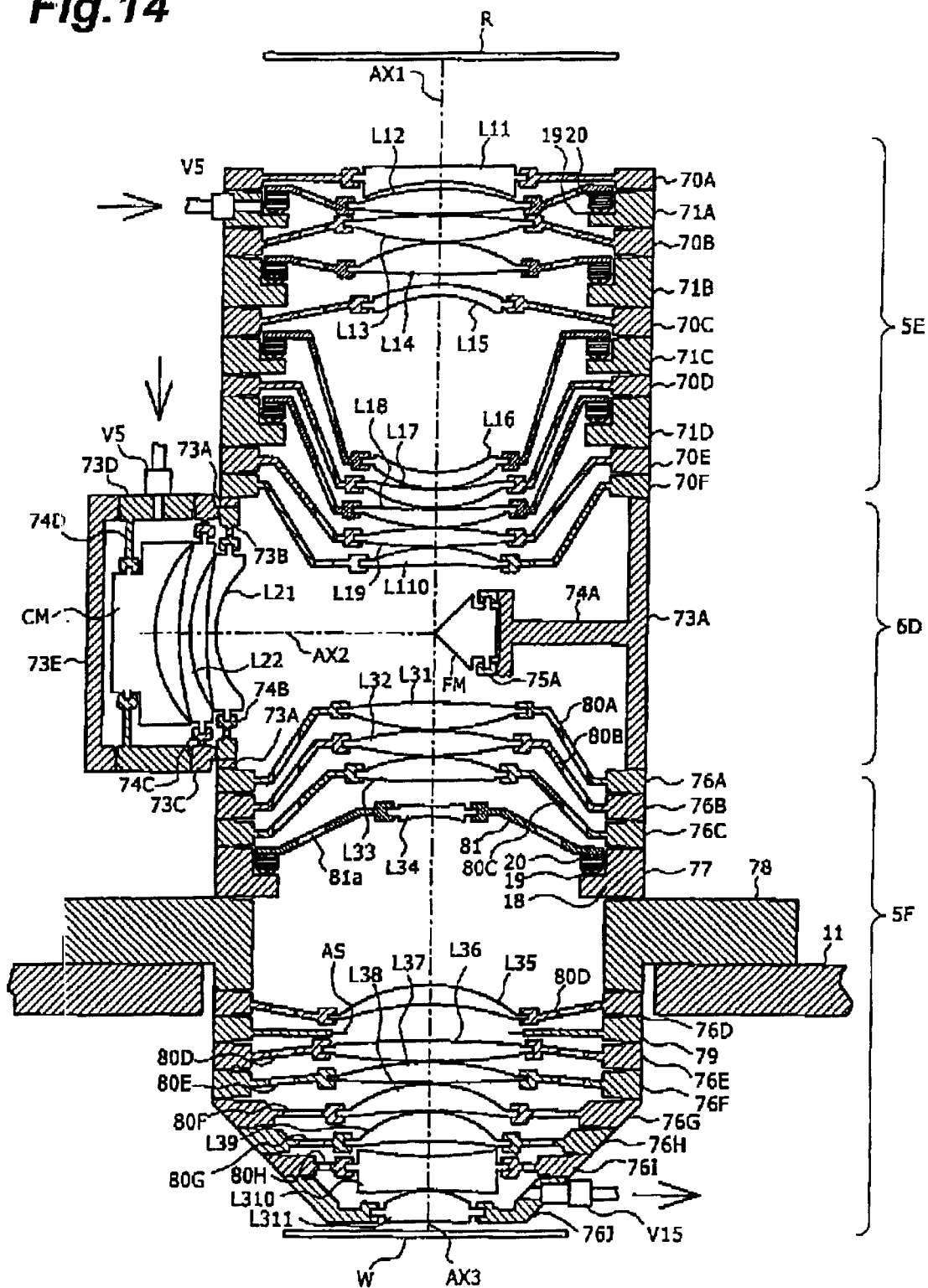
FIG. 14 is a cross-sectional view showing the structure of the lens barrel of the projection optical system according to the fifth embodiment of the present invention.
Figure 15:
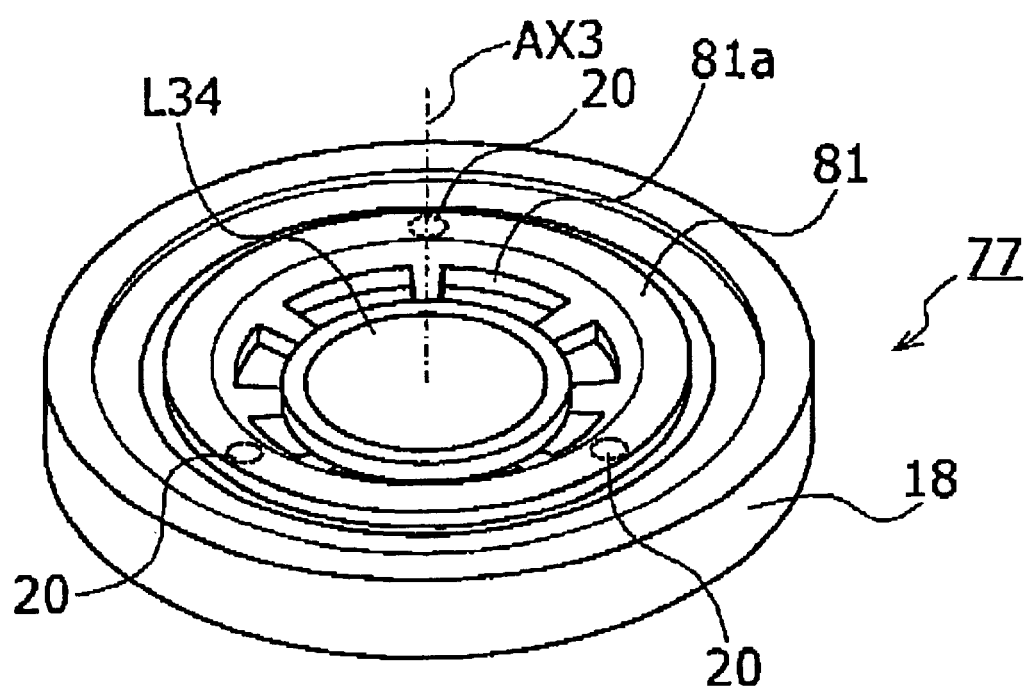
FIG. 15 is a perspective view of the divided lens-barrel shown in FIG. 14.

Next, the projection optical system according to the fifth embodiment of the present invention is described while referencing FIGS. 13 to 15. This embodiment uses a $F_2$ (fluorine dimer) laser (157 nm wavelength) and applies the present invention to a catadioptric projection optical system having two optical path folding mirrors. In FIGS. 13 to 15, parts corresponding to FIGS. 2 to 12 are given the same or similar reference numerals and their detailed explanation is omitted.

FIG. 13 is a lens block diagram of the catadioptric projection optical system of this embodiment, and In FIG. 13, the projection optical system of this embodiment comprises a dioptric type first imaging optical system G1 for forming a first intermediate image of a pattern of the reticle R on object plane 1 (first plane), a catadioptric type second imaging optical system G2 for forming a second intermediate image using the light from the first intermediate image; and a dioptric type third imaging optical system G3 for forming a final image of the reticle pattern onto the surface of the wafer W, which is in image plane 4 (second plane), based on the light from the second intermediate image.

A first optical path folding mirror 1 is disposed near the formation point of the first intermediate image that is formed by the first imaging optical system G1. The first optical path folding mirror 1 deflects the light beam heading to the first intermediate image or the light beam from the first intermediate image towards the second imaging optical system G2. The second imaging optical system G2 has a concave reflective mirror CM and at least one negative lens, and forms the second intermediate image (the secondary image of the pattern that is the first intermediate image) that has approximately the same magnification as the first intermediate image based on the light beam from the first intermediate image.

A second optical path folding mirror 2 is disposed near the formation point of the second intermediate image that is formed by the second imaging optical system G2. The second optical path folding mirror 2 deflects the light beam heading to the second intermediate image or the light beam from the second intermediate image towards the third imaging optical system G3. The reflective surface of the first optical path folding mirror 1 and the reflective surface of the second optical path folding mirror 2 are positioned so that they do not spatially overlap. The third imaging optical system G3 forms a reduced image (the final image of the catadioptric projection optical system that is the second intermediate image) of the pattern of the reticle R onto the wafer W as the photosensitive substrate that is disposed in the second plane parallel to the first plane based on the light beamlight beam from the second intermediate image.

These imaging optical systems G1, G2, and G3 are supported by a first barrel 5E, a second barrel 6D, and a third barrel 5F, respectively. The projection optical system of the present invention is an off-axial type that has two optical axes; however, unlike the embodiments described earlier, the three barrels 5E, 6D, and 5F have an integrated configuration. The phrase 'integrated configuration' used here highlights the fact that the projection optical systems are built up they are fastened to each other, and as they are being built up the respective positioning and intervals of the three barrels 5E, 6D, and 5F can be adjusted relative to each other.

In this embodiment, the chromatic aberration or positive Petzval sum that occurs in the first and third imaging optical system G1, and G3 which are dioptric optical systems including a plurality of lenses, is compensated by the concave reflective mirror CM of the second imaging optical system G2. In addition, by the second imaging optical system G2 being structured having approximately the unit magnification, it becomes possible for the second intermediate image to be formed near the first intermediate image. In this embodiment, by performing optical path separation in the vicinity of these two intermediate images, it is possible to set the amount of separation from the optical axis of the exposure region (specifically the effective exposure region), or the amount it is off-axis, to be small. This is not only advantageous from the standpoint of chromatic aberration compensation, but it is also advantageous in regards to factors such as optical system downsizing, optical system adjustment, mechanical design) and production cost.

The second imaging optical system G2 exclusively handles the compensation of the chromatic aberration and positive Petzval sum that occurs in the first imaging optical system G1 and the third imaging optical system G3. It is necessary to set the concave reflective mirror CM and the negative lens 3, which compose the second imaging optical system G2, to be high power accordingly. If the symmetry of the second imaging optical system G2 is unbalanced, there is increased development of asymmetrical chromatic aberrations such as chromatic difference of magnification or chromatic coma, and it becomes impossible to obtain sufficient resolution. With the present embodiment, however, by setting the image magnification of second imaging optical system G2 to be approximately the unit magnification and by adopting a structure in which concave reflective mirror CM can be disposed near the location of the respective pupil, favorable symmetry is maintained and the prevention of the above-mentioned asymmetrical chromatic aberrations is achieved.

Furthermore, in this embodiment, the line of intersection of the virtual extended plane of the reflecting surface of the first optical path folding mirror 1 (the virtual plane obtained by indefinitely extending the planar reflecting surface) and the virtual extended plane of the reflecting surface of the second optical path folding mirror 2 are set so that they intersect an optical axis AX1 of the first imaging optical system G1 an optical axis AX2 of the second imaging optical system G2, and an optical axis AX3 of the third imaging optical system G3 at one point (the reference point). With this structure, since it becomes possible for the optical axis AX1 of the first imaging optical system G1 and the optical axis AX3 of the third imaging optical system G3 to be set so that they share a common axis, and in particular since it becomes possible for the three optical axes AX1 to AX3 and the two reflecting surfaces to be positioned relative to one point, the optical system is more stable, and optical adjustment as well as mechanical design is simplified. Furthermore, by setting the optical axis AX2 of the second imaging optical system G2 so that it intersects the optical axis AX1 of the first imaging optical system G1 and the optical axis AX3 of the third imaging optical system G3, high precision optical adjustment can be simplified and an even higher level of optical system stability can be achieved.

Next, the structure of each imaging optical system G1, G2, and G3 is described. The first imaging optical system G1 comprises, in order from the reticle side, a negative meniscus lens L11, a biconvex lens L12 with the aspheric-shaped concave surface thereof facing the wafer side; a biconvex lens L13; a biconvex lens L14; a negative meniscus lens L15 with a concave surface thereof facing the reticle side; a positive meniscus lens L16 with the aspheric-shaped concave surface thereof facing the reticle side; a positive meniscus lens L17 with a concave surface thereof facing the reticle side; a positive meniscus lens L1B with a concave surface thereof facing the reticle side; a biconvex lens L19; and a positive meniscus lens L110 with a convex surface thereof facing the reticle side.

The second imaging optical system G2 comprises, in order from the reticle side along the outbound optical path of light propagation (in other words, the incident side), a negative meniscus lens L21 with a concave surface thereof facing the reticle side; a negative meniscus lens L22 with the aspheric-shaped concave surface thereof facing the reticle side; and the concave reflective mirror CM.

The third imaging optical system G3 comprises, in order from the reticle side along the direction of light progression, a biconvex lens L31 with the aspheric convex surface thereof facing the reticle side; a biconvex lens L32; a biconvex lens L33; a biconcave lens L34; a positive meniscus lens L35 with a convex surface thereof facing the reticle side; an aperture stop AS; a biconvex lens L36 with the aspheric-shaped convex surface thereof facing the wafer side; a biconvex lens L37; a positive meniscus lens L38 with a convex side thereof facing the reticle side; a positive meniscus lens L39 with a convex side thereof facing the reticle side; a biconcave lens L310; and a planoconvex lens L311 with a planar surface thereof facing the water side.

All of the refractive optical members (lens elements) which constitute the projection optical system in FIG. 13 use fluorite (CaF$_2$ crystal). The refractive index of fluorite for the central wavelength 157.6 nm of the F$_2$ Laser light as exposure light is 1.559238.

Moreover, the shape of the aspherical surfaces in the projection optical system of this embodiment are also shown using expression (1). However, in this embodiment, the values of aspheric coefficients E and F are all zero within expression (1). Table 6 and Table 7 below give the values of the elements of projection optical system of this embodiment corresponding to Table 1.

TABLE 6

(Primary Data)
λ = 157.624 nm
β = −0.25
NA = 0.75
Distance from Reticle Plane to First Surface = 129.131192 mm

| Surface Number | r | d | Optical Material |
|---|---|---|---|
| 1 | 8233.14221 | 20.000000 | CaF$_2$ (lens L11) |
| 2(ASP1) | 229.43210 | 8.970677 | |
| 3 | 286.74048 | 31.000034 | CaF$_2$ (lens L12) |
| 4 | −803.12188 | 1.000000 | |
| 5 | 666.75874 | 33.633015 | CaF$_2$ (lens L13) |
| 6 | −296.74142 | 1.000000 | |
| 7 | 180.00000 | 38.351830 | CaF$_2$ (lens L14) |
| 8 | −2028.08028 | 13.262240 | |
| 9 | 201.14945 | 12.933978 | CaF$_2$ (lens L15) |
| 10 | 128.43682 | 221.621142 | |
| 11(ASP2) | −127.65364 | 20.866949 | CaF$_2$ (lens L16) |
| 12 | −120.00000 | 1.000000 | |
| 13 | −302.13109 | 23.424817 | CaF$_2$ (lens L17) |
| 14 | −150.00000 | 1.000000 | |
| 15 | −1158.54680 | 23.049991 | CaF$_2$ (lens L18) |
| 16 | −228.52501 | 1.000000 | |
| 17 | 433.60390 | 22.934308 | CaF$_2$ (lens L19) |
| 18 | −656.20038 | 1.000000 | |
| 19 | 188.30389 | 21.335899 | CaF$_2$ (lens L110) |
| 20 | 563.10068 | 86.000000 | |
| 21 | ∞ | −273.261089 | (First Optical Path Folding Mirror 1) |
| 22 | 114.73897 | −12.000000 | CaF$_2$ (lens L21) |
| 23 | 453.07648 | −16.355803 | |
| 24(ASP3) | 172.15013 | −13.328549 | CaF$_2$ (lens L22) |
| 25 | 395.88538 | −28.227312 | |
| 26 | 162.85844 | 28.227312 | (Concave Reflective Mirror CM) |
| 27 | 395.88538 | 13.328549 | CaF$_2$ (lens L22) |
| 28(ASP3) | 172.15013 | 16.355803 | |
| 29 | 453.07648 | 12.000000 | CaF$_2$ (lens L21) |
| 30 | 114.73897 | 273.261089 | |
| 31 | ∞ | −94.835481 | (Second Optical Path Folding Mirror 2) |
| 32(ASP4) | −774.94652 | −26.931959 | CaF$_2$ (lens L31) |
| 33 | 275.96516 | −1.000000 | |
| 34 | −376.08486 | −31.371246 | CaF$_2$ (lens L32) |
| 35 | 388.08658 | −1.000000 | |
| 36 | −219.25460 | −29.195314 | CaF$_2$ (lens L33) |
| 37 | 4359.72825 | −32.809802 | |
| 38 | 505.14516 | −12.000000 | CaF$_2$ (lens L34) |
| 39 | −128.75641 | −209.396172 | |
| 40 | −180.58054 | −24.481519 | CaF$_2$ (lens L35) |
| 41 | −331.81286 | −14.336339 | |
| 42 | ∞ | −30.366910 | (Aperture Stop AS) |
| 43 | −1502.56896 | −24.392042 | CaF$_2$ (lens L36) |
| 44(ASP5) | 933.76923 | −1.000000 | |
| 45 | −357.34412 | −25.686455 | CaF$_2$ (lens L37) |
| 46 | 2099.98513 | −1.000000 | |
| 47 | −163.08575 | −32.557214 | CaF$_2$ (lens L38) |
| 48 | −631.02443 | −1.000000 | |
| 49 | −124.04732 | −35.304921 | CaF$_2$ (lens L39) |
| 50 | −639.72650 | −18.536315 | |
| 51 | 467.75212 | −40.196625 | CaF$_2$ (lens L310) |
| 52 | −616.22436 | −1.000000 | |
| 53 | −95.47627 | −38.068687 | CaF$_2$ (lens L311) |
| 54 | ∞ | −11.016920 | |
| (Wafer Plane) | | | |

TABLE 7

(Aspherical Data)

| (ASP1) | (ASP2) | (ASP3) |
|---|---|---|
| $\kappa = 0.000000$ | $\kappa = 0.000000$ | $\kappa = 0.000000$ |
| $A = 0.174882 \times 10^{-7}$ | $A = -0.130822 \times 10^{-7}$ | $A = -0.293460 \times 10^{-7}$ |
| $B = -0.593217 \times 10^{-12}$ | $B = 0.512133 \times 10^{-12}$ | $B = -0.868472 \times 10^{-12}$ |
| $C = -0.194756 \times 10^{-16}$ | $C = 0.875810 \times 10^{-16}$ | $C = -0.848590 \times 10^{-17}$ |
| $D = 0.677479 \times 10^{-21}$ | $D = 0.138750 \times 10^{-19}$ | $D = -0.159330 \times 10^{-22}$ |
| $E = -0.212612 \times 10^{-25}$ | $E = -0.203194 \times 10^{-25}$ | $E = 0.868714 \times 10^{-25}$ |
| $F = -0.320584 \times 10^{-30}$ | $F = 0.241236 \times 10^{-27}$ | $F = -0.116970 \times 10^{-29}$ |

| (ASP4) | (ASP5) | |
|---|---|---|
| $\kappa = 0.000000$ | $\kappa = 0.000000$ | |
| $A = 0.253400 \times 10^{-7}$ | $A = -0.140105 \times 10^{-7}$ | |
| $B = -0.505553 \times 10^{-12}$ | $B = 0.779968 \times 10^{-12}$ | |
| $C = 0.151509 \times 10^{-16}$ | $C = 0.148693 \times 10^{-16}$ | |
| $D = -0.433597 \times 10^{-21}$ | $D = 0.100788 \times 10^{-21}$ | |
| $E = 0.841427 \times 10^{-26}$ | $E = -0.251962 \times 10^{-25}$ | |
| $F = 0.165932 \times 10^{-30}$ | $F = 0.104216 \times 10^{-29}$ | |

As shown from the above, with the catadioptric projection optical system of FIG. 13, for the $F_2$ laser having the center wavelength of 157.624 nm, an image side numerical aperture of 0.75 can be maintained, and an image circle having a radius of 14.6 mm upon the wafer can be maintained with a small number of lenses. When the projection optical system of FIG. 13 is adapted in a projection exposure apparatus, high resolution of $0.1\mu$ or lower can be achieved. Furthermore, when the projection optical system of FIG. 13 is adapted in a step-and-scan-type projection exposure apparatus, the exposure area on the wafer can be set as, for example, a 22 mm×6.6 mm rectangle.

Next, the structure of a lens barrel used when the projection optical system of FIG. 13 is adapted in a projection exposure apparatus is described.

FIG. 14 is a cross-sectional view showing the main components used when the projection optical system of FIG. 13 is employed in a projection exposure apparatus. In FIG. 14, the first imaging optical system G1 comprising lenses L11 to L110 is supported along the optical axis AX1 by an integrated assembly of a plurality of divided lens-barrels (support block), which is a first barrel 5E; the second imaging optical system G2 comprising optical path folding mirrors FM1 and FM2, lenses L21 and L22, and the concave mirror CM is supported along the optical axis AX2 by an integrated assembly of a plurality of divided lens-barrels, which is a second barrel 6D; and the third imaging optical system G3 comprising lenses L31 to L311 is supported along the optical axis AX3 by an integrated assembly of a plurality of divided lens-barrels, which is a third barrel 5F. It is noted here that optical axes AX1 and AX3 are coaxial and the optical axis AX2 is orthogonal to these optical axes AX1 and AX3.

The first barrel 5E is attached to the top of the second barrel 5D, and the second barrel 6D is attached to the top of the third barrel 5F. The third barrel 5F is mounted on the aperture portion of a support plate 11 of the main body of the projection exposure apparatus.

Next, the structure of each barrel 5E, 5F, and 5D is described. To begin with, the third barrel 5F comprises a plurality of divided lens-barrels 76A to 76C, active divided lens-barrels 77, divided lens-barrels 78, 76D, 79, and 76E to 75J, which are respectively connected along the optical axis AX3 by bolts (not shown in the Figures) at three or more locations. Divided lens-barrels 76A to 76J have respective lens mounts 80A to 80J, which support lenses L31 to L311, respectively. Lens mounts 80A to 80I are provided in the same manner as in FIG. 7 and FIG. 12 mentioned above to allow smooth flow of the purge gas.

The active divided lens-barrel 77 is structured with a lens mount 81 disposed through the assistance of rotational couplings 19 and vertical drive elements 20 at three or more locations on outer barrel casing 18 and the optical element (the lens L34) is supported within corresponding the lens mount 81. As shown in FIG. 15, the vertical drive elements are attached in three locations every 120° about the optical axis AX3 as its center. Driven by these three vertical drive elements. The lens L34 becomes capable of displacement having three degrees of freedom in relation to outer barrel casing 18 of the active divided lens-barrels: along the direction of the optical axis AX3, and the rotational direction about the two axes that is perpendicular to the optical axis as the center. It is noted here that a plurality of openings 81a are provided in the lens mount 81 to allow the smooth flow of the purge gas.

Returning to FIG. 14, in this embodiment, unlike the embodiments described above, lens mounts 80A to 80J used for supporting the lenses are provided integrated with the outer barrel casings (connected sections) of divided lens-barrels 76A to 76J. The outer barrel casing of these divided lens-barrels 76A to 76J and the respective lens mounts 80A to 80J may even be kinematically connected using, for example, elasticized hinges. The benefits in such cases include the fact that there is no fear of the stress applied to divided lens-barrels 76A to 76J being passed on to lenses L31 to L311 through lens mounts 80A to 80J, and also the fact that there is no fear of inviting imaging performance deterioration of lenses L31 to L311 caused by stress deformation. It is noted here that the lens supporting sections of lens mounts 80A to 80J and the portions providing the open sections and connected to the respective outer barrel casings of divided lens-barrels 76A to 76J may even been kinetically connected using elasticized hinges, and the like, to obtain the same results.

Furthermore, in the third barrel 5F, there is a flange section provided on a divided lens-barrel 78 for connecting the support plate 11 of the main body of the exposure apparatus, and there is provided a variable aperture stop AS on divided lens-barrel 79 for making it possible to change the numerical aperture of the projection optical system, Second barrel 6D comprises divided lens-barrel 73A, which supports an optical path folding mirror FM, wherein the top thereof is connected to the first barrel 5E and the bottom thereof is connected to the third barrel 5F; divided lens-barrels 73B and 73C, which hold lenses L21 and L22, respectively; divided lens-barrel 73D, which holds the concave mirror CM; and a divided lens-barrel 73E, which becomes a purge cap in the second barrel. These divided lens-barrels 73A to 73E are respectively connected in the direction of the optical axis AX2 by bolts (not shown in the Figures) in three or more locations.

The divided lens-barrel 73A is connected to the first barrel 5E and the third barrel 5F, respectively, along the optical axis AX1 (AXM) by bolts (not shown in the Figures) in three or more locations. The divided lens-barrel 73A also contains an arm 74A, and this arm 74A supports the optical path folding mirror FM through a support section 75A. Divided lens-barrels 73B and 73C comprise the respective lens mounts 74B and 74C, which hold lenses L21 and L22, respectively. Openings for allowing the smooth flow of the purge gas are provided in lens mounts 74B and 74C in the same manner as the examples in FIG. 7 and FIG. 12. The divided lens-barrel 73D contains a lens mounts 74D, which supports the concave mirror CH.

The first barrel 5E is comprises of, in order from the reticle side, a divided lens-barrel 70A, an active divided lens-barrel 71A, s divided lens-barrel 70B, an active divided lens-barrel 71B, a divided lens-barrel 70C, an active divided lens-barrel 71C, divided lens-barrel 70D, an active divided lens-barrel 71D, and divided lens-barrels 70E, and 70F which are respectively connected in the direction of the optical axis AX1 by bolts (not shown in the Figures) in three locations or more. The divided lens-barrel 70F is connected to divided lens-barrel 73A of the second barrel 6D in the direction of the optical axis AX1 by bolts (not shown in the Figures) in three locations or more.

The structure of divided lens-barrel 70A is different from the above-mentioned divided lens-barrels 76A to 76J in that open regions are not is provided in the lens mounts. Furthermore, since the structures of divided lens-barrels 70B to 70E are the same as the above-mentioned divided lens-barrels 71A 71D, respectively, there description is omitted here. Furthermore, the structure of active divided lens-barrels 71A to 71D are the same as active divided lens-barrel 77, wherein the respective optical elements (lenses L12, L14, L16, and L18) are supported in a state allowing them to be controlled with three degrees of freedom in the direction of the optical axis AX1, and in-the rotational direction relative to the two axes that is perpendicular to the optical axis AX1.

In the example of FIG. 14, a gas supply pipe with an attached valve V5 is connected to active divided lens-barrel 71A of the first barrel 5E, and an air supply pipe with attached valve V5 is connected to divided lens-barrel 73D of the second barrel 6D. Through these gas supply pipes, a temperature-controlled, a high-purity purge gas is supplied to the inner portion of the projection optical system. This purge gas flows within each barrel 5E, 6D, and 5F through the openings provided in the lens mounts, and is evacuated out of the projection optical system from an evacuation pipe with an attached valve V15, which is connected to divided lens-barrel 76J of third barrel 5F.

With this example, two or more reflective members (FM, CM) are included, and as with the above embodiment, it is necessary to adjust one of the reflective members relative to the other reflective member. Also in this example, as shown with divided lens-barrels 73A and 73D, only one reflective member is included in one support block.

Next, an example of the manufacturing procedure for this projection optical system is briefly described. The projection optical system of this example comprises dioptric type first and third imaging optical systems G1 and G3, and catadioptric type second imaging optical system G2 As with the conventional dioptric projection optical system, the first and third imaging optical systems G1 and G3 are built up while measuring aberrations and while performing decentering adjustment and spacing adjustment of each divided lens-barrel and each active divided lens-barrel to complete first and third barrels 5E and 5F. Such decentering adjustment and spacing adjustment is disclosed in, for example, Japanese Patent Application Laid-open No. 2001-56426. Furthermore, in regards to catadioptric type second imaging optical system G2, a device such as an autocollimator or a interferometer is used to set the position of the optical path folding mirror FM in the desired position relative to divided lens-barrel 73A, and then positioning of divided lens-barrels 73B to 73D relative to divided lens-barrel 73A is performed to complete the second barrel 6D. Afterwards, each barrel 5E, 6D, and 5F are connected, and while aberrations of the entire projection optical system is measured, the decentering adjustment and spacing adjustment of each barrel 5E, 6D, and 5F is performed. If necessary, the three degrees of freedom are used to perform position adjustment of the optical elements (lenses L12, L14, L16, L18, and L34) relative to each active divided lens-barrel 71A to 71D and 77 while measuring the aberration of the entire projection optical system until the imaging performance of the projection optical system is became to the predetermined level of performance.

STRUCTURAL EXAMPLE OF PROJECTION EXPOSURE APPARATUS

Next, a structural example of a projection exposure apparatus comprising a projection optical system of the embodiment mentioned above is described.

Figure 16:
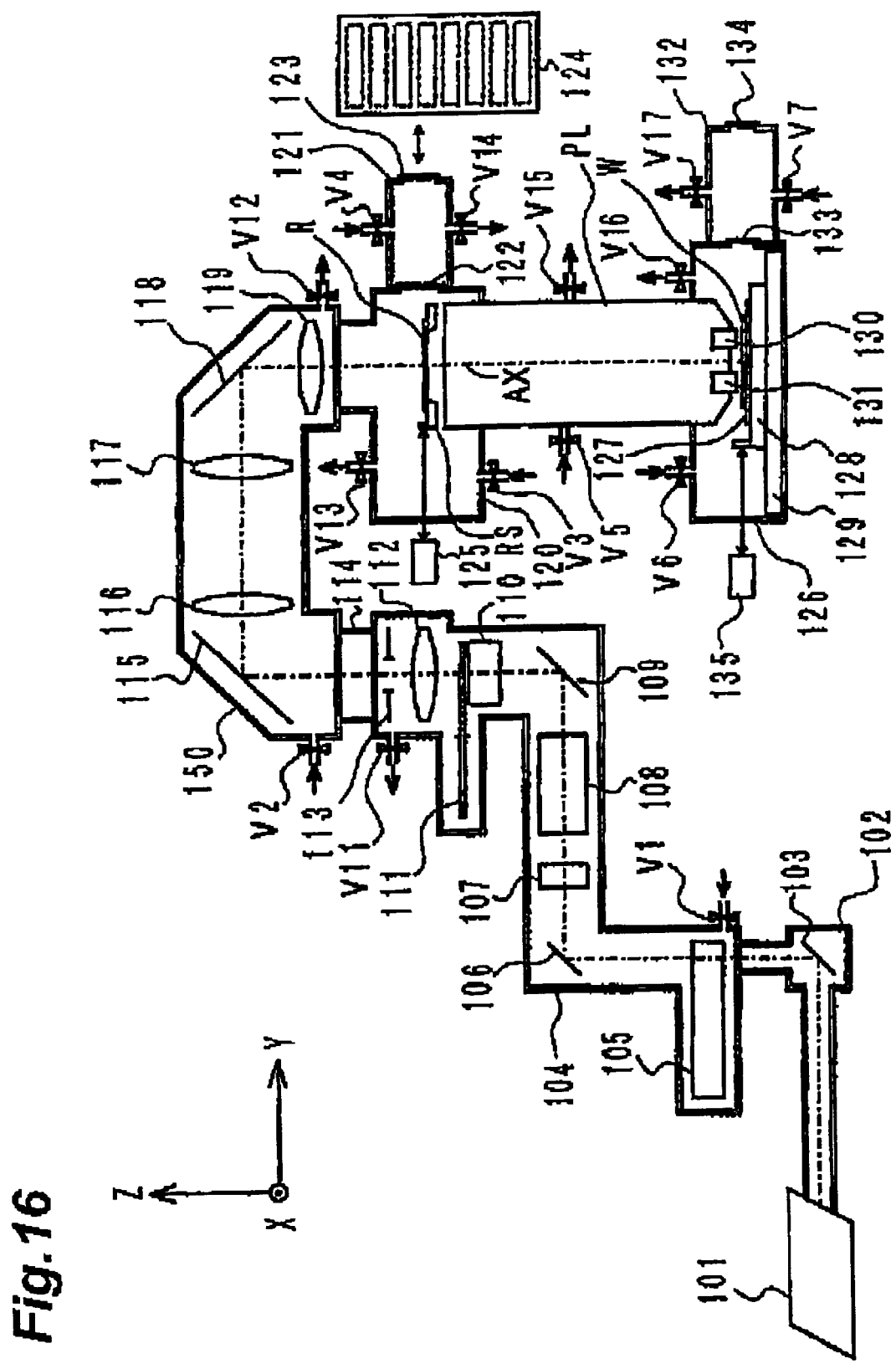
FIG. 16 is a diagram showing an example of the projection exposure apparatus according to the embodiments of the present invention.

FIG. 16 is a diagram showing a schematic of a projection exposure apparatus of this example, and in FIG. 16, the XYZ coordinate system is employed. This projection exposure apparatus uses an $F_2$ laser light source (or alternatively an ArF exciter laser light source) as exposure light source 101, and uses any one of the catadioptric projection optical systems described in the above first through fifth embodiments as the projection optical system PL. It is noted here that it is possible to utilize a light source that emits light in the VUV (Vacuum Ultra Violet) range of approximately 120 nm to 180 nm such as a krypton-dimer laser ($Kr_2$ laser) with a 146 nm emission wavelength or an argon-diner laser ($Ar_2$ laser) with a 126 nm emission wavelength as exposure light source 101. Furthermore, the step-and-scan method, which successively transfers the reticle pattern image onto a single shot region upon the wafer by synchronizing the relative scanning of the reticle and the wafer in a predetermined direction in relation to a predetermined shape of the illumination region upon the reticle, is adopted in the projection exposure apparatus of this example.

In FIG. 16, the exposure beam from exposure light source 101 that is used as pulse laser light (illumination light) is reflected at a reflecting mirror 103 towards an optical path delay optical system (a decoherer) 105, and any optical length difference that is equal to or greater than a temporal coherence length of that illumination light that is granted is divided into a temporal plurality of light beam. It is noted here that such optical path delay optical system is disclosed in, for example, Japanese Patent Application Laid-open Nos. Hei 1-198759 and Hei 11-174365.

The illumination light emitted from the optical path delay optical system 105, after being reflected at an optical path deflecting mirror 106, passes through a first fly'eye lens 107, a zoom lens 108, and an oscillating mirror 109, in that order, to reach a second fly'eye lens 110. A switching revolver 111 for an illumination aperture stop, which is used for setting the preferred size and shape of the effective light source, is disposed at the emitting side of the second fly'eye lens 110. In this example, the size of a light beam from zoom lens 108 to the second fly'seye lens 110 can be varied in order to reduce the light energy loss at the illumination aperture stop.

The light beam emitted from the opening of the illumination aperture stop passes through a condenser lens group 112 and illuminates an illumination field stop (a reticle blind) 113. It is noted here that illumination field stop 113 is disclosed in U.S. Pat. No. 5,473,410. This U.S. Pat. No. 5,473,410 is cited here as an incorporated by a reference.

The light beam from the illumination field stop 113 passes through an illumination field stop imaging optical system (a reticle blind imaging system) which comprises deflecting mirrors 115 and 118, lens groups 116, 117, and 119, and is guided onto the reticle R. An illuminated region, that is an image of an aperture of the illumination field stop, is formed on the reticle R. The light beam from the illuminated region on the reticle R is guided through the projection optical system PL onto the wafer W to form a reduced image of the illuminated region of a reticle R onto the wafer W.

In the case where light having wavelengths in the VUV range is used as exposure light, it is necessary to eliminate gases having strong light absorbing characteristics for such wavelength band (hereafter referred to as the appropriate 'absorptive gas') such as oxygen, steam, or carbon dioxide.

Accordingly, in the present embodiment, the illumination optical path (the optical path from the exposure light source 101 up to and including the reticle R) and the exposure optical path (the optical path from the reticle R up to and including the wafer W) are shut-off from the external atmosphere, and are filled with a certain gas having characteristically low absorption for light of those wavelengths in the VUV range, such as helium, argon, neon, krypton, or appropriate compounds of these gases (hereafter referred to as the appropriate 'purge gas').

More specifically, the optical path from the exposure light source 201 until the optical path delay optical system 105 is shut-off from the external atmosphere by a casing 102; the optical path from the optical path delay optical system 105 until the illumination field stop 113 is shut-off from the external atmosphere by a casing 104; the illumination field stop imaging optical system is shut-off from the external atmosphere by casings 114 and 150; and these optical paths are filled with the purge gas mentioned above. Furthermore, the lens barrels of projection optical system PL itself are also, as it has already been described, formed as a casing so that the inner optical path thereof is also filled with the above-mentioned purge gas.

A casing also has a space between casing 150, which includes the illumination field stop imaging optical system, and projection optical system PL shut-off from the external atmosphere, and holds reticle stage RS, which supports reticle R within it. A door 122 for transporting the reticle R in and out is provided for this casing 120, and on the outside of this door 122 there is provided a gas replacement chamber 121 for preventing the contamination of atmosphere within a casing 120 when transporting the reticle R in and out. There is also provided a door L23 in this gas replacement chamber 121, and the transfer of a reticle between it and a reticle stocker L24, which stocks a plurality of different reticles, takes place through the door 123.

A casing 126 shuts-off a space between projection optical system PL and the wafer W from the external atmosphere, and within it is stored a wafer stage 128, which holds the wafer W; an oblique light incidence type auto-focus sensor 130 for detecting position of the surface of the wafer W as the substrate in the z-direction and the tilt angle; an off-axis alignment sensor 131; and a base plate 129 on which is mounted the wafer stage 128. A door 133 is provided on this casing 126 to allow the in and out transport of the wafer W, and on the outside of this door 133, there is provided a gas replacement chamber 132 for preventing the contamination of the atmosphere within casing 126. When the wafer W is transported into the apparatus and when wafer is transported out of the apparatus, it passes through this door 134.

Feed valves V1, V2, V3 and V6 are provided on casings 104, 150, 120, and 126, respectively. These feed valves V1, V2, V3, and V6 are connected to a feed pipeline that is connected to a gas supply apparatus not shown in the Figures. In addition, evacuation valves V11, V12, V13, and V16 are provided on casings 104, 150, 120, and 126, respectively, and these evacuation valves V11, V12, V13, and V16 are respectively connected to the gas supply system mentioned above through an evacuation pipeline not shown in the Figures. It is noted here that the specified gas from the gas supply apparatus is regulated to be a target temperature by a temperature control apparatus not shown in the Figures. In the case where helium is used as the specified gas, it is preferable that a temperature control apparatus be disposed near each casing.

In the same manner, the feed valves V4 and V7 and evacuation valves V14 and V17 are provided on gas replacement chambers 121 and 134, wherein the feed valves V4 and V7 and evacuation valves V14 and V17 are connected to the gas supply apparatus mentioned above through the supply pipeline and the evacuation pipeline, respectively. Moreover, the feed valve V5 and release valve V15 may also be provided to the lens barrel of projection optical system PL if necessary, with the feed valve V5 and release valve V15 being connected to the gas supply apparatus mentioned above through the supply pipeline and the evacuation pipeline, respectively, not shown in the Figures.

[Manufacturing Process for Semiconductor Devices]

Next, an example of the manufacturing process for a semiconductor device that uses the projection exposure apparatus of the embodiment described above is described while referencing FIG. 17.

Figure 17:
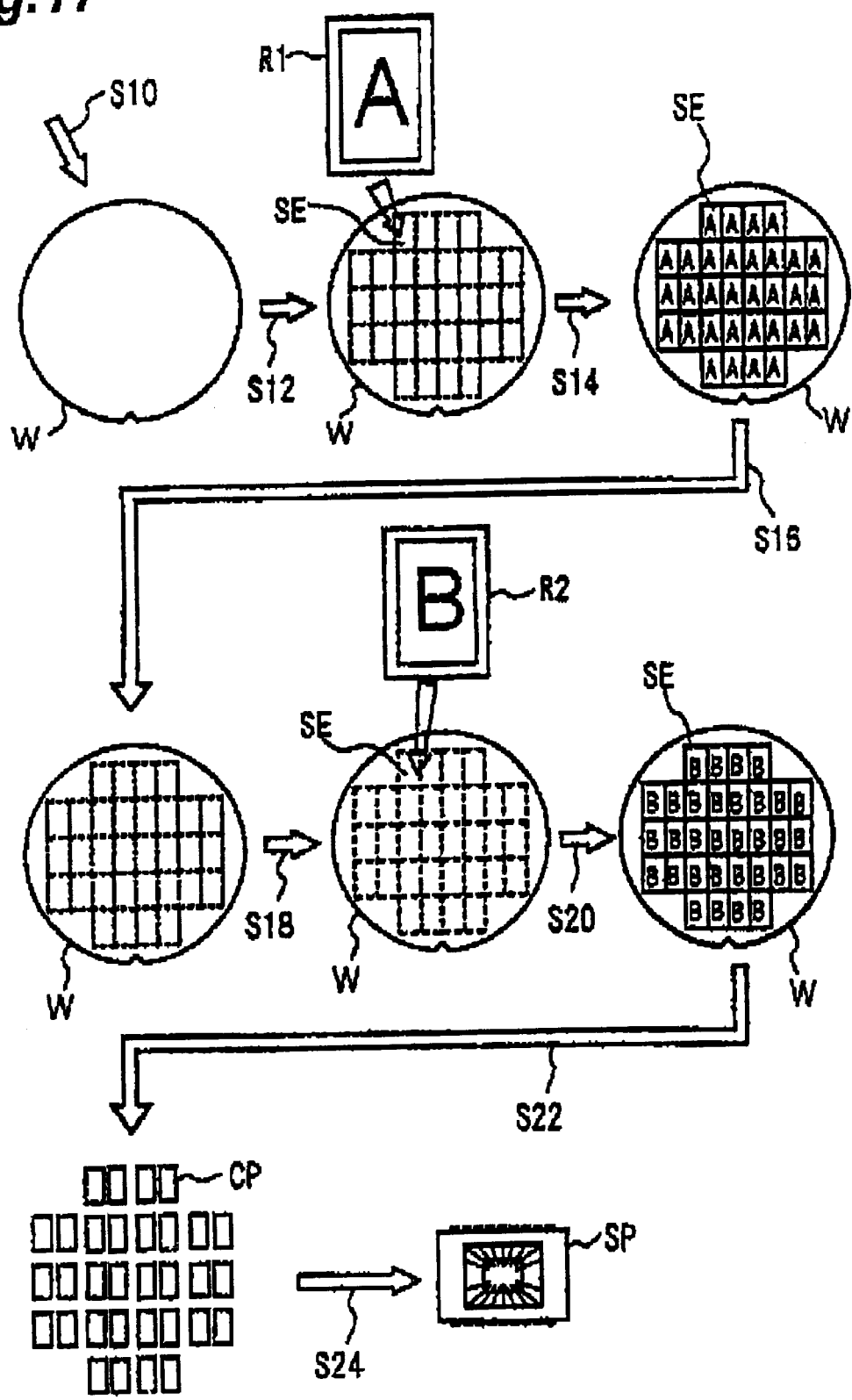
FIG. 17 is a diagram showing an example of a manufacturing process of a semiconductor device according to the embodiments of the present invention.

FIG. 17 shows an example of the manufacturing process for a semiconductor device. In FIG. 17, a wafer W is first manufactured from, for example, a silicon semiconductor. A photoresist is next applied (Step S10) onto the wafer W, and then in Step S12, a reticle R1 is loaded onto the reticle stage if the projection exposure apparatus described in the above embodiment, and a pattern of the reticle R1 indicated by a reference mark A) is transferred (exposed) onto the entire shot region SE of the wafer W using a scanning exposure method. It is noted here that the wafer W may be a 300 mm radius (silicon, etc.) semiconductor or a wafer (12" wafer) such as a silicon on insulator (SOI), and the size of shot region SE, as an example, may have a width of 25 mm in the non-scanning direction and a width of 33 mm in the scanning direction. Next, in Step S14, a predetermined pattern is formed on each shot region SE of the wafer W using a process such as development, etching, or ion implantation.

Next, in Step S16, a photoresist is applied onto the wafer W, and then in Step S18, a reticle R2 is loaded onto the reticle stage of the projection exposure apparatus of the above embodiment and using a scanning exposure process, a pattern of the reticle R2 (indicated by a reference mark B) is transferred (exposed) onto each shot region SE of the wafer W. Then in Step S20, a predetermined pattern is formed on each shot region SE of the water W using a process such as development, etching, or ion implantation.

These exposure steps and pattern formation steps (Step S16 to Step S20) are repeated only as many times as necessary to fabricate the desired semiconductor device. Then by going through a dicing step (Step S22) of cutting off each chip (CP) on the wafer W one-by-one, and a bonding step or a packaging step (Step S24), a semiconductor device SP is manufactured into a finished product.

According to the present embodiments, even if the case where a projection optical system comprising a catadioptric system is used, a possible image shift can be minimized to stably hold as a lens barrel. Moreover, since the adjustment procedure of the projection optical system and the ability of the adjustment system is high, adjustment is simplified, and if necessary, the atmosphere within the lens-barrels of the projection optical system can be uniformly maintained with a purge gas such as an inert gas.

It is noted here that in each of the above-mentioned embodiments, silica or fluorite ($CaF_2$ calcium fluorite) may be used as the base material of the refractive optical members which constitute the projection optical system; in addition to $CaF_2$, or instead of $CaF_2$, crystallized fluorites such as barium fluoride, lithium fluoride, or magnesium fluoride, for example, or even a fluoride doped silica, may be used. However, if it is possible to have a sufficiently narrow wavelength band for the illuminating light that illuminates the mask, it is preferable that the projection optical system comprise only a single kind of optical material. Moreover, when considering the production costs and ease of manufacture of the projection optical system, it is preferable that the projection optical system be structured from only silica or from only $CaF_2$.

Furthermore, in each of the above embodiments, an $F_2$ laser or an ArF excimer laser is utilized as the optical source and the spectral width is narrowed by a narrow-band apparatus, however, higher harmonics of a solid state laser such as a YAG laser, which has an oscillation spectrum of 157 nm or 193 nm, for example, maybe utilized instead. Furthermore, it is also possible to use high harmonics, which is generated by amplifying single wavelength infrared or visible range laser light output from a fiber laser or a DFB semiconductor laser by a fiber amplifier doped with, for example, erbium (Er) (or alternatively both erbium and ytterbium (Yb)), and then wavelength-converting into UV (Ultra Violet) light using nonlinear optical crystals.

Furthermore, in the first through fourth embodiments, all of the optical elements that form the projection optical system are disposed along a single optical axis.

However, the present invention is not limited to the above-mentioned, projection optical system with central obscuration, but may also use a catadioptric projection optical system having an off-axial field as disclosed in FIG. 6 of U.S. Pat. No. 5,689,377; FIG. 6 of U.S. Pat. No. 5,691,802; and FIG. 5 of U.S. Pat. No. 5,805,334. In such cases, it is preferable that two optical path deflecting mirrors and a concave reflecting mirror be held in a single lens-barrel unit and a dioptric imaging optical system be held in a single or a plurality of lens-barrel units different from this lens-barrel unit. U.S. Pat. Nos. 5,689,377; 5,691,802; and 3,805,334 are cited here as an incorporated by references.

Furthermore, the present invention can be adapted for the catadioptric projection optical system having an off-axial field, as proposed in Japanese Patent Application No. 2000-58268 (International Application Number FCT/JP01/01350). In such case as well, it is preferable that two optical path deflecting mirrors and a concave reflecting mirror be held in a single lens-barrel unit and two dioptric imaging optical system be held in a plurality of lens-barrel units different from this lens-barrel unit.

Even in a catadioptric projection optical system having an off-axial field, by having all of the reflective components in a single lens-barrel unit, the stability of image misalignment and alleviation of decentering tolerance can be obtained.

Moreover, the present invention can also be adapted for both the step-and-repeat method (batch (exposure method), which after a mask pattern image is transferred in a single shot region upon the wafer at one time, repeats the process of successively moving the wafer two dimensionally within the plane that intersects the optical axis of the projection optical system and then transfers the mask pattern image in the next shot region at one time; and the step-and-scan method, which, during the exposure of each shot region of the wafer, simultaneously scans the mask and water relative to a projection optical system with the projection magnification β as the speed ratio. It is noted here that with the step-and-scan method, since favorable imaging characteristics can be obtained within the slit-shaped (long and narrow rectangular) exposure region, it becomes possible to perform exposure in a wide shot region upon the wafer without having a large-sized projection optical system.

Incidentally, in each of the above embodiments, the present invention is adapted for a projection exposure apparatus that is utilized for manufacturing semiconductor devices. However, not only can the present invention be adapted for the manufacture of semiconductor devices, but it can be adapted for an exposure apparatus that transfers a device pattern onto a glass plate, which is used when manufacturing displays including liquid crystal display devices and plasma displays; an exposure device that transfers a device pattern onto a ceramic wafer, which is used in the manufacture of thin film magnetic heads and micro machines; and an exposure device that is used in manufacturing imaging elements (such as CCDs). Furthermore, the present invention can also be adapted for an exposure device that transcribes a circuit pattern onto a glass substrate or silicon wafer in order to manufacture a reticle or a mask.

It is noted here that the present invention is not limited to the embodiments described above, but may obviously include a variety off structures within a range that does not deviate from the subject matter of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A projection optical system for forming an image of an object in a first plane onto a second plane, the projection optical system comprising:

an optical element group including at least one refractive member and a plurality of reflective members; and a plurality of lens-barrel units holding said optical element group divided into a plurality of respective groupings;

wherein said plurality of reflective members is held by a single lens-barrel unit of said plurality of at least one lens-barrels units.

2. The projection optical system according to claim 1, further comprising:

a partial optical element group forming an intermediate image on a third plane between said first plane and said second plane;

wherein said partial optical element group is integrally held by one lens-barrel unit of said plurality of at least one lens-barrels units.

3. The projection optical system according to claim 1, wherein said optical element group is disposed along a single optical axis.

4. The projection optical system according to claim 1, wherein said optical element group includes:

a first partial optical element group disposed along a first optical axis;

a second partial optical element group disposed along a second optical axis which extends in a direction that intersects said first optical axis, and is optically connected to said first partial optical element group; and a third partial optical element group disposed along a third optical axis which extends in the same direction as said first optical axis, and is optically connected to said second partial optical element group.

5. The projection optical system according to claim 4, wherein;

said second partial optical element group comprises said plurality of reflective members; and said one lens-barrel unit of said plurality of lens-barrel units holds said second partial optical element group.

6. The projection optical system according to claim 1, wherein said plurality of at least one lens-barrels units are independently supported each other.

7. The projection optical system according to claim 1, wherein at least one lens-barrel unit of said plurality of lens-barrel units holds with an adjustable state of a predetermined optical element that is held by said lens-barrel unit.

8. The projection optical system according to claim 1, wherein:

at least one of said plurality of lens-barrel units further comprising a plurality of holding blocks holding one or a plurality of optical elements;

wherein said plurality of holding blocks have an adjustment mechanism to adjust the state of optical elements respectively held therein.

9. The projection optical system according to claim 1, wherein at least one of said plurality of lens-barrel units is detachable.

10. The projection optical system according to claim 1, wherein:

said projection optical system is used with illumination light with wavelengths of 200 nm or shorter; and a purge gas through which said illumination light passes is supplied to inside said projection optical system.

11. The projection optical system according to claim 10, wherein each of said optical element groups is held by either a frame mechanism or a frame member with an opening through which purge gas may pass.

12. A projection exposure apparatus, which comprises the projection optical system according to claim 1, and which projects an image of a projection original disposed on said first plane onto a workpiece, with said projection optical system.

13. A projection exposure method, which projects an image of a projection original disposed on said first plane onto a workpiece, with said projection optical system according to claim 1.

14. The projection optical system according to claim 1, wherein said plurality of reflective members is held within said single lens-barrel.

15. A projection optical system comprising:

an optical element group including a first and a second optical element sub-group, and forming an image of a predetermined magnification of an object in a first plane onto a second plane;

a first lens-barrel unit holding said first optical element sub-group as a single body along a first optical axis; and a second lens-barrel unit holding said second optical element sub-group as a single body along a second optical axis that is coaxial with said first optical axis;

wherein said first lens-barrel unit is held in a position at a plane that is orthogonal to said first optical axis and that passes through a point divides a line, along said first optical axis, between an object point and an image point relative to said first sub optical element group by 1:β1 (where β1 is a real number other than zero), or in a position near said plane; and said second lens-barrel unit is held in a position at a plane that is orthogonal to said second optical axis and that passes through a point divides a line, along said second optical axis, between an object point and an image point relative to said second sub optical element group by 1:β2 (where β2 is a real number other than zero), or in a position near said plane.

16. The projection optical system according to claim 15, wherein said optical element group is disposed along one optical axis.

17. The projection optical system according to claim 15, wherein:

said projection optical system is used with illumination light with wavelengths of 200 nm or shorter; and a purge gas through which said illumination light passes is supplied to inside said projection optical system.

18. The projection optical system according to claim 17, wherein each of said optical element groups is held by either a frame mechanism or a frame member with an opening through which purge gas may pass.

19. A projection exposure apparatus, which comprises the projection optical system according to claim 15, and which projects an image of a projection original disposed on said first place onto a workpiece, with said projection optical system.

20. A projection exposure method, which projects an image of a projection original disposed on said first plane onto a workpiece, with said projection optical system according to claim 15.

21. A projection optical system which forms an image of an object in a first plane onto a second plane, the projection optical system comprising:

an optical element group having a plurality of aspherical surfaces ontoured according to aspherical surface polynomial coefficients; and a plurality of holding blocks holding said optical element group in a plurality of respective groupings;

wherein a number of said plurality of holding blocks is equal to or greater than the number of said aspherical surfaces.

22. The projection optical system according to claim 21, wherein:

said optical element group has a plurality of reflective members; and each of said plurality of reflective members is held by each of said plurality of holding blocks different from each other.

23. The projection optical system according to claim 21, wherein said optical element group is disposed along one optical axis.

24. The projection optical system according to claim 21, wherein said optical element group includes:

a first partial optical element group disposed along a first optical axis;

a second partial optical element group disposed along a second optical axis which extends in a direction that intersects said first optical axis, and is optically connected to said first partial optical element group; and a third partial optical element group disposed along a third optical axis which extends in the same direction as said first optical axis, and is optically connected to said second partial optical element group.

25. The projection optical system according to claim 21, wherein:
said projection optical system is used with illumination light with wavelengths of 200 nm or shorter; and
a purge gas through which said illumination light passes is supplied to inside said projection optical system.

26. The projection optical system according to claim 25, wherein each of said optical element groups is held by either a frame mechanism or a frame member with an opening through which purge gas may pass.

27. A projection exposure apparatus, which comprises the projection optical system according to claim 21, and which projects an image of a projection original disposed on said first plane onto a workpiece, with said projection optical system.

28. A projection exposure method, which projects an image of a projection original disposed on said first plane onto a workpiece, with said projection optical system according to claim 21.

29. A projection optical system which forms an image of an object ma first plane onto a second plane, the projection optical system comprising:
an optical element group;
a plurality of lens-barrel units, which bold said optical element group in a plurality of respective groupings; and
frame from which at least one lens-barrel unit of said plurality of lens-barrel units is held so as to hang down.

30. The projection optical system according to claim 29, comprising a partial optical element group, which forms an intermediate image on a third plane between said first plane and said second plane; wherein said partial optical element group is integrally held by one lens-barrel unit of said plurality of lens-barrel units.

31. The projection optical system according to claim 29, wherein said optical element group is disposed along one optical axis.

32. The projection optical system according to claim 29, wherein said plurality lens-barrel units are each independently supported.

33. The projection optical system according to claim 29, wherein at least one of said plurality of lens-barrel units has an adjustment mechanism to adjust the state of predetermined optical elements held by said lens-barrel unit.

34. The projection optical system according to claim 29, wherein at least one of said plurality of lens-barrel units further includes:
a plurality of holding blocks holding one or a plurality of optical elements;
wherein said plurality of holding blocks have an adjustment mechanism to adjust the state of optical elements respectively held therein.

35. The projection optical system according to claim 29, wherein at least one of said plurality of lens-barrel units is detachable.

36. The projection optical system according to claim 29, wherein:
said projection optical system is used with illumination light with wavelengths of 200 um or shorter; and
a purge gas through which said illumination light passes is supplied to inside said projection optical system.

37. The projection optical system according to claim 36, wherein each of said optical element groups is held by either a frame mechanism or a frame member with an opening through which purge gas may pass.

38. A projection exposure apparatus, which comprises the projection optical system according to claim 29, and which projects an image of a projection original disposed on said first plane onto a workpiece, with said projection optical system.

39. A projection exposure method, which projects an image of a projection original disposed on said first plane onto a workpiece, with said projection optical system according to claim 29.

40. A projection optical system for forming an image of an object in a first plane onto a second plane by using light with wavelengths of 200 nm or shorter, the projection optical system comprising:
at least two refractive members disposed in the optical path of said light;
at least two lens-barrel units aligning said at least two refractive members;
a pipeline being connected to at least one lens-barrel unit of said at least two lens-barrel units and supplying purge gas through which said light can pass within the space between said at least two refractive members; and
at least two holding units included in each of said at least two lens-barrel units and holding each of said at least two refractive members;
wherein said at least two holding units have openings to allow said purge gas to pass through.

41. The projection optical system according to claim 40, wherein said light has wavelengths of 160 nm or shorter.

42. A projection exposure apparatus, which comprises the projection optical system according to claim 40, and which projects an image of a projection original disposed said first plane onto a workpiece, with said projection optical system.

43. A projection exposure method, which projects an image of a projection original disposed on said first plane onto a workpiece, with said projection optical system according to claim 40.

44. A projection optical system, provided in a projection exposure apparatus and for forming an image of an object in a first plane onto a second plane, the projection optical system comprising:
an imaging optical system including all of a plurality of reflective members which are structural components of said projection optical system;
another imaging optical system including at least one refractive member which is a structural component of said projection optical system and excluding a reflective member which is a structural component of said projection optical system;
a lens-barrel unit holding said imaging optical system; and
another lens-barrel unit holding said another imaging optical system.

45. The projection optical system according to claim 44, wherein:
said lens-barrel unit is structured with a plurality of divided lens-barrels, which include a mechanism for adjusting the state of said imaging optical system; and
said another lens-barrel unit is structured with a plurality of divided lens-barrels, which include a mechanism for adjusting the state of said another imaging optical system.

46. The projection optical system according to claim 45, wherein each of said plurality of reflective members is held by each of divided lens-barrel different from each other in said plurality of divided lens-barrels forming said lens-barrel unit.

47. The projection optical system according to claim 44, wherein:

said projection optical system is used with illumination light with wavelengths of 200 nm or shorter; and a purge gas through which said illumination light passes is supplied to inside said projection optical system.

48. A projection exposure apparatus, which comprises the projection optical system according to claim 44, and which projects an image of a projection original disposed on a first plane onto a workpiece, with said projection optical system.

49. A projection exposure method, which projects an image of a projection original disposed on a first plane onto a workpiece, with said projection optical system according to claim 44.

50. A method of manufacturing a projection optical system which comprises an optical element group having at least one refractive member and a plurality of reflective members, and a plurality of lens-barrel units holding said optical element group as a plurality of respective groupings; said method of manufacturing a projection optical system comprising:

a first step of pre-setting a predetermined lens-barrel unit of said plurality of lens-barrel units to be detachable, putting together a lens-barrel unit to be adjusted at the position of said predetermined lens-barrel unit of a first projection optical system that is already completed as said projection optical system, and performing adjustment on said lens-barrel unit to be adjusted while measuring optical characteristics of said first projection optical system; and a second step of building up a second projection optical system by an adjusted lens-barrel unit on which adjustment is performed in said first step and lens-barrel units other than this, and performing adjustment of said second projection optical system using said adjusted lens-barrel unit as a standard.

51. A projection optical system, which is manufactured in accordance with the method of manufacturing according to claim 50.

52. A projection exposure method comprising:

projecting onto a workpiece, an image of a projection original disposed in a first plane, using the projection optical system of claim 51.

53. A projection optical system manufactured by the method of claim 50, wherein:

the projection optical system is configured to project onto a workpiece, an image of a projection original disposed on a first plane.

54. A method of manufacturing a projection optical system which comprises an optical element group including at least one refractive member and at least one reflective member, a plurality of lens-barrel units holding said optical element group as a plurality of respective groupings, a holding block being a component of at least one lens-barrel unit of said plurality of lens-barrel units and holding at least one optical element, wherein said holding block is adjustable in at least one of relative orientation and relative position to said lens-barrel unit including said holding block as structural component, and at least one entire lens-barrel unit of said plurality of lens-barrel units is adjustable; said method comprising:

a first step of adjusting said plurality of lens-barrel units relative to each other; and a second step of adjusting said at least one of said relative orientation and said relative position of said holding block, so as to adjust residual aberrations, after said first step.

55. A projection optical system, which is manufactured in accordance with the method of manufacturing according to claim 54.

56. A projection exposure method comprising:

projecting onto a workpiece, an image of a projection original disposed in a first plane, using the projection optical system of claim 55.

57. A projection optical system manufactured by the method of claim 54, wherein:

the projection optical system is configured to project onto a workpiece, an image of a projection original disposed on a first plane.

58. A projection optical system for forming an image of an object, the projection optical system comprising:

at least two optical element groups including a grouping of at least one refractive member and a grouping of a plurality of reflective members;

a plurality of holding units holding said at least one refractive member and said plurality of reflective members; and a single holding unit of said plurality of holding units holding said grouping of the plurality of reflective members separate from said grouping of the at least one refractive member.

* * * * *